(12) United States Patent
Chiang et al.

(10) Patent No.: US 7,090,785 B2
(45) Date of Patent: *Aug. 15, 2006

(54) ELECTROMECHANICAL ACTUATORS

(75) Inventors: Yet-Ming Chiang, Framingham, MA (US); Sossity A. Sheets, Chandler, AZ (US); Gregory W. Farrey, Lansing, MI (US); Nesbitt W. Hagood, IV, Wellesley, MA (US); Andrey Soukhojak, Somerville, MA (US); Haifeng Wang, Mountain View, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/635,240

(22) Filed: Aug. 5, 2003

(65) Prior Publication Data

Related U.S. Application Data

(63) Continuation of application No. 09/827,806, filed on Apr. 6, 2001, now abandoned, which is a continuation-in-part of application No. 09/174,981, filed on Oct. 19, 1998, now Pat. No. 6,231,779.

(60) Provisional application No. 60/221,278, filed on Jul. 27, 2000, provisional application No. 60/195,835, filed on Apr. 11, 2000, provisional application No. 60/085,109, filed on May 12, 1998, provisional application No. 60/062,531, filed on Oct. 20, 1997.

(51) Int. Cl.
*C04B 34/49* (2006.01)

(52) U.S. Cl. .................... 252/62.9 R; 252/62.9 PZ; 501/134; 501/135; 501/136; 501/137; 501/139; 117/949; 117/944; 117/950; 117/948

(58) Field of Classification Search ........... 252/62.9 R, 252/62.9 PZ; 117/949, 944, 950, 948; 501/134, 501/135, 136, 137, 139
See application file for complete search history.

(56) References Cited

U.S. PATENT DOCUMENTS

| 3,994,823 A | 11/1976 | Ainger et al. |
| 4,542,083 A | 9/1985 | Cava et al. |
| 4,668,595 A | 5/1987 | Yoshino et al. |

(Continued)

FOREIGN PATENT DOCUMENTS

JP 2001-048641 * 2/2001

(Continued)

OTHER PUBLICATIONS

Kuwata, J. et al., "Dielectric and Piezoelectric Properties of $0.91Pb(Zn_{1/3}Nb_{2/3})O_3$-$0.09PbTiO_3$ Single Crystals," *Japanese Journal of Applied Physics*, Sep. 1982, 21(9):1298-1302.

(Continued)

*Primary Examiner*—C. Melissa Koslow
(74) *Attorney, Agent, or Firm*—Wolf, Greenfield & Sacks, P.C.

(57) ABSTRACT

A perovskite compound of the formula, $(Na_{1/2}Bi_{1/2})_{1-x}M_x(Ti_{1-y}M'_y)O_{3\pm z}$, where M is one or more of Ca, Sr, Ba, Pb, Y, La, Pr, Nd, Sm, Eu, Gd, Tb, Dy, Ho, Er, Tm, Yb and Lu; and M' is one or more of Zr, Hf, Sn, Ge, Mg, Zn, Al, Sc, Ga, Nb, Mo, Sb, Ta, W, Cr, Mn, Fe, Co and Ni, and $0.01<x<0.3$, and $0.01<y<0.3$, and $z<0.1$ functions as an electromechanically active material. The material may possess electrostrictive or piezoelectric characteristics.

34 Claims, 34 Drawing Sheets

U.S. PATENT DOCUMENTS

| | | | |
|---|---|---|---|
| 5,423,995 | A | 6/1995 | Helke et al. |
| 5,500,142 | A | 3/1996 | Ushida et al. |
| 5,527,480 | A | 6/1996 | Bailey et al. |
| 5,558,961 | A | 9/1996 | Doeff et al. |
| 5,637,542 | A | 6/1997 | Takenaka |
| 5,648,012 | A | 7/1997 | Higashibeppu et al. |
| 5,796,207 | A | 8/1998 | Safari et al. |
| 6,004,474 | A | 12/1999 | Takenaka et al. |
| 6,080,327 | A | 6/2000 | Takenaka et al. |
| 6,231,779 | B1 * | 5/2001 | Chiang et al. .......... 252/62.9 R |
| 6,426,018 | B1 * | 7/2002 | Takahashi et al. ..... 252/62.9 R |
| 6,599,662 | B1 | 7/2003 | Chiang et al. |
| 2002/0036282 | A1 | 3/2002 | Chiang et al. |
| 2002/0048706 | A1 | 4/2002 | Mayes et al. |
| 2003/0082446 | A1 | 5/2003 | Chiang et al. |
| 2003/0099884 | A1 | 5/2003 | Chiang et al. |
| 2004/0005265 | A1 | 1/2004 | Chiang et al. |

FOREIGN PATENT DOCUMENTS

| | | |
|---|---|---|
| WO | WO 98/16960 A3 | 4/1998 |
| WO | WO 99/56331 A1 | 11/1999 |
| WO | WO 00/41256 A1 | 7/2000 |
| WO | WO 01/77501 A2 | 10/2001 |
| WO | WO 02/43168 A2 | 5/2002 |
| WO | WO 03/012908 A2 | 2/2003 |
| WO | WO 03/056646 A1 | 7/2003 |

OTHER PUBLICATIONS

Roleder, K. et al., "Time Dependence of Electric Permittivity in $Na_{0.5}Bi_{0.5}TiO_3$ Single Crystals," *Ferroelectrics*, 1989, 89:1-5. no month.

Sakata, "Ferroelectric and Antiferroelectric Properties of ($Na_{0.5}Bi_{0.5}$) $TiO_3$-$SrTiO_3$ Solid Solution Ceramics," *Ferroelectrics*, 1974, 7:347-349. no month.

Smolenskii, G.A. et al., "New Ferroelectrics of Complex Composition.IV," *Sov. Phys.-Solid State*, May 1961, 2(11):2651-2654.

Takenaka, T. et al, Acoustic Wave Characteristics of Lead-Free ($Bi_{1/2}Na_{1/2}$)$_{0.99}Ca_{0.01}TiO_3$ Piezoelectric Ceramic, *J. Appl. Phys. Suppl.*, 1992, 28:59-62, No month.

Takenaka et al, $Bi_{1/2}Na_{1/2}$) $TiO_3$ System for Lead-Free Piezoelectric Ceramics, *Japanese Journal of Applied Physics*, Sep. 1991, 30(9B):2236-2239.

Takenaka, T. et al, "Piezoelectric Ceramics of ($Bi_{1/2}Na_{1/2}$)$TiO_3$-$PbTiO_3$-$BaTiO_3$ System," *Elect. Eng. Japan*, 1992, 112(7):92-100.

Bergman et al., "Phase Diagram for $K_2O$-$Na_2O$-$B_2O_3$-$P_2O_5$," Reported in *Russ. J. Inorg. Chem.* 14(7):1036-1038 (1969) [abstract only].

Manier et al., $Na_{0.5}Bi_{0.5}TiO_3$-$K_{0.5}Bi_{0.5}TiO_3$ (NBT-KBT) System: A Structural and Electrical Study: *Phys. Stat. Sol.* 157:499-506 (1996).

Park and Shrout, "Ultrahigh Strain and Piezoelectric Behavior in Relaxor Based Ferroelectric Single Crystals" *J. Appl. Phys.* 82:1804-1811 (1997).

Park and Chung, "Nonstoichiometry and the Long-Range Cation Ordering in Crystals of ($Na_{1/2}Bi_{1/2}$) $TiO_3$," *J. Am. Ceram. Soc.* 77(10):2641-47 (1994).

Pronin et al., "Peculiarities of Phase Transitions in Sodium-Bismuth Titanate" *Ferroelectrics* 25:395-397 (1980).

Roleder et al., "Time Dependence of Electric Permittivity in $Na_{0.5}Bi_{0.5}TiO_3$ Single Crystals" *Ferroelectrics* 89:1-5 (1989).

Service, "Shape-Changing Crystals Get Shiftier" *Science* 275:1877-1878 (1997).

Takenaka et al., "Mechanical Properties of ($Bi_{1/2}Na_{1/2}$)$TiO_3$-based Piezoelectric Ceramics" *Silicates Industrieles* 7-8:136-142 (1993).

Vakhrushev et al., "Investigation of a Broad Phase Transition in $Na_{0.5}Bi_{0.5}TiO_3$ By the Neutron Scattering Method" *Sov. Phys. Solid State* 27(3):455-457 (1985).

Wang et al., "Phase Diagram of $K_{0.5}Bi_{0.5}TiO_3$-$Na_{0.5}Bi_{0.5}TiO_3$" *Guisuanyan Xuebao* 15(3):248-255 (1987) [abstract only].

R. D. Shannon, "Revised Effective Ionic Radii And Systematic Studies Of Interatomic Distances In Halides And Chalcogenides," *Acta Cryst.* (1976), A32, pp. 751-767.

R. D. Shannon, "Dielectric Polarizabilities Of Ions In Oxides And Fluorides," J. Appl. Phys., vol. 73, No. 1, pp. 348-366, Jan. 1, 1993.

Osamu Fukunaga et al., "The Relation Between Ionic Radii And Cell Volumes In The Perovskite Compounds," Journal of Solid State Chemistry, vol. 8, pp. 331-338 (1973).

Sossity Sheets, "Dielectric and Electromechanical Properties of Barium and Zirconium Co-Doped Sodium Bismuth Titanate," Master of Science Thesis, Department of Materials Science and Engineering, Massachusetts Institute of Technology, 2004.

* cited by examiner

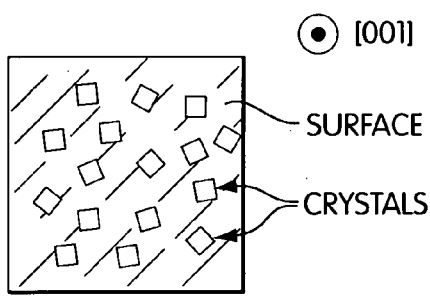
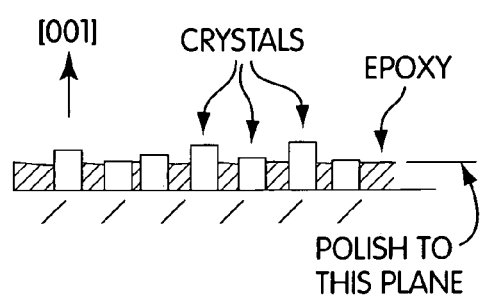
Fig. 6A  Fig. 6B
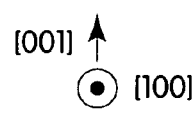
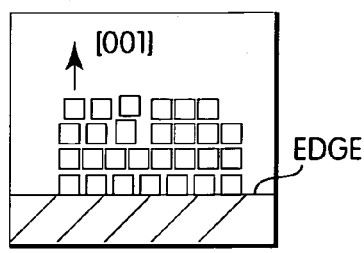
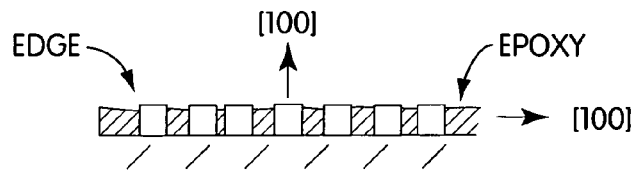
Fig. 7A  Fig. 7B

AS-GROWN

CUT AND POLISHED

CROSSED-POLARIZED LIGHT $\varepsilon_{r, 1 kHz}$ (before poling) = 1593
$\varepsilon_{r, 1 kHz}$ (after poling) = 1595

ELECTROMECHANICAL ACTUATORS

This application is a continuation of U.S. patent application Ser. No. 09/827,806, filed Apr. 6, 2001, entitled "Electromechanical Actuators," now abandoned, which is a continuation-in-part application of U.S. patent application Ser. No. 09/174,981 filed Oct. 19, 1998, entitled "Piezoelectric Actuators and Methods of Making Same," now U.S. Pat. No. 6,231,779, which is incorporated herein by reference.

U.S. patent application Ser. No. 09/174,981 also claims the benefit of U.S. Provisional Patent Application Ser. No. 60/085,109, filed May 12, 1998 and U.S. Provisional Patent Application Ser. No. 60/062,531, filed Oct. 20, 1997.

U.S. patent application Ser. No. 09/827,806 also claims priority from U.S. Patent Application Ser. No. 60/195,835 filed Apr. 11, 2000, entitled "Electromechanical Actuators and Methods of Making Same," incorporated herein by reference, and U.S. Patent Application Ser. No. 60/221,278, filed Jul. 27, 2000, entitled "Barium and Zirconium Co-Doped Sodium Bismuth Titanate."

GOVERNMENT FUNDING

This invention was made with government support under Grant Number N00014097-1-0989 awarded by the Office of Naval Research. The government has certain rights in the invention.

BACKGROUND OF THE INVENTION

This invention relates to a class of lead-free or low lead perovskite structure oxide compounds useful as electromechanical actuators. It also relates to composite actuators utilizing these compounds in the form of oriented polycrystals or crystallites. The invention relates to compositions exhibiting improved strain coefficients, strain actuation and other properties relating to piezoelectric or electrostrictive performance. The invention also relates to a method of making an electromechanical device, e.g., a piezoelectric or electrostrictive device, which incorporates oriented crystallites.

Piezoelectric materials respond to the application of stress by generating electrical polarization in the crystal, and generate a strain upon application of electric field. The magnitude of the piezoelectric effect or electromechanical effects, in general, is measured in part by the piezoelectric coefficient $d_{ab}$ which is a measure of the strain in the material due to the application of a unit electric field and the electromechanical coupling constant $k_{ab}$, the square of which is a measure of the efficiency of electromechanical energy conversion. The subscript a denotes the direction in which the field is applied and the subscript b denotes the direction of the measured actuation. The widely used $Pb_xZr_{1-x}TiO_3$ (PZT) family of piezoelectric actuators typically show $d_{33}$=200–700 pC/N, maximum strains before dielectric breakdown of 0.3% and maximum electromechanical coupling coefficients of $k_{33}$~80%.

Single crystal ferroelectric perovskite compounds such as $Pb_xMg_{1-x}Nb_yTi_{1-y}O_3$ (PMN-PT) and $Pb_xZn_{1-x}Nb_yTi_{1-y}O_3$ (PZN-PT) have recently been shown to have unusually good performance as piezoelectric actuators, with strain coefficients $d_{33}$ of up to 2500 pC/N, maximum strains of 1.5%, and electrochemical coupling coefficients of k=94%. See Kawata et al., *Jap. J. Appl. Phys.* 21:1298 (1982). The piezoelectric properties are superior to those of PZT and appear to be much easier to grow as single crystals than many other perovskites, including PZT. At room temperature, these single crystal actuators form the perovskite structure in a phase of rhombohedral symmetry. They exhibit these superior properties only when they are actuated out of the spontaneous polarization direction, which is ⟨111⟩ when referred to the crystal axes of the corresponding cubic perovskite. The highest actuation to date appears to have been observed when the crystals are actuated with the applied field parallel to the ⟨100⟩ direction of the corresponding cubic perovskite.

A drawback to all these lead-based perovskites is the toxicity of lead and associated difficulties in processing, crystal growth and handling. In certain environmentally sensitive or biologically sensitive applications, they can not be used. Another drawback is the high density and relatively low elastic modulus of the lead based perovskites. For applications where toxicity or weight-based measures of performance are important, alternative materials are desired.

$(Na_{1/2}Bi_{1/2})TiO_3$ (NBT) and $(K_{1/2}Bi_{1/2})TiO_3$ (KBT) are known to crystallize in the perovskite crystal structure. See, Smolenskii et al., *Soviet Phys. Solid State* 2(11):2651 (May, 1961) and Roleder et al, *Ferroelectrics* 89:1 (1989). At room temperature, NBT is a rhombohedral ferroelectric with a Curie temperature of 320° C. Undoped BNT has been grown as single crystals, and the structure and phase transitions as a function of temperature have been studied; however, the piezoelectric properties of the single crystal are not known and it has not been used as a piezoelectric actuator.

$(Na_{1/2}Bi_{1/2})TiO_3$ has also been alloyed with alkaline earth titanates. Polycrystalline materials in the $(Na_{1/2}Bi_{1/2})TiO_3$-M'TiO_3 (M'=Ca, Sr, Ba, Pb) systems have been previously studied. See, Takenaka et al. *Ferroelectrics* 7:347 (1974); and *Jap. J. Appl. Phys.* 30(9B):2236 (1991). In all these doped materials, the modest values of $d_{33}$ and $k_{33}$ make them of relatively limited interest for piezoelectric actuation, when compared with materials such as PZT.

Takenaka et al. reports the alloying of $(Na_{1/2}Bi_{1/2})TiO_3$ with $BaTiO_3$ (*Jap. J. Appl. Phys.* 30(9B):2236 (1991)) or $PbTiO_3$ (*Elec. Eng. Japan* 112(7):92 (September 1992)). The compounds exhibit a morphotropic phase boundary (MPB) between rhombohedral (ferroelectric) and tetragonal (ferroelectric) phases at approximately 6 molar % and 13.5 molar % of the additive, respectively, at 20° C. Near the morphotropic phase boundary, $d_{33}$ values of approximately 125 pC/N and $k_{33}$ of about 55% have been reported.

For $(Na_{1/2}Bi_{1/2})TiO_3$ alloyed with $CaTiO_3$, the morphotropic phase boundary between rhombohedral (ferroelectric) and cubic (paraelectric) phases lies at approximately 17% at 20° C., and a 10% composition shows $d_{33}$ values of approximately 50 pC/N and $k_{33}$ of about 38%. See, Takenaka et al. *Japan. J. Appl. Phys.*, 28:59 (1989).

$(Na_{1/2}Bi_{1/2})TiO_3$ alloyed with $SrTiO_3$ shows a more complicated sequence of phases with increasing Sr concentration. A rhombohedral phase (antiferroelectric) phase intervenes between the rhombohedral (ferroelectric) and cubic (paraelectric) endmembers. Some mixed substitutions such as those between NBT and $(Pb,Ba)TiO_3$ and $(Pb_2Sr)TiO_3$ have also been characterized and show, near the morphotropic phase boundary (MPB) between rhombohedral (ferroelectric) and tetragonal (ferroelectric) phases, $d_{33}$ 125=pC/N and $k_{33}$=55%. See, Takenaka et al. *Ferroelectrics* 7:347 (1974).

While the intrinsic electromechanical properties of properly oriented single crystals appear to be attractive, there are numerous obstacles to their practical implementation. Firstly, the growth, orientation, cutting and handling of large single crystals is expensive and difficult. For example, a typical method of single crystal growth is the Czochralski method in which a crystal may take days to grow. Special precautions in crystal growth may have to be taken for compounds that contain toxic and volatile components, such as lead oxide. Secondly, ceramic ferroelectrics are mechanically brittle and weak, more so than other ceramics such as aluminum oxide, silicon nitride or silicon carbide. The act of electrical actuation can be sufficient to cause fracture in a single crystal actuator.

Polycrystalline materials are more tolerant of crystalline defects and are easier to manufacture. Nonetheless, a conventional polycrystalline ferroelectric, electrostrictive or magnetostrictive actuator suffers in performance relative to an optimally oriented single crystal. One reason is that randomly oriented crystallites can not simultaneously be oriented with respect to an applied field so as to optimize the intrinsically anisotropic crystal properties in each grain. Another reason is that each single crystal grain undergoes anisotropic crystal deformation under the applied field and so works against its neighbors. This limits the net strain which is achievable from polycrystalline actuator material.

If the majority of the gains in a polycrystal are textured, that is, share one or more common crystallographic directions, the electromechanical properties can approach those of a single crystal. However, it is well-known to those skilled in the art that polycrystalline ceramics are difficult to prepare in a textured form. Ceramics which tend to grow grains with an anisotropic platelet shape, such as micaceous minerals or the Bi—Sr—Ca—Cu—O superconducting compound, or a needle-like shape, such as certain magnetic oxides, can sometimes be prepared in an aligned form by deformation and/or recrystallization of an initial isotropic grain or by applying a high electric or magnetic field. Systems with isotropic grain and crystallite shapes, which include the perovskites of interest, are much harder to align. While oriented polycrystalline perovskite ferroelectrics have been accomplished in the form of thin films supported by a substrate they have not been achieved in polycrystals suitable for actuation devices.

It is an object of the present invention to provide perovskite compounds which are low in lead or lead-free and which can be grown as single crystals for use as electromechanically active materials.

It is a further object of the invention to provide electromechanically active perovskite compounds of rhombohedral, tetragonal and other phase symmetries for use in electromechanical actuators.

It is a further object of the invention to provide perovskite compounds which are low in lead or lead-free and which have superior electromechanical properties, such as improved strain coefficients, low hysteresis piezoelectric actuation, ultrahigh room temperature electrostrictive actuation, improved coupling constant and/or improved actuation strain.

Yet a further object of the invention is to provide a piezoelectric composite device which provides the advantages of anisotropic properties of large single crystal materials without the need to use said large crystals.

SUMMARY OF THE INVENTION

In accordance with the invention there are provided single crystal and polycrystalline materials of a broad family of alkali metal bismuth perovskite compositions which demonstrate surprisingly unexpected electromechanical properties, e.g., piezoelectric, forced-field phase transition and electrostrictive actuation.

In one aspect of the invention, an electromechanical actuator comprising a single crystal perovskite material is provided having the formula, $M_\alpha Bi_\beta M'_\gamma M''_\delta O_{3\pm z}$, where M is one or more of Na, K, Rb and Cs; M' is one or more of Ca, Sr, Ba, Pb, Y, La, Pr, Nd, Sm, Eu, Gd, Tb, Dy, Ho, Er, Tm, Yb and Lu; and M" is one or more of Ti, Zr, Hf, Sn, Ge, Mg, Zn, Al, Sc, Ga, Nb, Mo, Sb, Ta and W; and where $z \leq 0.1$; $0.9 \leq \delta \leq 1.1$; $\alpha$, $\beta$, and $\gamma$ are greater than zero; and $(\alpha+\beta+\gamma)$ is in the range of about 0.75 to 1.1, or preferably in the range of 0.75 to 0.95.

In another aspect of the invention, an electromechanical actuator is provided comprising a perovskite material having the formula, $Na_\omega M_\alpha Bi_\beta M'_\gamma M''_\delta O_{3\pm z}$, where M is one or more of K, Rb and Cs; M' is one or more of Ca, Sr, Ba, Pb, Y, La, Pr, Nd, Sm, Eu, Gd, Tb, Dy, Ho, Er, Tm, Yb and Lu; M" is one or more of Ti, Zr, Hf, Sn, Ge, Mg, Zn, Al, Sc, Ga, Nb, Mo, Sb, Ta and W; where $z \leq 0.1$; $0.9 \leq \delta \leq 1.1$; $\alpha$, $\beta$, $\gamma$ and $\omega$ are greater than zero; and $(\alpha+\beta+\gamma+\omega)$ is in the range of about 0.75 to 1.1, preferably in the range of 0.75 to 0.95.

In preferred embodiments, the material may exhibit superior piezoelectric properties such as a $d_{33}$ value of greater than 200 pC/N, a piezoelectric strain of greater than 0.15% and/or low hysteresis of actuation. For the purpose of the invention, "low hysteresis" is defined with respect to a plot of the longitudinal strain of the piezoelectric material against the applied electric field. As the field is varied repeatedly at low frequency (e.g., less than 100 Hz) between a lower limit $E_1$ and an upper limit $E_2$, where $E_1$ and $E_2$ have the same sign, the strain varies between the limits $\in_1$ and $\in_2$. Low hysteresis is defined as the instance where the area between the increasing field and the decreasing field portions of the strain curve is less than about 25% of the total area under the strain curve measured upon increasing, the absolute value of the field between the limits $E_1$ and $E_2$. The material may also exhibit an electric field-forced phase transition from an antiferroelectric to a ferroelectric phase, with an accompanying strain of at least 0.1%.

In other preferred embodiments, the material exhibits a substantially electrostrictive effect with an electric field-induced strain of greater than 0.1%, or greater than 0.2% in a field of less than 60 kV/cm. In another embodiment, the material may exhibit a strain of up to 0.45% in field of less than 60 kV/cm.

It is desirable to obtain single crystalline materials near the morphotropic phase boundary or point in the $M_\alpha Bi_\beta M'_\gamma M''_\delta O_{3\pm z}$ and $Na_\omega M_\alpha Bi_\beta M'_\gamma M''_\delta O_{3\pm z}$ systems to maximize the electrical properties of the material. By "morphotropic phase boundary" or MPB as that term is used herein it is meant a boundary between two perovskite phases of different crystal symmetry, at least one of which is ferroelectric or antiferroelectric. By "morphotropic phase point" or MPP as that term is used herein it is meant a point between three perovskite symmetry phases, at least one of which is ferroelectric or antiferroelectric. By "near" an MPB or MPP as that term is used it is meant that any of the parameters $\alpha$, $\beta$, $\gamma$, $\delta$ and/or $\omega$ are within 3 mol % of a MPB or MPP.

The present invention has also surprisingly discovered that composition some distance from the morphotropic phase boundary possess interesting and useful properties. Specifically, a perovskite compound of the formula, $(Na_{1/2} Bi_{1/2})_{1-x} M_x (Ti_{1-y} M'_y) O_{3\pm z}$, where M is one or more of Ca, Sr, Ba, Pb, Y, La, Pr, Nd, Sm, Eu, Gd, Tb, Dy, Ho, Er, Tm, Yb and Lu; and M' is one or more of Zr, Hf, Sn, Ge, Mg, Zn, Al, Sc, Ga, Nb, Mo, Sb, Ta, W, Cr, Mn, Fe, Co and Ni, and 0.01<x<0.3, and 0.01<y<0.3, and z<0.1 is an electromechanically active material both near and at a distance from the MPB. In preferred embodiments, the materials is a perovskite of the formula, $(Na_{1/2}Bi_{1/2})_{1-x}M_x(Ti_{1-y}M'_y)O_{3\pm z}$, where M is one or more of Ca, Sr, Ba, and Pb; and M' is one or more of Zr, Hf, and Sn, and 0.01<x<0.3, and 0.01<y<0.2, and z<0.1, or it is a perovskite of the formula, $(Na_{1/2}Bi_{1/2})_{1-x}Ba_x(Ti_{1-y}M'_y)O_{3\pm z}$, where M' is one or more of Zr and Hf, and 0.01<x<0.2, 0.01, <y<0.1, and z<0. The material may be an electrostrictive material with an electric field-induced strain greater than about 0.1% at a field less than 60 kV/cm.

Increased doping of $BaTiO_3$ beyond the 6% BT-MPB composition in NBT-BT continues to stabilize the ferroelectric tetragonal phase. This invention demonstrates that through simultaneous doping on the A- and B-sites in NBT with $Ba^{2+}$ and $Zr^{4+}$, respectively, rhombohedral and tetragonal non-ferroelectric phases can be stabilized for higher concentrations of $Ba^{2+}$ (up to 26 mol % $Ba^{2+}$). Within the same phases, relaxor properties are often enhanced by the introduction of greater $Ba^{2+}$ doping.

A- and B-site doping in polycrystalline samples succeeded in isolating predominantly electrostrictive actuation. The highest polycrystalline actuation strain, however, occurs for a set of compositions that lie within regions showing mixed actuation behavior. Predominantly electrostrictive strains >0.2% were measured with minimal hysteresis at 0.05 Hz and $d_{33}$>700 pC/N at 25 kV/cm, surpassing the maximum reported properties for conventional PMN and PLZT at 1 Hz. Single crystals of the same composition, phase, and electrostrictive actuation character show up to 0.45% strain and maximum $d_{33}$~2000 pC/N at 35 kV/cm. Predominantly ferroelectric polycrystalline compositions with $d_{33}$~310 pC/N are competitive with commercial PZT-8 ($d_{33}$~300 pC/N).

(Ba, Zr) co-doped NBT compositions are thus a promising alternative to the conventional lead-oxide based polycrystalline perovskites, such as electrostrictive PMN and PLZT electrostrictors and ferroelectric PZT-8, PMNT, PZT-5a for device applications.

This family of materials embodies a rhombohedral phase single crystal or textured polycrystal material with low hysteresis piezoelectric actuation and/or large piezoelectric strain coefficient $d_{33}$. The invention also provides a tetragonal phase single crystal or textured polycrystal material having exceptionally high piezoelectric strains and electrostrictive strains, as well as heretofore unreported large d values.

In another aspect, the invention provides methods of actuating tetragonal phase perovskite piezoelectric materials, by applying an electric field to a single crystal in a direction out of the spontaneous polarization direction of {100}. For example, the direction may be ⟨111⟩ or ⟨110⟩ of the corresponding cubic phase.

In yet another aspect, the invention provides methods of preparing oriented arrays of crystals, which include growing crystals or crystallites in a faceted morphology, and aligning a set of facets and/or edges of the crystals to crystallites to produce a textured array. These methods may be applied to the inventive compositions described herein, and/or to lead-containing perovskites or materials containing perovskite relaxor compounds. The crystals or crystallites may be grown, for example, in a flux liquid.

Further provided are devices comprising textured arrays of crystals or crystallites in a matrix. The texture may be uniaxial or multiaxial. Devices according to this aspect of the invention may comprise one or more single crystal piezoelectric fibers secured in an appropriate matrix.

The invention provides advantages for a very broad range of applications where elecromechanical or piezoelectric actuators are presently used, including but not limited to sonar transducers, piezoelectric motors, surface acoustics wave (SAW) devices, ultrasonic devices, passive and active structural composites for applications from sporting goods to aircraft and motorcraft, acoustic dampening composites, positioning devices for manufacturing and scanning probe microscopes, printer devices, and other suitable actuation applications.

Definitions

Electromechanical Actuator: device or material that exhibits a mechanical strain upon the application of an electric field.

Electromechanically active material: a material that is capable of converting electrical energy into mechanical energy, or converting mechanical energy into electrical energy, or both. Typically, the actuator demonstrates either piezoelectricity, electrostriction, or an electric field-forced phase transition. A piezoelectric material when electrically poled will develop an electric charge on its surfaces in response to an applied mechanical stress. It also develops a mechanical strain when an electric field is applied across it. The piezoelectric effect is often linear, producing a strain proportional to the electric field with the displacement directionally dependent on the sign of the applied field.

Electrostriction is present in all materials and is the development of mechanical strain in response to an applied electric field. For ordinary crystals, the electrostrictive effect is very weak with a strain on the order of $10^{-11}$ in simple oxides and $10^{-6}$ in oxide perovskovites. The ultra-high electrostriction demonstrated by the materials of the present invention show a strain in excess of about 0.05%, or preferably about 0.1% at electric fields below about 60 kV/cm, e.g., below about 50 kV.cm. High strain electrostrictors are the preferred materials for certain actuator applications because they can have negligible hysteresis, i.e., no shift from their original zero field strain upon removal of the field, and do not require electric poling to preferentially orient crystal dipoles or domains in order to obtain high electromechanical response. In addition to piezoelectricity or electrostriction, certain materials develop mechanical strain under an applied electric field due to a field-forced phase transition. This phase transition can be of several kinds but in each instance a new phase is formed under the influence of the electric field resulting in an increased strain in the direction of the applied field. In such electromechanically active materials, a sharp increase in strain is often observed at a particular electric field where the phase transition is induced.

While compositions are classified according to their dominant character, nearly all compositions studied here exhibit a mixed response, with significant electrostrictive contributions overprinting the ferroelectric component, and in some compositions, dominating the actuation character. It is understood that the "electrostrictive" materials of the invention may exhibit mixed actuation behavior.

Single Crystal: A physically isolated piece of a crystalline compound across which the crystalline lattice is continuous, except for the possible presence of occasional discontinuities in the form of dislocations, pores, inclusions, and coherent interfaces such as twin boundaries, stacking faults, or low-angle grain boundaries.

Polycrystalline Material (or polycrystal): An assemblage of multiple single crystalline grains.

Randomly Oriented Polycrystalline Material: A polycrystal for which there is no common orientation of any crystallographic axis of the compound between the individual single crystalline grains except for that which occurs on a random statistical basis.

Textured Polycrystalline Material: A polycrystal in which there exists a degree of common orientation to any crystallographic axis of the compound amongst the multiplicity of single crystals. The common or shared orientation of the single crystals comprising the polycrystal is, on average, greater than that which occurs due to the random statistical placement of crystals. Textured polycrystals can have uniaxial texture, wherein the multiplicity of single crystalline grains share on average a preferred orientation of a crystal axis along one direction, resulting in an axial symmetry to the polycrystal. Textured polycrystals can also have biaxial texture, wherein the multiplicity of single crystalline grains share a preferred orientation of more than one crystal axis. The degree of texture in a textured polycrystal can be great or small, and can be determined by well known methods such as x-ray diffraction pole figures, electron diffraction, or electron channeling microscopy.

Composition terminology. This composition system will herein be referred to as a $Na_{1/2}Bi_{1/2}TiO_3$—$BaTiO_3$—$Na_{1/2}Bi_{1/2}ZrO_3$ solid solution. The abbreviation NBT-xBT-yNBZ will be used, where x and y represent mol % Ba and mol % Zr, respectively. Alternatively, the composition may be referred to as $(Na_{12}Bi_{1/2})_{1-x}M_x(Ti_{1-y}M'_y)O_3$, where x and y also represent mol % Ba and mol % Zr, respectively.

BRIEF DESCRIPTION OF THE DRAWINGS

The invention is described with reference to the drawings, which are presented for the purpose of illustration only and which are in no way intended to be limiting of the invention and in which:

FIG. 6 is a top view (A) and a side view (B) of an array of textured crystallites oriented according to the method of the invention;

FIG. 7 is a top view (A) and a side view (B) of an array of biaxially textured crystallites oriented according to the method of the invention;

DETAILED DESCRIPTION OF THE INVENTION

Figure 1:
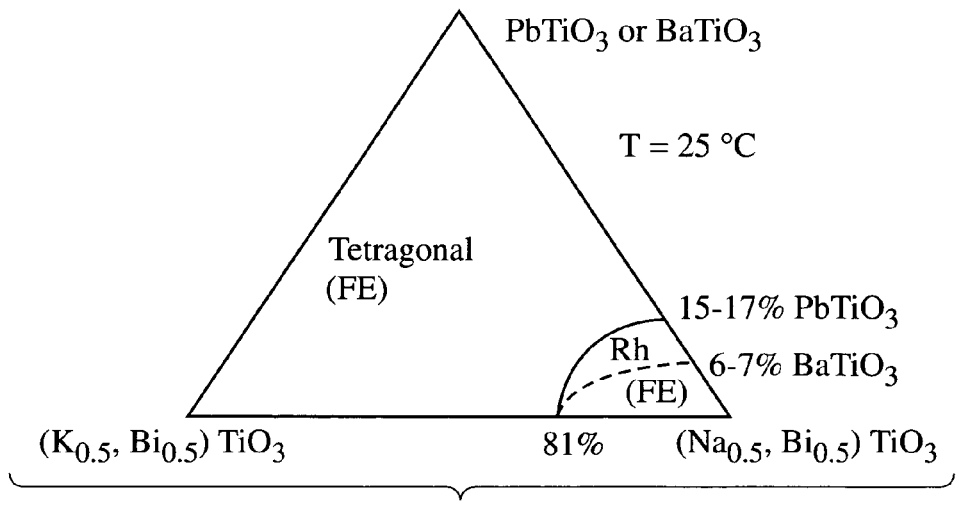
FIG. 1 is a schematic ternary phase diagram for the $PbTiO_3$ or $BaTiO_3$—$(K_{1/2}Bi_{1/2})TiO_3$—$(Na_{1/2}Bi_{1/2})TiO_3$ system at 25° C.

Rhombohedral and Tetragonal Single Crystals with Improved Electromechanical Performance.

In one aspect of the invention, single crystal forms of the alkali metal bismuth titanate-alkaline earth titanate (MBiTiO$_3$-MTiO$_3$) solid solution system are provided. MM'BiTiO$_3$ can form the desired perovskite crystal structure when doped with alkaline earth titanates, the alkaline earth substituting at the A-sites of the perovskite lattice structure, where the A-site is defined as that cation site which is 12-fold coordinated by oxygen.

In accordance with the invention, it is recognized that it can be desirable to substitute elements such as Ca, Sr, Ba, Pb, Y, La, Pr, Nd, Sm, Eu, Gd, Th, Dy, Ho, Er, Tm, Yb and Lu, in the family of compositions of the invention at the A-site of the perovskite, for the purposes of increasing the relaxor permittivity, increasing the piezoelectric strain coefficient or increasing the coupling constant of the composition. These substitutions change the properties of the crystal and/or the relative stability of the various perovskite phases by virtue of their size or polarizability.

Also in accordance with the invention, it is recognized it can be desirable to substitute elements such as Zr or Hf, Sn, Ge, Mg, Zn, Al, Sc, Ga, Nb, Mo, Sb, Ta and W for Ti (the B-site) in the family of compositions of the invention, for the purposes of increasing the relaxor permittivity, increasing the piezoelectric strain coefficient of the composition, or increasing the coupling constant of the material. These substitutions change the properties of the crystal and/or the relative stability of the various perovskite phases by virtue of their size or polarizability.

In a preferred embodiment, single crystallites of the solid solution $M_\alpha Bi_\beta M'_\gamma M''_\delta O_{3\pm\epsilon}$, are provided. The crystallites appear as faceted crystals with certain crystal planes exposed. The crystallites are preferably the Wulff shape of the crystal, which is the shape preferred in order to minimize the surface energy of the crystal, but may also be shape determined by growth kinetics. In preferred embodiments, the perovskite crystals have a cubic shape such that each face is a {100} plane of the corresponding cubic phase. The crystallites vary in size from about 0.1 mm to greater than 5 mm, but in any case are smaller than the monolith single crystals grown from conventional single crystal growth techniques such as Bridgeman growth or the Czochralski method. Crystallites are obtained as described hereinbelow.

In another preferred embodiment, textured or oriented polycrystals are provided. The individual crystallites appear as faceted crystals with certain crystal planes exposed. The oriented polycrystals are oriented by alignment of a facet of the crystallite with a surface or edge of a substrate. Oriented polycrystallites are obtained as described hereinbelow. Examples of polycrystalline materials include materials having the form of rods, fibers, ribbons, or sheets.

Although some of the phase diagrams of the related polycrystalline materials were known and understood to some degree, prior to the invention it was not known if single crystals of any of the (Na, M, Bi)TiO$_3$ (NBT) or (K, Bi)TiO$_3$ (KBT) family of compositions could be grown, particularly in the rhombohedral symmetry which has given high actuation strain in PMT-PT and PZN-PT systems. Consequently, the electromechanical strain properties of the single crystals were not known.

It has been surprisingly discovered that a composition of rhombohedral phase symmetry and having the formula (M, Bi)TiO$_3$-M'TiO$_3$, where M is one or more of Na, K, Rb and Cs, M' is one or more of Ca, Sr, Ba, Pb, Y, La, Pr, Nd, Sm, Eu, Gd, Th, Dy, Ho, Er, Tm, Yb and Lu, and where Ti may be substituted in whole or in part by Zr or Hf, Sn, Ge, Mg, Zn, Al, Sc, Ga, Nb, Mo, Sb, Ta and W, demonstrates a low hysteresis piezoelectric actuation when the electric field is applied in the (001) direction of the corresponding cubic phase. For example, in the Na$_{1/2}$Bi$_{1/2}$TiO$_3$—BaTiO$_3$ subclass of this family provided in accordance with the invention, low-hysteresis actuation is possible in the rhombohedral ferroelectric phase when an electric field is applied in the [100] direction. The term low hysteresis is used as previously defined and is exemplified by the strain vs. E field plots shown in FIGS. 10 and 21.

It also has been surprisingly discovered that single crystal compositions formula (M, Bi)TiO$_3$—M'TiO$_3$, where M is one or more of Na, K, Rb and Cs, M' is one or more of Ca, Sr, Ba, Pb, Y, La, Pr, Nd, Sm, Eu, Gd, Th, Dy, Ho, Er, Tm, Yb and Lu, and where Ti may be substituted in whole or in part by Zr or Hf, Sn, Ge, Mg, Zn, Al, Sc, Ga, Nb, Mo, Sb, Ta and W, possess very high piezoelectric strain coefficients. For example, $d_{33}$ coefficients of greater than 200 pC/N, and preferably greater than 300 pC/N, and more preferably greater than 450 pC/N, have been measured in this family of materials provided in accordance with the invention.

It further has been surprisingly discovered that single crystal compositions formula (M, Bi)TiO$_3$-M'TiO$_3$, where M is one or more of Na, K, Rb and Cs, M' is one or more of Ca, Sr, Ba, Pb, Y, La, Pr, Nd, Sm, Eu, Gd, Th, Dy, Ho, Er, Tm, Yb and Lu, and where Ti may be substituted in whole or in part by Zr or Hf, Sn, Ge, Mg, Zn, Al, Sc, Ga, Nb, Mo, Sb, Ta and W, exhibit exceedingly high piezoelectric actuation strains.

For example, strains of greater than 0.15%, and preferably greater than 0.25%, more preferably greater than 0.50% and most preferably greater than 0.75% have been observed in this family of materials. In one example of a tetragonal phase (Na,Bi)TiO$_3$ BaTiO$_3$ material, an actuation strain of 0.85% was measured. While these reported properties have been measured in single crystals, it is expected that the related textured polycrystalline materials will demonstrate similar improvements in piezoelectric properties.

It also has been surprisingly discovered that compositional ranges of solid solutions of $(Na_{1/2}Bi_{1/2})_{1-x}M_x(Ti_{1-y}M'_y)O_3$ provide a range of interesting and useful electromechanical properties. A- and B-site doping in polycrystalline samples succeeded in isolating predominantly electrostrictive actuation. The highest polycrystalline actuation strain, however, occurs for a set of compositions that lie within a region showing mixed actuation behavior. Predominantly electrostrictive strains >0.2% were measured with minimal hysteresis at 0.05 Hz and $d_{33}$>700 pC/N at 25 kV/cm, surpassing the maximum reported properties for conventional PMN and PLZT at 1 Hz. Single crystals of the same composition, phase, and electrostrictive actuation character show up to 0.45% strain and maximum $d_{33}$~2000 pC/N at 35 kV/cm. Predominantly ferroelectric polycrystalline compositions with $d_{33}$~310 pC/N show actuation properties comparable to commercial PZT-8 ($d_{33}$~300 pC/N [34]).

Figure 2:
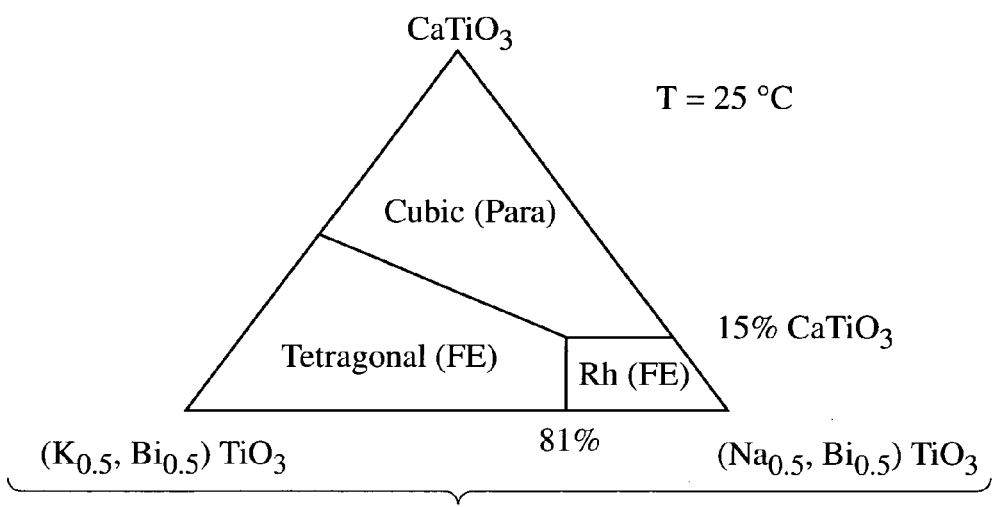
FIG. 2 is a schematic ternary phase diagram for the $CaTiO_3$—$(K_{1/2}Bi_{1/2})TiO_3$—$(Na_{1/2}Bi_{1/2})TiO_3$ system at 25° C.
Figure 3:
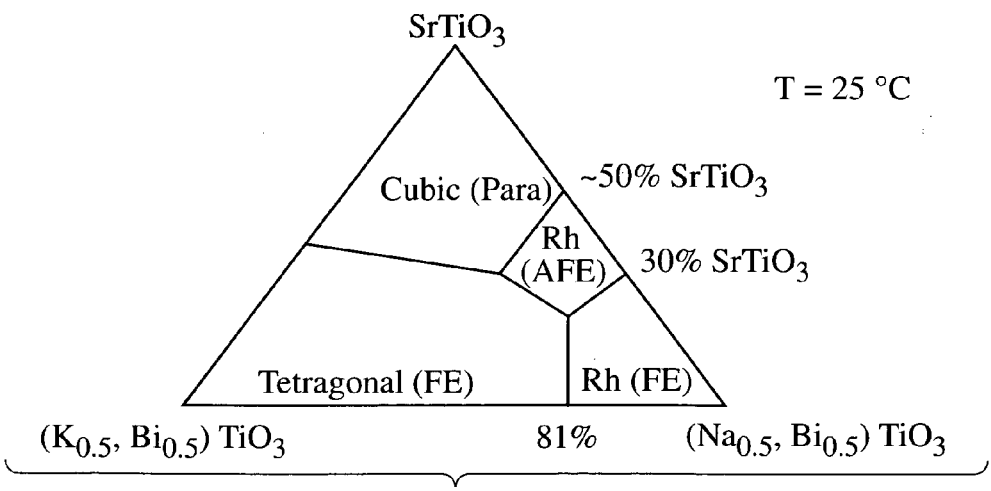
FIG. 3 is a schematic ternary phase diagram for the $SrTiO_3$—$(K_{1/2}Bi_{1/2})TiO_3$—$(Na_{1/2}Bi_{1/2})Tio_3$ system at 25° C.

According to the present invention, schematic phase stability diagrams for solid solutions of $(M_{1/2}Bi_{1/2})TiO_3$-M'TiO$_3$ are provided, where M is one or more of Na or K; and M' is Ba, Ca, Sr, Ba or Pb; and M" is Ti which exemplify the material of the invention. Schematic phase stability diagrams for a variety of M'TiO$_3$—$(K_{1/2},Bi_{1/2})TiO_3$—$(Na_{1/2},Bi_{1/2})TiO_3$ systems are shown in FIGS. 1–3. The Figures illustrate that a variety of morphotropic phase boundaries (MPB's) can be accessed in these solid solution systems.

Solid solutions of (Na, Bi)TiO$_3$—(K, Bi)TiO$_3$—BaTiO$_3$ (NBT-KBT-BT) and (Na, Bi)TiO$_3$—(K, Bi)TiO$_3$—PbTiO$_3$ (NBT-KBT-PT) are expected to exhibit stable tetragonal and rhombohedral ferroelectric phase fields at room temperature (see FIG. 1). KBT is a counterpart to NBT which is a tetragonal ferroelectric at room temperature. The MPB between these two compounds lies at approximately 81% NBT. The phase diagram also suggests a morphotropic phase boundary (MPB) between rhombohedral (ferroelectric) and tetragonal (ferroelectric) phases at approximately 6 molar % and 13.5 molar % of BaTiO$_3$ and PbTiO$_3$, respectively.

Thus, in one embodiment of the invention, an NBT-bKBT-cBT solid solution is provided in which b is in the range of about 15–22%; and/or c is in the range of 3 to 12% and preferably in the range of about 5–8%. The composition is adjusted within the stated range to obtain either the tetragonal or rhombohedral symmetry phase, as is desired.

In another embodiment of the invention, an NBT-bKBT-cPT solid solution is provided in which b is in the range of about 15–22%; and/or c is in the range of 12 to 20% and preferably in the range of about 12–15%. The composition is adjusted within the stated range to obtain either the tetragonal or rhombohedral symmetry phase, as is desired.

The (Na, Bi)TiO$_3$—(K, Bi)TiO$_3$—CaTiO$_3$ (NBT-KBT-CT) system shown in FIG. 2 differs from that for the NBT-KBT-BaTiO$_3$/PbTiO$_3$ system in that one endmember is cubic (paraelectric). The ternary phase diagram suggests that a three-phase morphotropic point joining the rhombohedral (ferroelectric), tetragonal (ferroelectric) and cubic (paraelectric) fields exists in this system. Compositions that are in the rhombohedral field, but near the morphotropic point, are of particular interest. Thus, in one embodiment of the invention, an NBT-bKBT-cCT solid solution is provided in which b is in the range of about 15–22%; and/or c is in the range of 12 to 20% and preferably in the range of about 13–18%. The composition is adjusted within the stated range to obtain either the tetragonal, cubic or rhombohedral symmetry phase, as is desired.

In the (Na, Bi)TiO$_3$—(K, Bi)TiO$_3$—SrTiO$_3$ (NBT-KBT-ST) system, a rhombohedral (antiferroelectric) phase exists at room temperature, leading to the phase diagram with four phase fields shown in FIG. 3. This system therefore also provides a rhombohedral (antiferroelectric) composition which can undergo a AFE-FE transition. Thus, in one embodiment of the invention, an NBT-bKBT-cST solid solution is provided in which b is in the range of about 15–22%; and/or c is in the range of about 12 to 35%.

It is readily apparent that the level of alkaline earth titanate and/or KBT in the solid solution may be varied to obtain preferentially the rhombohedral or tetrahedral phase material. Thus, solid solutions which are rich in KBT or NBT solid solutions heavily doped with Ba are amongst those which will exhibit a stable tetragonal ferroelectric phase at room temperature. Similarly, solid solutions which are rich in NBT, at the expense of KBT and/or BT or PT will demonstrate stable rhombohedral ferroelectric phases having a low hysteresis of actuation.

Thus, the proportion of alkaline earth dopant, M', may be selected with reference to the phase diagrams of FIGS. 1–3 to obtain a composition with a desired symmetry phase at or near a morphotropic phase boundary. In addition, one or more elements for M may be used and their relative proportions also may be selected to obtain a composition with a desired symmetry phase at or near a morphotropic phase boundary or point. Further, those elements known to substitute readily at the A- and B-sites of the perovskite lattice may be incorporated, the B-site being that cation site that is 6-fold coordinated by oxygen. In particular, aliovalent cations demonstrated to introduce vacancies in the A-sites of the lattice structure may be desired in some embodiments.

In those instances where the MPB or MPP is unknown, the method discussed herein below for predicting the MPB for the system may be used to identify suitable A-site and B-site dopants and their appropriate dopant levels.

Further provided in accordance with the invention is a recognition that for certain compositions in the family of compositions provided by the invention, near the morphotropic phase boundary, the actuation characteristics are of the character of a field-forced phase change between an antiferroelectric (AFE) and ferroelectric (FE) phase. This actuation mechanism is found to yield significant strain. The existence of an antiferroelectric phase near room temperature in this system is thus a particular discovery provided by the invention. The family and subclass of compositions as well as the prescribed actuation mechanisms and actuation properties provided by the invention thereby enable a range of actuation abilities and superior actuation performance.

Figure 13:
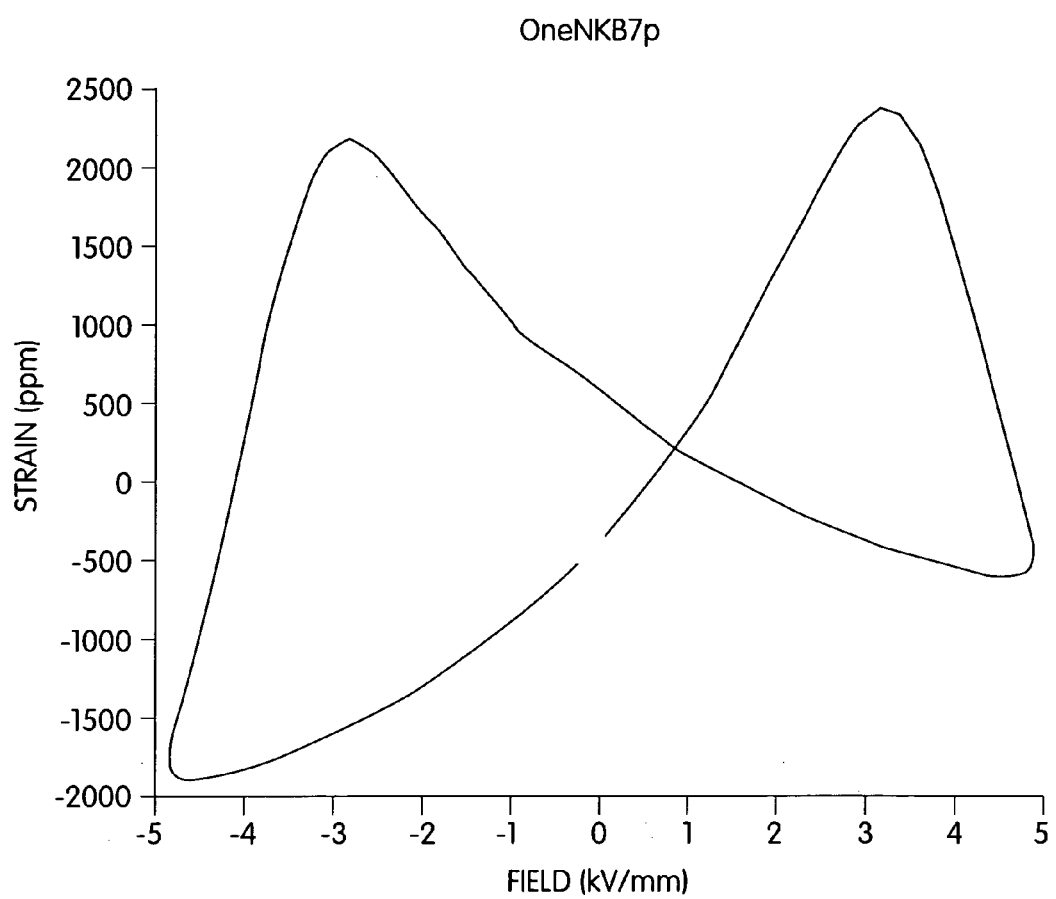
FIG. 13 is a graph of microstrain vs. field loops for Sample 3.

In accordance with the invention, there is provided a further defined subclass of compositions in the family of compositions, this subclass generally designated as single crystals of tetragonal phase. This subclass is found to attain superior actuation properties particularly when an electric field is applied in the ⟨001⟩ direction of the corresponding cubic phase. While the actuation can be hysteretic in nature, characteristic of a domain-switching piezoelectric, the strains attained may be particularly high. Numerous tetragonal phase NBT-BT and NBT-KBT-BT crystals were shown to have free strains of 0.2–0.4% at 30–40 kV/cm. Piezoelectric strain coefficients $d_{33}$ measured at lower field in these crystals were in the range of 150–500 pC/N. FIG. 13 illustrates the results for an NBT-KBT-BT tetragonal phase crystal exhibiting 0.4% strain.

Figure 4:
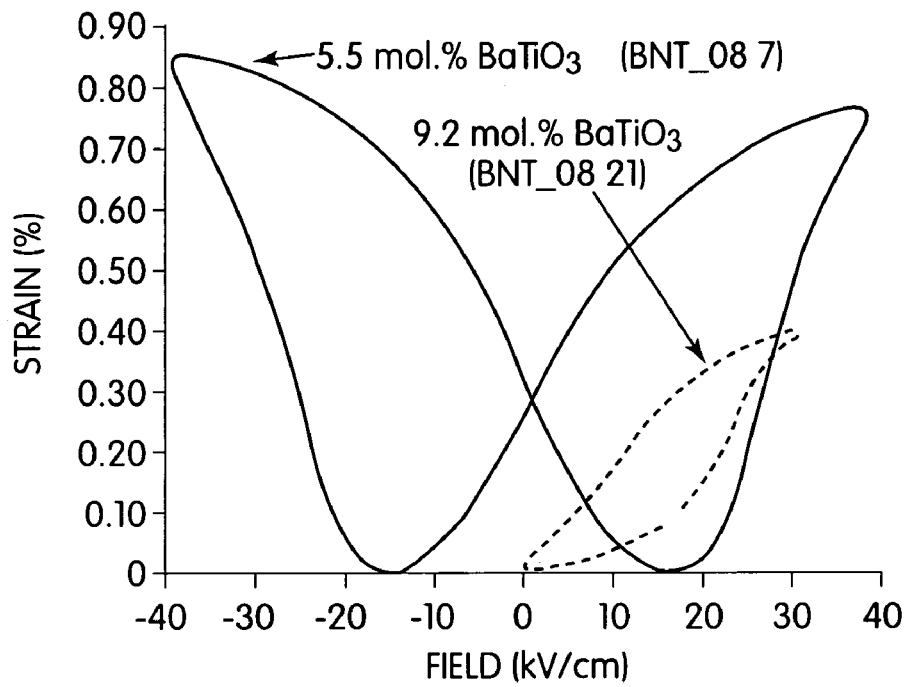
FIG. 4 is a graph of microstrain vs. field strength for tetragonal phase ferroelectric crystals actuated along pseudocubic ⟨100⟩ directions at room temperature.

In a particularly preferred embodiment, a tetragonal phase composition with a decreased concentration of the alkali metal ions relative to Bi is preferred. The alkali metal/Bi molar ratio is less than one and more preferably less than about 0.94 and the (alkali metal+alkaline earth metal+Bi)/Ti molar ratio is less than one and more preferably less than about 0.9. The embodiment is exemplified by a composition in the NBT-BT system with 5.82 molar % BT that exhibited an exceptionally high strain of 0.85% at 38 kV/cm as a tetragonal single crystal (FIG. 4). Testing at lower field, this crystal exhibited $d_{33}$=360 pC/N, showing, that the majority of the actuation strain results from domain switching, consistent with the hysteretic strain loop.

Figure 21:
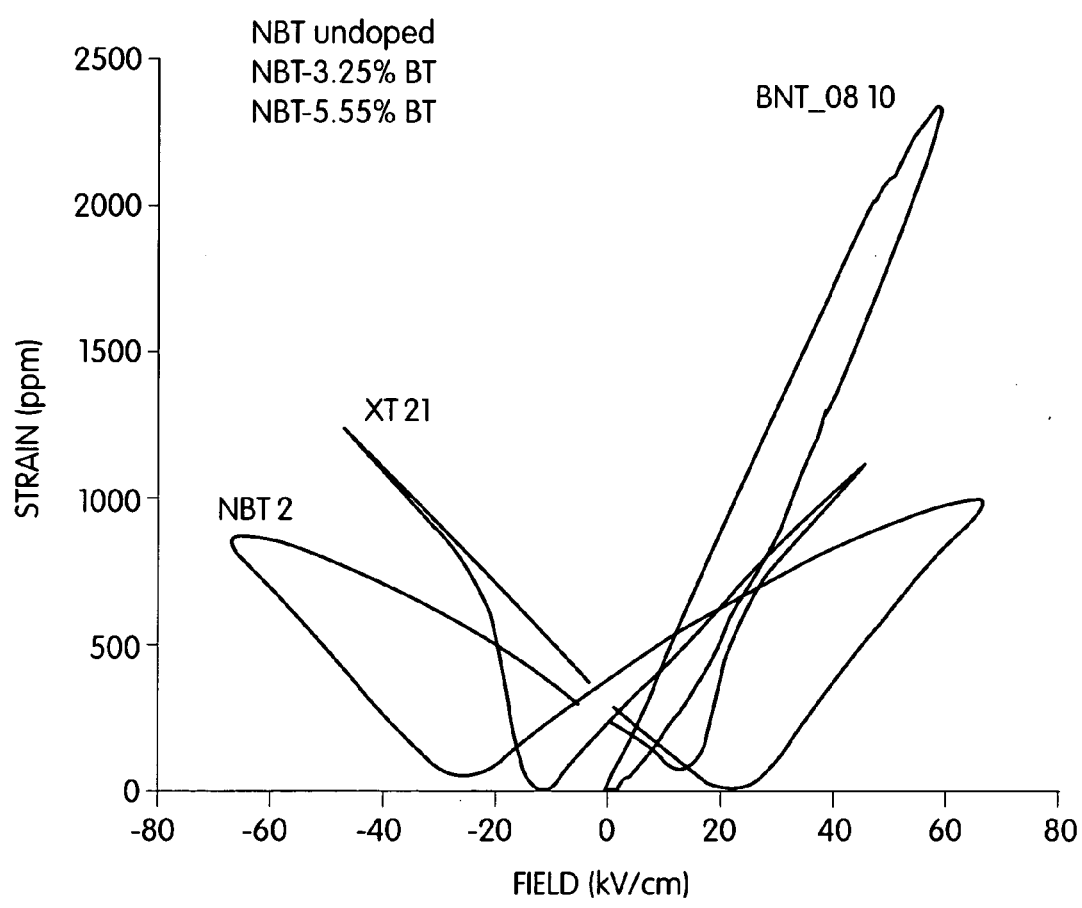
FIG. 21 is a plot of microstrain vs. electric field for rhombohedral single crystals after poling.

A useful figure of merit for electrochemical actuation is the actuation energy density, given by ½∈$_{max}^2$E$_\rho$, where ∈$_{max}$ is the maximum strain, ρ is the crystal density and E is Young's Modulus. The present materials have a lower density than the PZTs and PMNs (~6 g/cm$^3$ vs. 7.5–8.5 g/cm$^3$) and higher elastic moduli (polycrystal Young's modulus of 100–110 Gpa vs. 60–70 Gpa in PZTs). The single crystal elastic modulus for NBT has not been measured, but results for the high strain rhombohedral PZN-PT crystals show a factor of 8 reduction in E in the (001) direction. Assuming a similar reduction relative to the polycrystalline modulus for both the tetragonal and rhombohedral phases of NBT-BT, the high strain tetragonal single crystal of FIG. 4 possesses about 11 times the actuation energy of commercial PZT 5H (75 J/kg vs. 6.8 J/kg) and the near-MPB rhombohedral single crystal of FIG. 21 is approximately 1.4 times the actuation energy density of the polycrystalline PMN (6 J/kg vs. 4.2 J/kg), demonstrating the utility of the invention.

Figure 5:
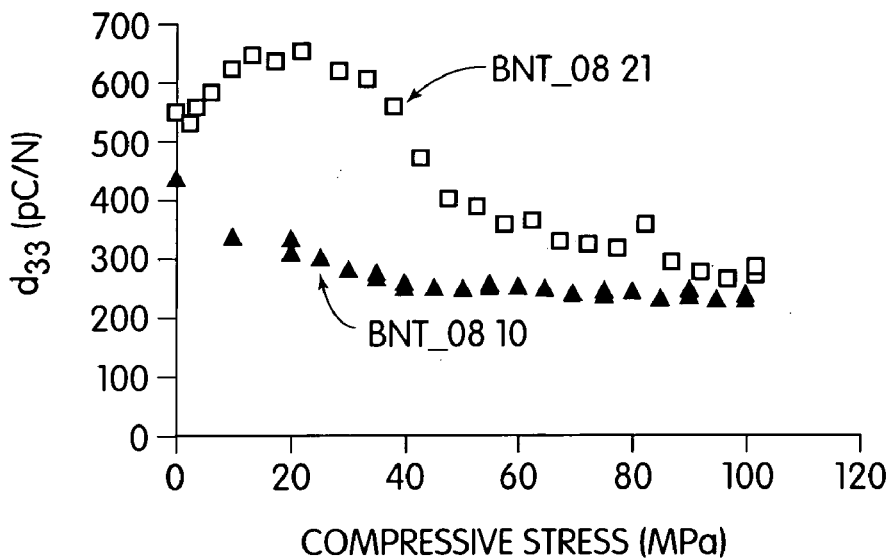
FIG. 5 is a graph of high-field $d_{33}$ for rhombohedral and tetragonal crystals vs. uniaxial compressive strength, measured from the slope of the linear strain vs. field relationship at 20 kV/cm ac field with a 30 kV/cm dc bias.

Testing under load furthermore revealed that the present crystals retain significant actuation capability to quite high stresses. FIG. 5 shows the high-field d$_{33}$ for rhombohedral and tetragonal crystals vs. uniaxial compressive strength, measured from the slope of the linear strain vs. field relationship at 20 kV/cm ac field with a 30 kV/cm dc bias. The d$_{33}$ decrease to 60% of their initial value by about 40 Mpa, but then remain relatively constant to 100 Mpa. The decrease with stress is less than that observed in polycrystalline PZTs. Combined with higher hardness and 2–3 times higher mechanical strength in polycrystalline NBTs compared to lead perovskites, this class of single crystal piezoelectrics demonstrates improved mechanical reliability as well as useful actuation properties.

Single crystal x-ray and electron diffraction data of the NBT-BT show systematic reflections of an ordered perovskite cell. Although not bound by any particular interpretation, the diffraction experiments show that even substantially nonstoichiometric compositions embodied by the invention have the perovskite structure.

Still further provided in accordance with the invention, is a further defined subclass generally designated as single crystals fibers. These are exemplified by Na$_{1/2}$Bi$_{1/2}$TiO$_3$—BaTiO$_3$ solid solutions with between 5% and about 10% BaTiO$_3$, or by (Na$_{1/2}$Bi$_{1/2}$)$_{1-x}$Ba$_x$(Ti$_{1-y}$Zr$_y$)O$_3$ compositions in which x is between 0.01 and 0.2 and y is between 0.01 and 0.1. Single crystals fibers can be grown directly from the melt by methods such as Czochralski growth or Edge-defined Film-fed Growth (EFG) in these compositions because the crystal composition melts congruently.

Low Hysteresis Tetragonal Phase Single Crystal or Oriented Polycrystalline Actuators.

Prior art investigation into the piezoelectric properties of various single crystal perovskite materials have focused on single crystals with rhombohedral phase symmetry. Interest in the rhombohedral phase persists because it has been demonstrated to exhibit high actuation strain in the PMT-PT and PZN-PT systems. However, only a limited number of perovskites crystallize in this symmetry near room temperature. Many more perovskites of tetragonal phase symmetry are known.

According to the present invention, a single crystal tetragonal ferroelectric perovskite is used as a high strain actuator having low hysteresis. The present invention has recognized that both the phase symmetry and the direction of actuation are relevant to the shape of the hysteresis curves. Prior art single crystal piezoelectrics, such as PMN-PT, had demonstrated low hysteresis only in the rhombohedral phase and it was not expected that the tetragonal phase could also show low hysteresis.

It was only in the present invention that it was recognized that a tetragonal ferroelectric actuated out of its spontaneous polarization direction (⟨001⟩ with respect to the tetragonal axes) may have low hysteresis actuation. In particular, the ⟨110⟩ and ⟨111⟩ directions are understood to be low hysteresis directions. For example, in the composition systems discussed above, solid solutions which are rich in KBT or NBT solid solutions heavily doped with Ba are amongst those which will exhibit a stable tetragonal ferroelectric phase at room temperature.

High strain actuation of tetragonal crystals when actuated out of its spontaneous polarization direction is not limited to the compositions described hereinabove. Other tetragonal perovskites, such as BaTiO$_3$, PbTiO$_3$ and solid solutions based on these perovskites, can also show useful piezoelectric properties as an oriented single crystal or textured polycrystal when actuated according to the method of the invention.

Of course, with reference to the discussion above with respect to high strain compositions, it is possible to obtain a composition with both high strain and low hysteresis using the compositions of the invention.

Co-Doped Systems Demonstrating Electromechanical Properties.

Thus another aspect of the present invention is relaxor compositions giving exceptionally high electromechanical actuation of the electrostrictive type, or a mixture of electrostrictive and piezoelectric actuation, or a mixture of electrostrictive and field-forced phase change actuation, or any mixture of these types of electromechanical actuation. The specific compositions tested have been in the Ba+Zr codoped NBT group. However, the invention is not limited to this group. For example, codoping with Ba+Hf, Pb+Zr, or Pb+Hf yields similar benefits.

The compositions have been demonstrated to exhibit improved electromechanical actuation in single crystals and polycrystalline sintered samples. Thus the invention comprises both single crystals (which may be oriented) and polycrystalline materials of the specified compositions. The enhanced relaxor character allows new applications such as high dielectric constant lead-free dielectrics usable near room temperature, and polycrystalline and single crystal electrostrictive actuators.

In the foregoing description, it was recognized that cation nonstoichiometry improves electromechanical actuation in the compositions of the invention. This cation nonstoichiometry can also take on the form of multivalent Bi$^{3+}$/Bi$^{5+}$. If Bi$^{5+}$ is present, it predominantly occupies the B-sites of the perovskite structure. Therefore, Bi is included as a constituent M″ in the compositions previously specified.

Selection of Appropriate A-Site and B-Site Dopants.

The foregoing description reported on the optimization of electromechanical actuation and transduction properties at compositions near the MPB of various perovskite solid solutions. Various A-site and B-site dopants are reported to provide compositions with improved properties, for example, large piezoelectric strain coefficients and large strains. The ability to predict the MPB for doped compounds is aided by detailed phase diagrams, however, these are not always available.

A system is provided for identifying MPB compositions for various A- and B-site dopings within a known system. The invention provides a simple method of forecasting which cation substitutions in perovskite ferroelectrics will provide phases of desired symmetries. At the MPB between multiple such phases, at least one of which is ferroelectric, enhanced actuation is often found. For low level A- and B-site substitutions, the invention identifies the approximate composition range within which the piezoelectric properties will be optimized if the location of the MPB is known for low-level dopings of other cations in the prototype composition.

In one aspect of the invention, a stoichiometric perovksite composition is provided corresponding to the morphotropic phase boundary (MPB) composition as calculated using the relative tolerance factor concept using a self-consistent set of ionic radii. In the case of a cation or anion deficiency being present due to charge compensation, the radius of an A-site vacancy is taken to be equal to that of the largest A-site cation present, the radius of the B-site vacancy is taken to be equal to that of the largest B-site cation present, and the radius of the oxygen vacancy is taken to be equal to that of O(2-).

In a preferred embodiment of the invention, in cation-doped compositions containing predominantly NBT, $0.975<t<0.978$ identifies the location of the MPB.

The concentration of each element may vary by ±5%, or ±10%, or ±15%, or ±20%, or ±25% or up to ±30%, of its absolute value as determined by the relative tolerance factor-range of the MPB.

As noted above, the ideal cubic peroskite structure (ABO$_3$) is composed of atoms in the following positions: A-site cation at 0 0 0; B-site cation at ½ ½ ½; oxygen (anion) in ½ ½ 0, ½ 0 ½, 0 ½ ½. the A and B cations have coordination numbers (CNs) of 12 and 6, respectively. Goldschmidt (*Akad. Oslo I. Mat.-natur.* 2:7 (1926)) gives a relationship that defines the allowable limits of distortions in interatomic distance if the perovskite structure is to be maintained. This relationship $$t = \frac{(R_A + R_O)}{\sqrt{2}\,(R_B + R_O)}$$

is known as the tolerance factor, t, and is defined as:

where $R_A$=average A-site cation radius, $R_B$=average B-site cation radius, and $R_O$=average O-site cation radius. Deviations from t=1 represent distortions from the ideal cubic perovskite structure. The stability range is approximately $0.75<t<1.06$, with ferroelectric behavior generally associated with t>1. The tolerance factor can be a useful guide to the structure of ABO$_3$ perovskites.

The Goldschmidt tolerance factor has its limitations, however. The tolerance factor is a simplified model, assuming purely ionic bonds and rigid-sphere ions. Even in ideal perovskite structures, however, the cations and anions show some degree of overlap or covalency. According to Fukunaga and Fujita, *J. Solid State Chem.* 8:331 (1973), overlap constitutes approximately 2–3% of the ionic radius sum. There is also some error associated with the reported ionic radii due to the fact that effective ionic radius is not constant between all crystals. The data set is also incomplete for certain ions. For example, the CN 12 radius of Bi$^{3+}$ is not available, although an estimate based on CN 8 data can be used. There is an added complication when this simplified model is applied to the more complicated system of solid solutions. Thus, the relationship breaks down at a certain point for comparisons between systems with high doping levels, e.g., >50%, such that the A- and B-site cations are no longer the majority components.

While absolute value of the tolerance factor in more complicated systems may not be a useful indicator for the stability of any arbitrary composition, the relative tolerance factor between different solid solutions within a base system is a valuable guide to its structure. The error entering a tolerance factor calculation through approximated ionic radii is systematic and therefore has a negligible effect on the relative tolerance factor (as long as doping concentrations remain low, i.e., less than 50% doping, and preferably less than 25%). According to the invention, the t of a known MPB composition can be correlated with the tolerance factors for different cation dopant levels within the same base system. The calculated relative t of the doped systems provide an indication of the MPB composition range in the doped solid solutions.

Figure 31:
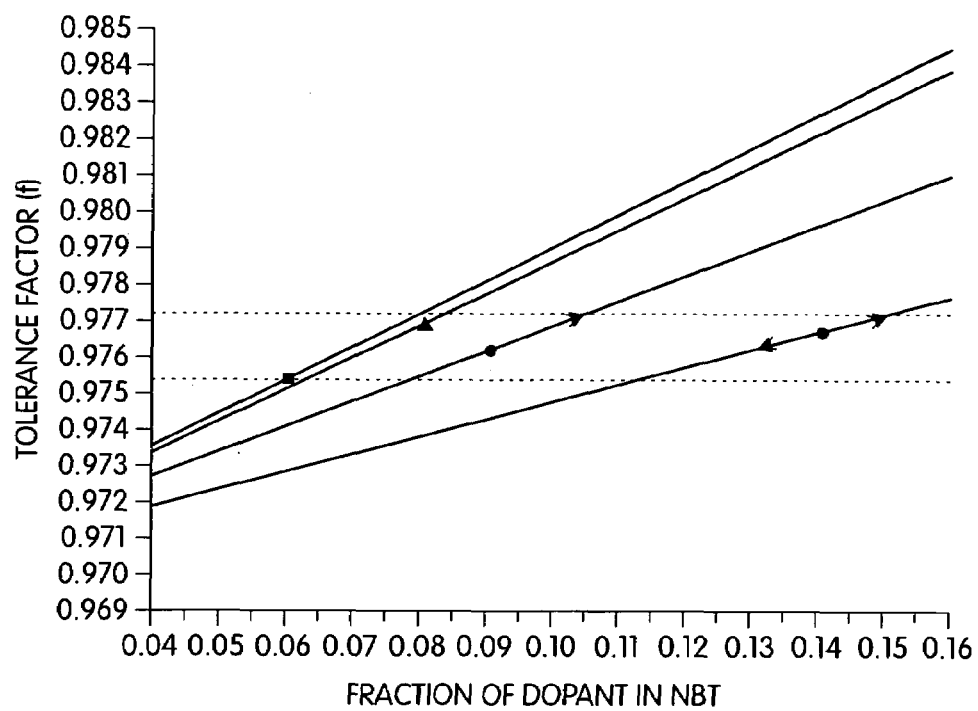
FIG. 31 is a plot of tolerance factor vs. fraction of dopant in a NBT system for known MPB compositions.
Figure 32:
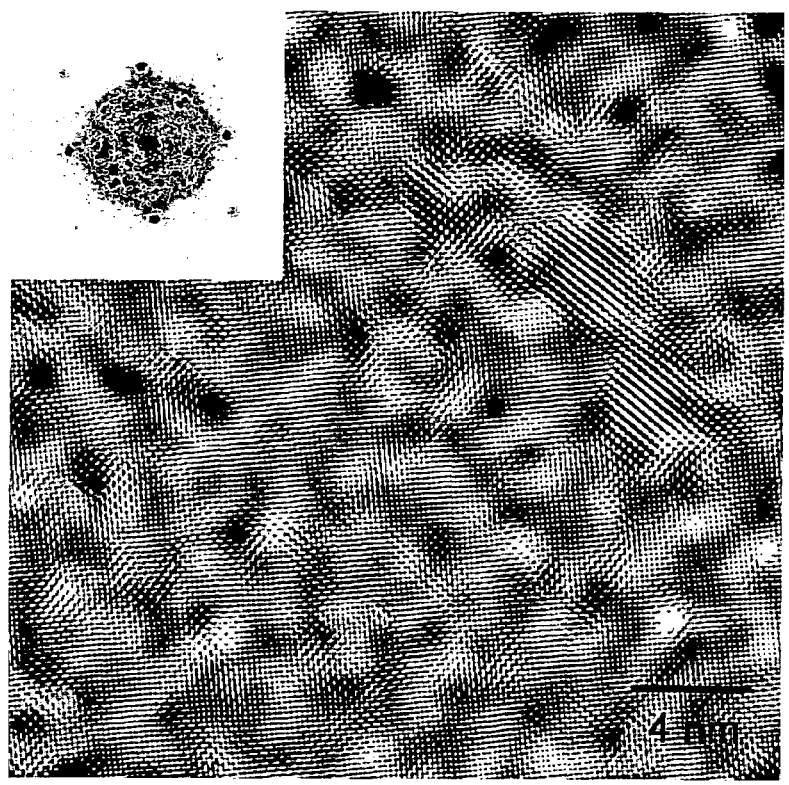
FIG. 32 is a Fourier-filtered transmission electron micrograph demonstrating nanodomains in a (Ba+Zr) co-doped NBT.

The relative t factors for MPB compositions in various solid solutions of the NBT-based system lie within a narrow range. As shown in FIG. 31, the MPB represents a field of two-phase coexistence, with the rhombohedral phase to its left and the tetragonal phase to its right. Arrows indicate the range of the MPB composition. Additions of a large B-cation relative to the A-cation stabilizes the rhombohedral phase (t decreases). Where the A-cation is made larger with respect to the B-cation, the tetragonal phase is stabilized (t increases).

Thus the method provides for identification of compositions near the morphotropic phase boundary (MPB) between two phases of different crystal symmetry in doped perovskite systems, e.g., Na$_{1/2}$Bi$_{1/2}$TiO$_3$ (NBT). The composition is determined using the relative tolerance factor, as defined herein, and self-consistent sets of ionic radii. The identity and concentrations of these dopants are selected so as to obtain a relative tolerance factor "t" that is within a specified range. The tolerance factor is dependent on the values of ionic radii used; tabulated values such as those by Shannon (*Acta Cryst.* A32:751 (1976)) are used here and calculated for a selected relative size and concentration of the dopants on the 12-fold coordinated "A"site and 6-fold coordinated "B" site of the perovskite structure.

According to one aspect of the invention, the following method is provided: choose new cation-dopants for a known base-system; calculate the values for t for a range of dopant fractions; and then compare the new t values to the characteristic MPB tolerance factors-range for the system. For example, in compositions containing predominantly NBT, $0.975<t<0.978$ identifies the location of the MPB (FIG. 31). As a test of this method, NBT doped with Ba on the A-site and Zr on the B-site have been grown in single crystal form and as sintered polycrystalline samples. X-ray diffraction of a wide range of Ba+Zr codoped compositions has shown that the method successfully predicts the MPB. The MPB between two ferroelectric phases is known to often have superior electromechanical properties compared to those away from the MPB. Thus one aspect of the present invention is the ability to predict useful compositions using the relative tolerance factor approach.

The following table lists the cations that are likely to be useful as A-site and B-site dopants along with ionic radius (Shannon (1976)) and polarizability data (Shannon, *J. Appl. Phys.* 73:348 (1993)), where available.

TABLE

| A-Site Cations | Ionic Radius (CN12) ($10^{-10}$ m) | Ion Polarizability ($Å^3$) |
|---|---|---|
| Bi(+3) | 1.31 | 6.12 |
| La(+3) | 1.36 | 6.07 |
| Na(+1) | 1.39 | 1.8 |
| Eu(+2) | 1.40 | 4.83 |
| Sr(+2) | 1.44 | 4.24 |
| Pb(+2) | 1.49 | 6.58 |
| Ba(+2) | 1.61 | 6.4 |
| K(+1) | 1.64 | 3.83 |
| Rb(+1) | 1.72 | 5.29 |
| Cs(+1) | 1.88 | 7.43 |

| B-Site Cations | Ionic Radius (CN6) ($10^{-10}$ m) | Ion Polarizability ($Å^3$) |
|---|---|---|
| Mn(+3) | 0.58 | n.a. |
| Ti(+4) | 0.605 | 2.93 |
| Nb(+5) | 0.64 | 3.97 |
| Ta(+5) | 0.64 | 4.73 |
| Sn(+4) | 0.69 | 2.83 |
| Hf(+4) | 0.71 | n.a. |
| Zr(+4) | 0.72 | 3.25 |
| Zn(+2) | 0.74 | 2.04 |
| Sc(+3) | 0.745 | 2.81 |
| Ce(+4) | 0.87 | 3.94 |
| Bi(+5) | 0.76 | n.a. |

| Anion | Ionic Radius (CN6) ($10^{-10}$ m) | Ion Polarizability ($Å^3$) |
|---|---|---|
| O(2−) | 1.40 | 2.01 |

However, it is not necessary for compositions to fall precisely at the MPB to obtain superior materials performance. It has also been recognized that by doping the A- and B-sites simultaneously with cations larger in size and higher in ion polarizability than those present in the undoped base-system, the Curie temperature of the perovskite is lowered. This stabilizes the higher temperature relaxor or nanopolar phase to room temperature. For example, in the NBT system (in which the effective A-site radius is the average of that of $Na^{1+}$ and $Bi^{3+}$) the Ba+Zr doped composition exhibits strong nanopolar phases (FIG. 33). In this relaxor material, which can be of rhombohedral or tetragonal macrosymmetry, electromechanical actuation via the mechanism known as electrostriction is particularly strong. In both the single crystals and polycrystals of Ba+Zr codoped NBT, improvements in electromechanical actuation compared to previously known materials have been found. The compositions studied have the dielectric properties of a relaxor ferroelectric near room temperature, and the electromechanical actuation characteristics of an electrostrictive material near room temperature. The above observation is consistent with the preliminary correlations observed between tolerance factors and ion polarizability in that larger ions are typically of higher atomic number and therefore also of higher ion polarizability.

Solid solutions $(Na_{1/2}Bi_{1/2})_{1-x}Ba_x(Ti_{1-y}Zr_y)O_3$ have been prepared in which x and y were systematically varied and shown to behave in a manner consistent with the approach described herein. An increase in y allows a simultaneous increase in x, that is, the Ba doping can be higher, while retaining a constant tolerance factor. This approach allows us to obtain more highly doped NBTs than is possible in the simple solid solution approaches that others have tried. By doping more highly in Ba on the A-site without changing the tolerance factor enough to greatly stabilize the tetragonal phase (i.e., causing a larger change in c/a ratio), we are able to produce higher doping and more disorder on the A-site resulting in enhanced relaxor character compared to previous doping schemes.

Method of Preparing Actuator Devices.

An aspect of this invention is based upon the discovery that crystals in the NBT-BT system tend to grow as small cubes, much like table salt (NaCl). These cubes have {100} faces. The cube shape appears to be the Wulff shape of the crystal, i.e., the shape which is preferred in order to minimize the surface energy of the crystal. According to the invention, a crystallographically oriented (textured) array which takes advantage of the inherent crystalline anisotropy in properties such as dielectric constant and piezoelectric strain is made by utilizing the growth morphology of single crystals. The methods take advantage of the fact that certain perovskite piezoelectrics, can be grown as faceted crystals which expose certain crystal planes (the Wulff shape of the crystal).

One example is the aforementioned NBT and KBT solid solutions, which can be grown as cube-shaped crystals much like rock salt. Thus, each flat surface is an {001} orientation of the high temperature cubic phase. Another example occurs with an octahedral shaped crystal in a cubic system, in which each face is a {111} plane. Alignment of the preferentially exposed planes of a number of crystallites against a surface of edge results in the achievement of a common crystallographic orientation in all the crystallites.

The invention consists of the steps of (1) growing crystals or crystallites under conditions which allow them to express a faceted morphology; and (2) aligning a set of facets and/or edges which is common to all of the crystals or crystallites against a surface or edge, thereby resulting in a crystallographically textured array of crystals.

The invention also provides electromechanical actuators which take advantage of the anisotropic piezoelectric strain, strain coefficient $d_{33}$, and/or electromechanical coupling factor $k_{33}$ of the single crystal. It can also be used to obtain high dielectric permittivity in systems where the dielectric properties are highly anisotropic or to take advantage of other highly directional crystal properties such as magnetic or optical properties.

For the specific application of electromechanical actuators, it is advantageous to have the high specific actuation properties of a single crystal piezoelectric actuator in a robust and easily manufactured actuator design. According to the present invention, this is done by using smaller, more easily grown crystallites and orienting these crystallites so that they share a common crystal direction (uniaxial texture) or more than one crystal direction (e.g., biaxial texture). For the purposes of this application, "texture" is defined as that condition where in an X-ray pole figure or rocking curve, the full-width-at-half-maximum for the reflection corresponding to the pole or crystal axis in question has an angular breadth of less than 20°. The texturing of the crystallite assembly allows the single crystal actuation properties to be used without the need to grow, orient and cut large single crystals. This texturing approach may be used with any piezoelectric actuator composition which can be grown or otherwise prepared as faceted crystallites. The reduction in the size of the crystals necessary to fabricate an actuator not only makes processing easier, it also improves the mechanical robustness of the actuator. It is well-known from the theory of brittle fracture (Griffith theory) that the probability of finding a flaw of a certain size within a body increases with its volume. Furthermore, by using an array of crystallites, the fracture of one crystallite does not cause failure of the entire actuator, unlike what can happen with single crystals. Therefore, reducing the size of the crystallites according to the present invention mitigates against catastrophic failure of the actuator.

An actuator composed of many crystallites can have nearly the same piezoelectric constants as a single crystal actuator. Such an array of oriented crystallites can also be combined with a polymer matrix or ceramic or metal reinforcements to improve the overall actuation or dielectric constant or mechanical properties.

One embodiment of the present invention uses perovskite crystals which a cubic shape such that each face is a {100} plane of the corresponding cubic phase. Using a perovskite of rhombohedral crystal symmetry at the actuation temperature, the assembly of crystals is actuated in the ⟨100⟩ direction of the corresponding cubic phase by aligning the crystals so that at least one {100} face of each crystal is co-planar with the others.

In another embodiment, a crystal which is cubic at the growth temperature and tetragonal at the use temperature grows with a cube morphology and is aligned in the same way. In this instance, the assemblage of crystals behaves as a domain switching ferroelectric, since a strong electric field applied normal to the common {100} plane (alignment plane) poles each crystal by domain reorientation. When the field direction is switched, the ferroelectric polarization of the crystal is switched through domain wall motion. This actuator has increased actuation performance relative to a polycrystalline compact of the same composition and phase in which the gains have a random crystallographic orientation with respect to one another.

In yet another embodiment, the crystal symmetry at the actuation temperature is tetragonal and the crystal is grown with an octahedral crystal morphology, exposing the {111} planes of the corresponding cubic phase. Alignment of the common {111} faces of the crystals allows actuation out of the spontaneous polarization direction {100}. We note that in previously reported PMN-PT and PZN-PT single crystal actuators, the crystal shapes do not lend themselves to the methods of this invention. PZN-PT and PMN-PT crystals grew in a complex, non-symmetric "arrowhead" shape with a variety of crystal faces appearing on any given crystallite, thereby teaching away from the present invention. Nonetheless, by controlling the crystal growth, shape and rate, we have succeeded in achieving textured polycrystals in these systems as well, as is demonstrated in Example 9.

According to the invention, either cubic or octahedral Wulff shapes are grown from a perovskite compound at high temperature by controlling the composition, flux composition, temperature and cooling rate. The crystal morphology can be determined by the equilibrium interfacial energies, with a cubic morphology growing when the {100} faces have the lowest energy. The crystal shape can also be determined by the rate of growth of particular crystal planes (growth rate anisotropy) in addition to surface energy anisotropy.

Additional embodiments of the present invention represent different methods by which large numbers of faceted crystals can be grown, harvested and oriented into a textured array.

In one embodiment, the crystallites are nucleated randomly in a flux which may be constituents of the crystal composition (self flux) or which includes another component which is not substantially incorporated into the crystal during growth (solvent flux). By adjusting the composition, amount of flux and growth conditions (temperature, cooling rate), crystallites are grown such that they do not substantially impinge upon one another. Unimpeded growth is important to the formation of free single crystals of similar morphology. The flux in which the crystals are embedded is subsequently to be removed by chemical etching, leaving behind the crystallites. Alternatively, the crystallites are removed from the flux while it is liquid, using for example a mesh. The crystals are then classified according to size and assembled into an actuator structure by orientation processes described later.

In another method of the invention, previously grown crystals are crushed and sized to achieve a common starting crystallite size. These serve as seeds for further crystal growth. The seed crystals are immersed in a flux as described above in which they coarsen until they are of a desirable size. They are then removed from the flux by chemical etching or sieving the fluid flux.

Alternatively, the crystals may be obtained by vapor phase growth of the crystals on a surface. It has further been observed that the perovskite NBT crystals tend to cleave along their {100} planes. This tendency may be used to produce orientable crystallites by fracturing larger crystals to expose the {100} faces of the high temperature, cubic polymorph material. Comminution of crystals, whether they are initially faceted or not, results in small crystals with predominantly {100} fracture surfaces. These surfaces are then aligned by one of the processes described herein to obtain a textured array.

A method of orienting the crystallites, into a textured array is described with reference to FIG. 6. The crystallites are sized so that the majority of the crystals are at least as large in diameter as the desired final thickness of the actuator. The crystallites are then settled onto a flat surface, for instance by shaking a collection of dry crystals, or by using the capillary action of a liquid that wets the surface of the crystals and the orientation surface and draws the two together. This liquid is then removed by evaporation. The flat surface can be a working surface for processing alone, or can serve as an electrode of the final composite actuator. The oriented crystallite array is then further processed to obtain an actuator. In one embodiment, it is sintered at high temperature to bond the crystals together, with or without a sintering liquid phase. In another embodiment, it is infiltrated with a polymer such as epoxy. After the crystallites are bonded to one another, the electroding surface is ground down to expose the majority of the crystallites, as indicated by the arrow in FIG. 6. A top electrode is applied to the ground surface. This process results in a uniaxial alignment of the crystallites with a common orientation normal to the orientation surface.

Biaxial alignment is desirable in many instances. Biaxial alignment is defined by having the crystallites oriented with such close alignment not only normal to the plane of the surface, but also within the surface. With reference to FIG. 7, such alignment can be obtained by settling the crystallites against a reference edge as well as a surface e.g., shaking on an incline, or by using capillary forces from a liquid that wets the crystallites to draw them together. Supplying a capillary force between adjacent crystallites, for instance with a wetting liquid, assists in achieving biaxial texture by drawing the faceted faces of adjacent crystallites into contact. The assembly of biaxially aligned crystals is then further processed to obtain an actuator as described above.

The crystallites may be aligned while in the growth flux medium, e.g., an in situ alignment. During growth of the crystallites as described hereinabove, the crystallites may be allowed to either float up (low density) or sink down (high density) by choosing a flux that is either denser than or less dense than the crystals. A flat surface, which can be the flat surface of the flux liquid itself or the surface between the growth container and the flux, or a separate solid material, is placed either at the top or bottom of the melt to serve as the orientation surface. The crystals travel by gravitational force or buoyancy or convection through the flux and settle in an oriented array against the orientation surface after which they can be removed. The orientation surface, if it is a metal suitable for use as an electrode, can be left in place as the electrode of the final actuator assembly.

In yet another alternative embodiment, a high electric field may be used to orient the crystals. The method of the invention is adaptable to the prior art systems for PZN-PT and PMN-PT. As is demonstrated in the examples which follow, the crystal growth method described herein may be used to obtain textured crystallites.

The invention is illustrated in the following examples, which are non-limiting of the scope of the invention, the full scope of which is set out in the claims which follow.

EXAMPLE 1

Single Crystal Growth in the System $Na_{(1/2)}Bi_{(1/2)}TiO_3$—$BaTiO_3$

A powder mixture of the target composition $(0.94)Na_{(1/2)}Bi_{(1/2)}TiO_3$-$(0.06)BaTiO_3$ was prepared, with wt % each of $Na_2CO_3$ and $Bi_2O_3$ being added in excess in order to form a liquid flux. The powder mixture was prepared from the following starting materials in the following amount

| Compound | Manufacturer | Amount (g) | Comment |
|---|---|---|---|
| $Bi_2O_3$ | Morton Thiokol | 102.3408 | 20 wt % excess of the component |
| $Na_2CO_3$ | MCB Reaoents | 23.2764 | 20 wt % excess of the component |
| $TiO_3$ | NanoTek | 58.4750 | |
| $BaTiO_3$ | Morton Thiokol | 10.8980 | |

The powders were ball-milled in a 1000 mL polypropylene bottle containing 50% by volume of zirconia milling media and ~350 mL ethanol for ~12 hours at a rolling speed of 120 rpm. The mixed powder was dried with a heating lamp, then ground in a mortar and pestle, then placed in an alumina crucible (100 mL) with a cover and calcined in air according to the following heating schedule: 8 hour ramp from room temperature to 800° C., hold for 2 hours, furnace-cool to 20° C. with power off. A Thermolyne 47900 furnace was used. The powder was removed from the crucible and ground in a mortar and pestle, then placed in a 100 mL platinum crucible, covered with a platinum lid and then placed within a 250 mL alumina crucible and covered with an alumina lid. The sample was placed in a Lindberg/Blue M 1700° furnace and fired according to the following crystal growth schedule: 13.5 hour ramp from room temperature to 1350° C., hold for 5 hours, 120 hour cool to 750° C., furnace cool to 25° C.

Within the Pt crucible, more than 50 single crystals varying in size from 1 mm to >10 mm were observed, embedded in crystallized orange-yellow flux. The flux was dissolved by filling the crucible with concentrated hydrochloric acid and allowing the mixture to sit overnight. The acid was then rinsed from the crystals with water. It was subsequently found that nitric acid works to dissolve the flux as well. The crystals were removed from the crystals, separated, and placed again in concentrated hydrochloric acid to remove the residual flux.

On the platinum lid of the crucible, several crystals growing with a cubic shape were observed, showing that faceted crystals of this compound can be grown by vapor phase transport to a seeding surface, as described above.

The crystals embedded within the crystallized flux were observed to grow with a cubic habit. Larger crystals of 6–10 mm diameter and exhibiting a clear {100} or cube face were sliced parallel to that face using a diamond wafering saw. Both sides of the resulting single crystal plates were polished with successively finer diamond paste to a thickness of ~1 mm thickness and a final grit site of 1 μm.

For testing, colloidal silver paint electrodes were applied with a brush to both of the faces of cut and polished crystals. Dielectric constant measurements were performed on an HP 4194A impedance analyzer at 1 kHz and 10 kHz frequencies. Piezoelectric strain and piezoelectric strain coefficient ($d_{33}$) were measured using a laser interferometer apparatus while applying high voltage to the sample (up to 20 kV) at a low frequency (1 Hz).

Results for Rhombohedral $BaTiO_3$ doped NBT. Sample 1 was a crystal polished to a thickness of 1.098 mm. The composition was analyzed by electron microprobe microanalysis (EMPA), giving the following results:

| | Na | Bi | Ti | Ba | 0 |
|---|---|---|---|---|---|
| Nominal Composition | 0.470 | 0.470 | 1.000 | 0.060 | 3.000 |
| Sample 1 | 0.459 | 0.486 | 1.042 | 0.032 | 2.981 |

Thus the sample contains a lower Ba concentration than the overall batch composition. This places the composition clearly within the rhombohedral stability field. X-ray diffraction of the (100) face of the crystal showed that it was single crystalline, and also showed no splitting of the (100) and (200) peaks of the corresponding cubic phase. This shows that the sample is not so highly doped with Ba as to be of tetragonal symmetry.

Figure 8:
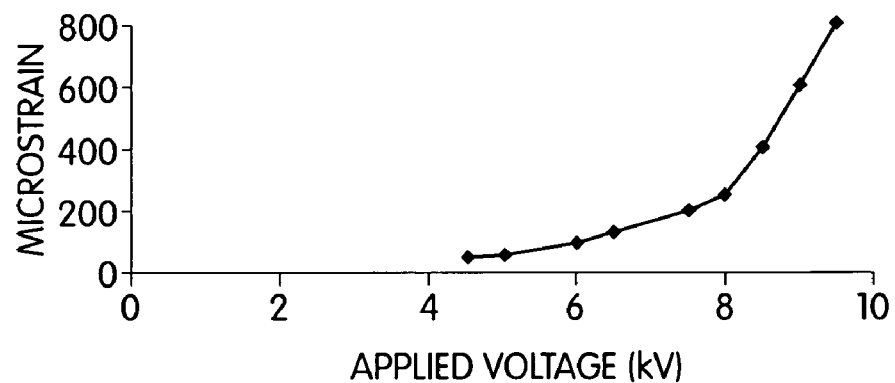
FIG. 8 is a graph of microstrain vs. applied voltage for sample 1 before poling.

The capacitance, measured at 1 kHz, was 197.8 pF. The sample was placed in the strain testing apparatus (clamped in the longitudinal direction and immersed in silicone oil bath to prevent arcing). The sample was first tested before poling. FIG. 8 shows the strain vs. the applied voltage measured at room temperature.

Figure 9:
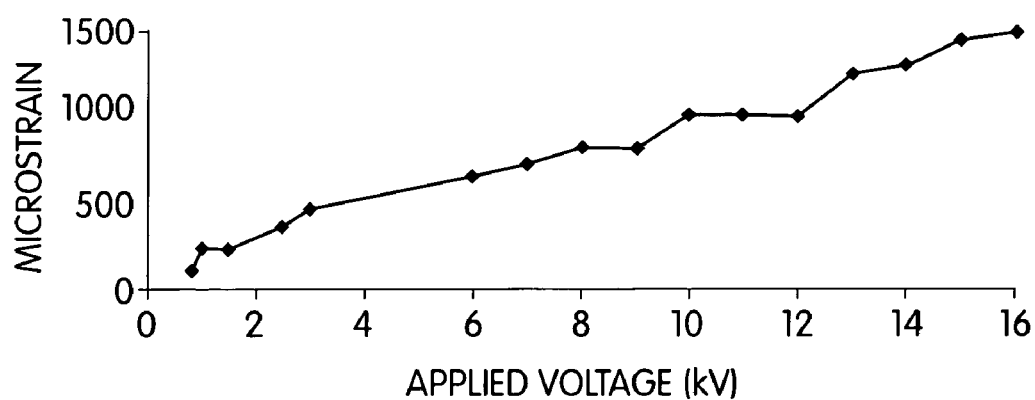
FIG. 9 is a graph of microstrain vs. applied voltage for sample 1 after poling.

The sample was then poled while in the testing apparatus for 10 minutes under a 3.6 kV direct current voltage. FIG. 9 shows the strain vs. applied voltage measured at room temperature after poling. A higher strain at equal voltage was achieved, with a maximum strain of 1500 microstrain (0.15%) being achieved at 16 kV. The strain had not yet saturated at this voltage.

Figure 10:
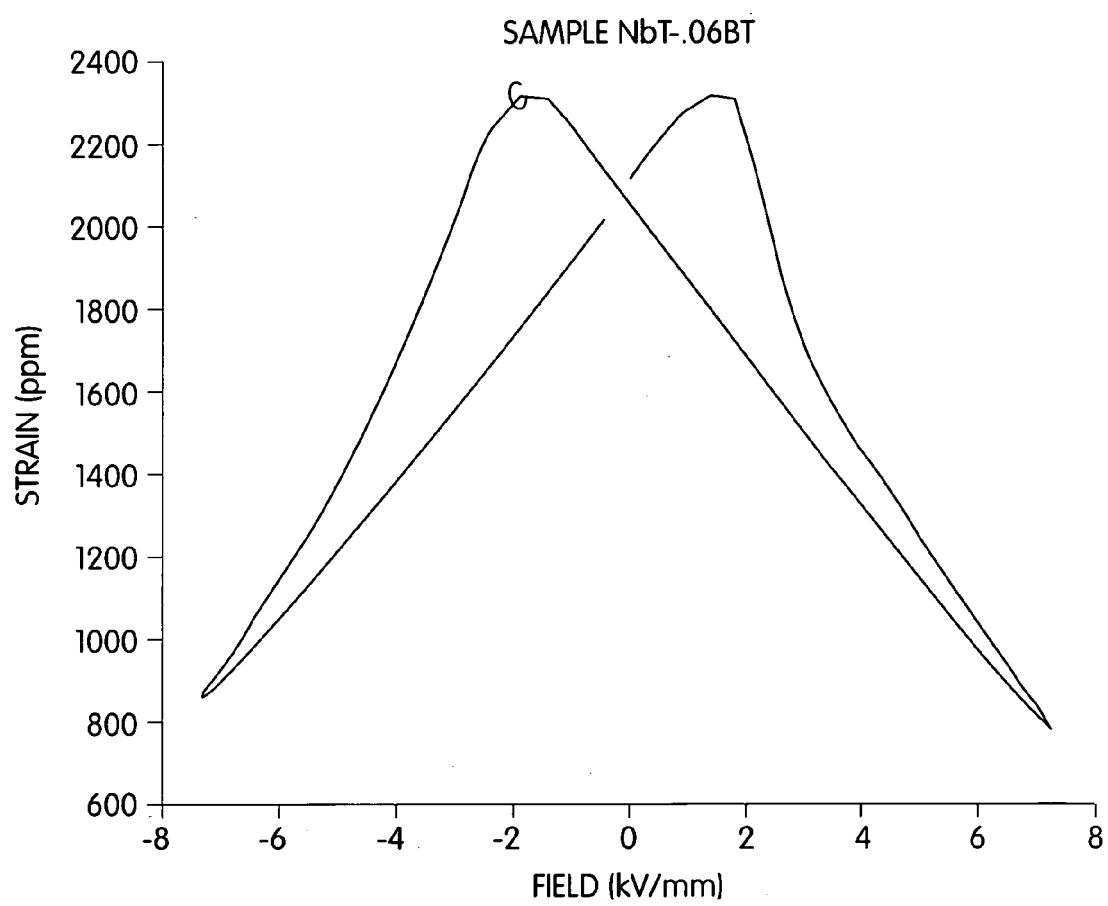
FIG. 10 is a graph of microstrain vs. electric field for sample 1 after poling.

From the nearly-linear slope in FIG. 9, the piezoelectric strain coefficient $d_{33}$, is obtained. Since the applied voltage is the peak-to-peak value, the positive voltage is half of the applied voltage. For example, 500 microstrain is achieved for a change of 2.5 kV. The $d_{33}$ value is therefore approximately 200 pC/N. FIG. 10 shows the complete strain vs. applied field loop for this sample. It is seen that the sample has small hysteresis compared to conventional ferroelectric actuators. Thus this rhombohedral phase single crystal is shown to function as a piezoelectric actuator with low hysteresis.

EPMA analysis of two other crystals from the same growth run showed Ba concentrations of 0.27 and 0.31 respectively, which also place them within the rhombohedral phase field.

Results on Tetragonal Phase BaTiO$_3$-doped NBT Sample 2 was another single crystal from the same growth run, which EPMA showed to have a higher Ba concentration than the overall batch composition. A line scan, in which the probe was stepped across the sample surface, was also conducted using EPMA to examine for nonuniformity in Ba doping level. The average concentrations of the line scanned points is given below; the crystal was found to be uniform. The compositional analysis of the crystal is given below:

|  | Na | Bi | Ti | Ba | O |
|---|---|---|---|---|---|
| Nominal Composition | 0.470 | 0.470 | 1.000 | 0.060 | 3.000 |
| Sample 2 | 0.4– | 0.451 | 1.079 | 0.096 | 2.915 |
| Sample 2 line Scan | 0.462 | 0.446 | 1.057 | 0.095 | 2.939 |

Figure 11:
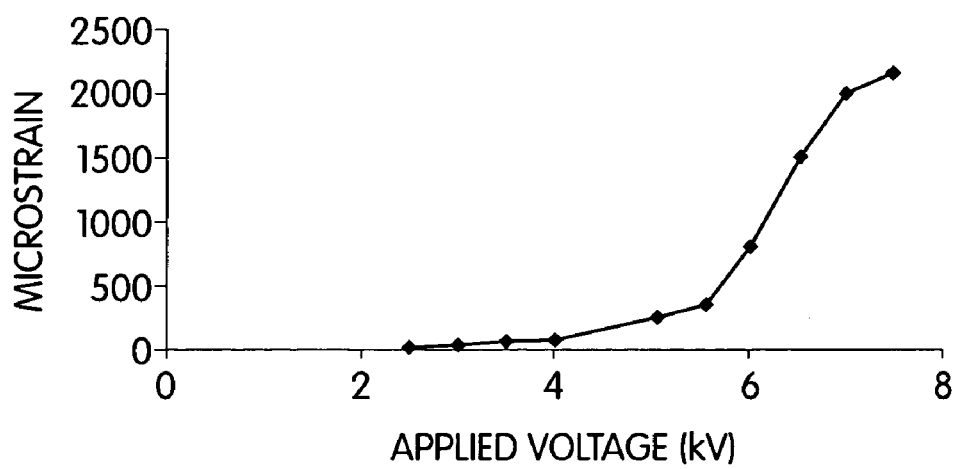
FIG. 11 is a graph of microstrain vs. electric field for sample 2 before poling.

This sample has a high enough BaTiO$_3$ content to be well within the tetragonal phase field. The crystal was polished to a thickness of 1.165 mm. Before poling, this crystal was tested at room temperature to a maximum field of 6.44 kV/mm (7.5 kV voltage), and exhibited a strain of 2150 microstrain (0.215%), as shown in FIG. 11. After poling in the actuation direction with a field of 3.3 kV for 10 min. at room temperature, the crystal was tested again at room temperature. It exhibited 0.20% strain at 7.73 kV/mm, as shown in FIG. 12.

Figure 12:
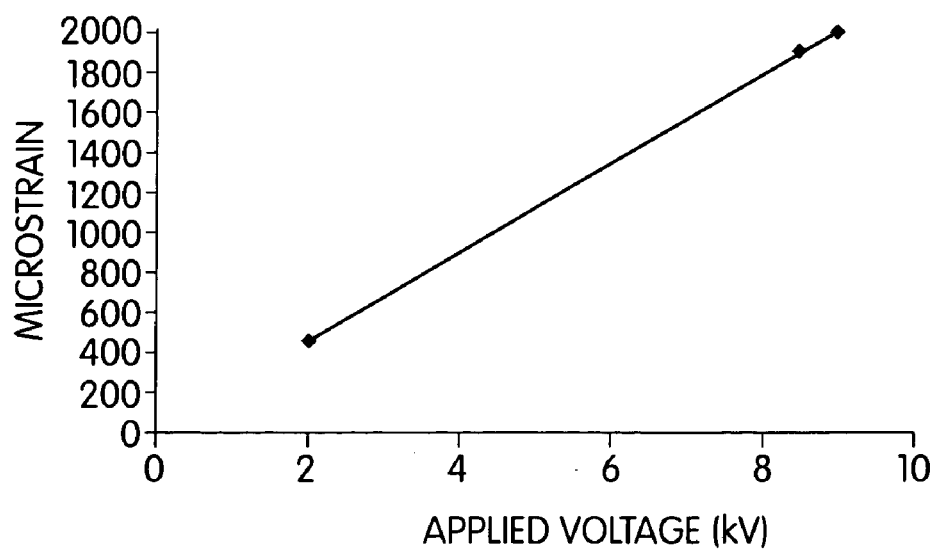
FIG. 12 is a graph of microstrain vs. electric field for sample 2 after poling.

From the data in FIG. 12, $d_{33}$=428 pC/N for Sample 2 after poling. The slight reduction in strain after poling is consistent with a tetragonal ferroelectric in which poling induces some preferential ferroelectric domain orientation in the direction of the applied field.

EXAMPLE 2

Single Crystal Growth in the System Na$_{(1/2)}$Bi$_{(1/2)}$TiO$_3$—K$_{(1/2)}$TiO$_3$—BaTiO$_3$ The nominal crystal composition of this batch was (0.782) Na$_{(1/2)}$Bi$_{(1/2)}$TiO$_3$-(0.138)K$_{(1/2)}$Bi$_{(1/2)}$TiO$_3$-(0.08)BaTiO$_3$. A greater amount of excess Bi$_2$O$_3$ and Na$_2$CO$_3$ was added in this growth run than in Example 1. The amounts of each component are given in the table below:

| Compound | Manufacturer | Amount (g) | Comments |
|---|---|---|---|
| Bi$_2$O$_3$ | Alfa Aesar | 73.7132 | includes 20 wt % of total |
| Na$_2$CO$_3$ | Alfa Aesar | 31.2103 | includes 20 wt % of total |
| TiO$_2$ | Nanotek | 39.2722 |  |
| K$_2$CO$_3$ | Alfa Aesar | 2.3442 |  |
| BaCO$_3$ | Alfa Aesar | 0.6209 |  |

The processing conditions were similar to those used for Example 1. A Thermolyne Hi-temp, model 46100 furnace was used. The crystal growth schedule was as follows: 13.5 hour ramp from room temperature to 1350° C., hold for 5 hours, cool slowly at a rate of 5° C./min to 800° C., then furnace-cool to room temperature. The growth run yielded smaller crystals of cubic habit and approximately 1 mm dimension in a larger amount of crystallized flux. After removing, the crystals from the flux using hydrochloric acid, EPMA analysis was conducted. The K concentration was lower than that of the overall batch composition by approximately a factor of 10. The Ba concentration was slightly higher than the overall composition. This places the composition well within the tetragonal phase field, as shown in FIG. 1. X-ray diffraction of the crystals showed splitting of the (100) and (200) reflections of the corresponding cubic phase, consistent with the existence of the tetragonal phase. Optical microscopy showed the existence of multiple ferroelectric domains, predominantly oriented at 90° with respect to one another.

Figure 14:
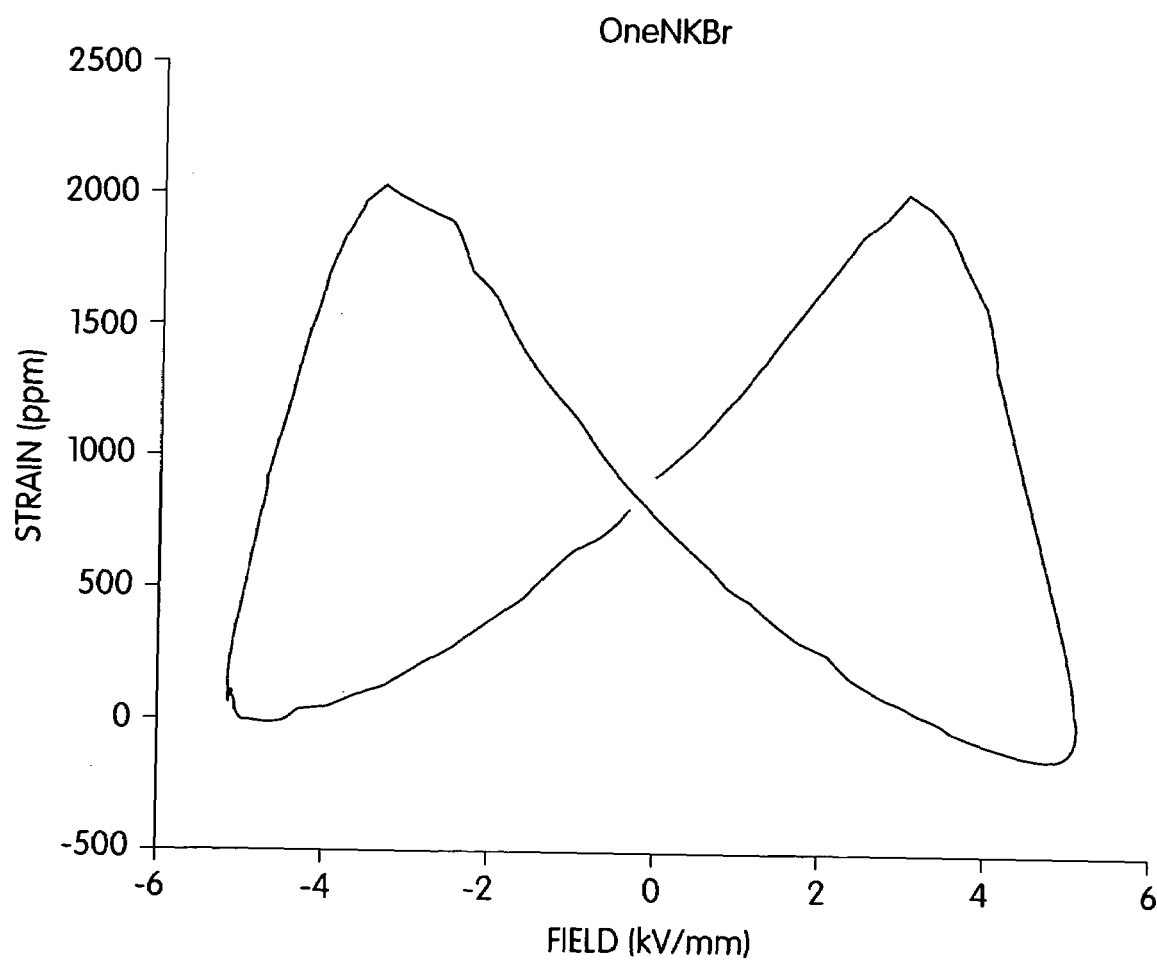
FIG. 14 is a graph of microstrain vs. field loops for Sample 5.

Several of the crystals were strain tested at room temperature after poling. FIGS. 13 and 14 show the strain vs. field loops for Samples 3 and 5 respectively, in which the maximum strain levels reached are 0.4% and 0.2% strain respectively. Each sample shows a larger hysteresis than FIG. 10, which is to be expected from a tetragonal ferroelectric undergoing domain switching.

The results from this growth run show that single crystals of cubic morphology can be grown by a flux method in the system Na$_{(1/2)}$Bi$_{(1/2)}$TiO$_3$—K$_{(1/2)}$Bi$_{(1/2)}$TiO$_3$—BaTiO$_3$. These crystals can be of a composition which falls in the tetragonal phase field. Together with the tetragonal phase NBT-BT crystals from Example 1, it is shown that tetragonal ferroelectric phase single crystals of the compositions defined by the invention exhibit high piezoelectric strain when oriented in (100).

EXAMPLE 3

Textured Crystallites by Cleavage and Capillary Aggregation

Figure 15A:
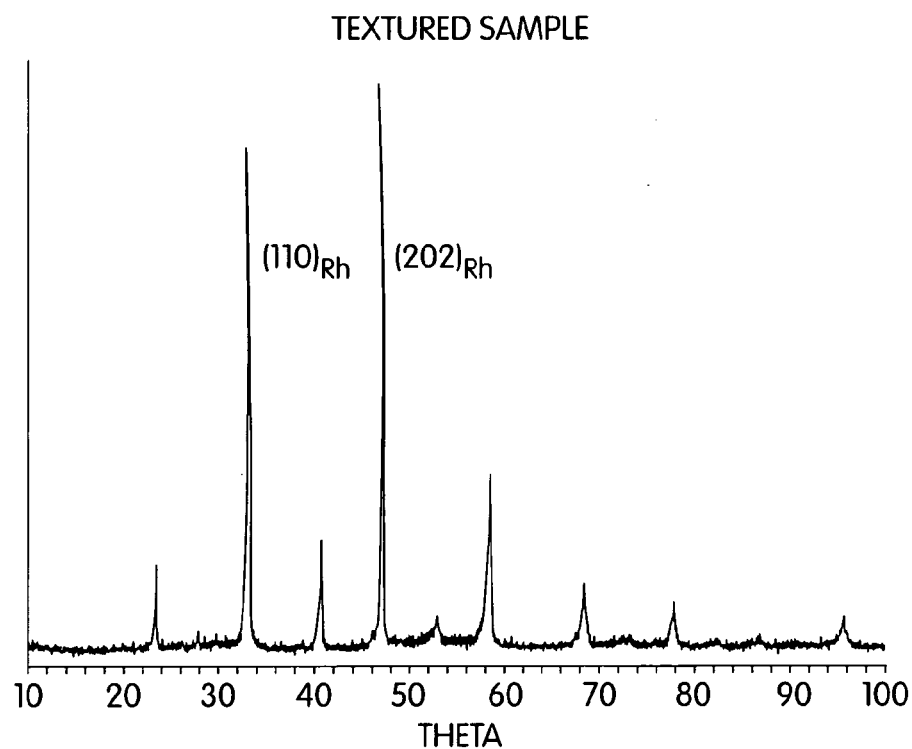
FIG. 15 is an x-ray diffraction (XRD) pattern for (A) a textured single crystallite sample and (B) a randomly oriented polycrystalline sample.
Figure 15B:
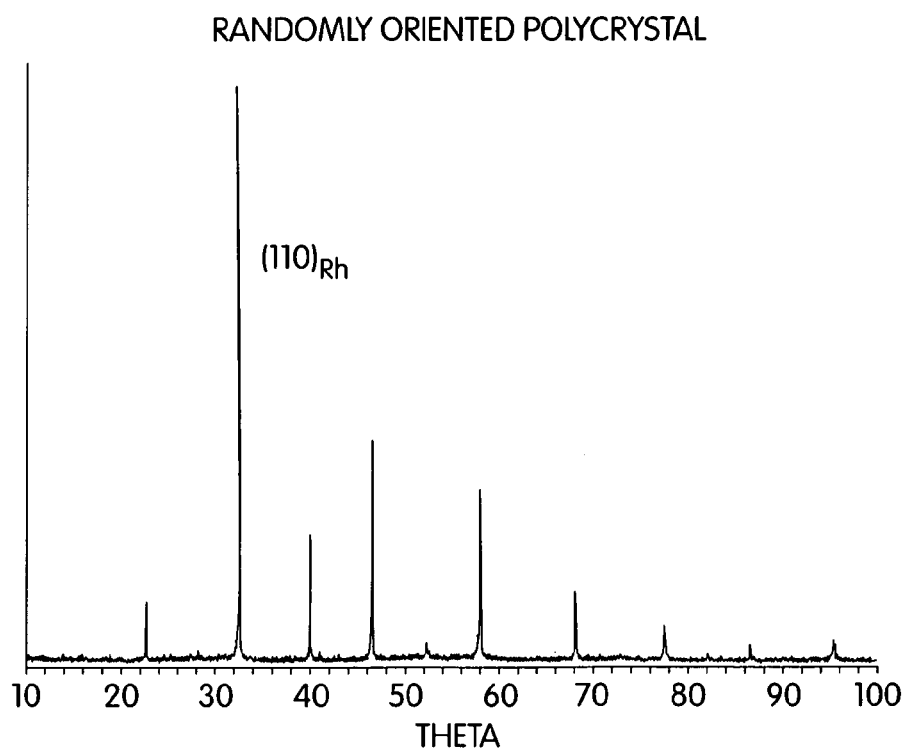

Several of the Ba-doped NBT crystals of Example 1 were ground coarsely using a mortar and pestle. The resulting powder was mixed with the liquid binder collodion, and spread on a glass slide. The slide was heated for about 10 minutes in a small box furnace to set the glue. During drying, the powder tends to settle against the glass surface, and the capillary action of the liquid also helps to draw the particles together and against the glass surface. After drying, the powder was subjected to powder x-ray diffraction. The x-ray diffraction pattern, FIG. 15, shows stronger intensity for the (202) reflection of the rhombohedral phase ((200) of the corresponding cubic phase) than does a randomly oriented powder. In the powder diffraction pattern for NBT, JCPDS, file 36-0340, the (110) of the rhombohedral phase is expected to have the highest intensity. In our sample, the (202) has the highest intensity, showing that preferential alignment of the cube faces parallel to the glass surface has been achieved. This result shows that comminution of large crystals followed by an alignment against a surface yields a preferential texture in the array of crystallites.

EXAMPLE 4

Composite Actuators from Multiple Single Crystallites

A growth run producing many small crystals in the composition system (0.90)Na$_{(1/2)}$Bi$_{(1/2)}$TiO$_3$-(0.10)BaTiO$_3$ was conducted according to the procedure in Example 2.

The starting materials and amounts are given in the following table:

| Compound | Manufacturer | Amount (g) | Comments |
|---|---|---|---|
| $Bi_2O_3$ | Alfa Aesar | 70.3282 | includes 20 wt % of total |
| $Na_2CO_3$ | Alfa Aesar | 32.4805 | includes 20 wt % of total |
| $TiO_2$ | NanoTek | 37.3268 | |
| $BaCO_3$ | Alfa Aesar | 9.2216 | |

Figure 16:
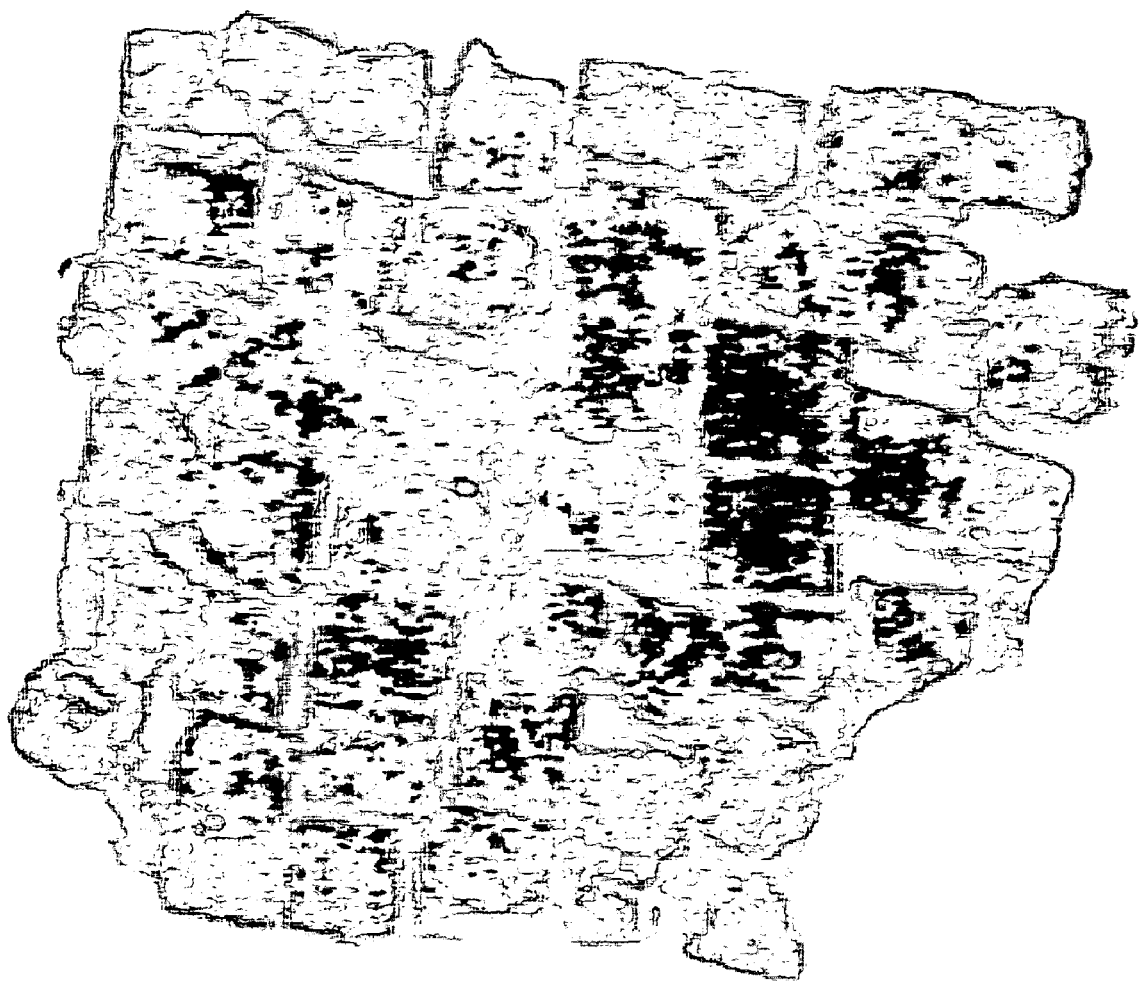
FIG. 16 is a photograph of a composite actuator assembled from cubic single crystals.

Small crystals (<1 mm³) of cubic habit and of near-MPB composition, removed from the as-grown batch by hydrochloric acid dissolution were used to fabricate a multi-crystal actuator. A 1 cm² area was cut out of 1.5 mm thick piece of Teflon for the mold. High-temperature double-sided tape was used for contacting the mold to a piece of metal (support) as well as to hold the crystals in place. The cube faces of the crystals were aligned flat against the supporting surface of the mold, packed together in as high a density as possible. Shell Epon 9405 (a two-part epoxy) was chosen for the matrix. 2.0 g of each part were mixed together. The epoxy was poured on top of the crystals. The mold was placed in a furnace at ~350° C. for 3.0 hours to cure the epoxy. The resulting composite actuator is shown in FIG. 16.

This result shows that crystals of cubic morphology can be grown in the composition system $(0.90)Na_{(1/2)}Bi_{(1/2)}TiO_3$-$(0.10)BaTiO_3$. It also shows that a oriented multi-crystal actuator can be fabricated by assembling a large number of individual crystals grown in a faceted morphology against a common surface. The resulting composite actuator is 1–3 composite (one-dimensional connectivity for the crystals and a connectivity in three dimensions for the epoxy matrix).

EXAMPLE 5

Growth of a Textured Polycrystalline Piezoelectric Material

Growth of a composition $(0.85)Na_{(1/2)}Bi_{(1/2)}TiO_3$-$(0.15)K_{(1/2)}Bi_{(1/2)}TiO_3$ was conducted according to the method described in Example 1. The components used and the amounts given in the following table:

| Compound | Manufacturer | Amount (g) | Comments |
|---|---|---|---|
| $Bi_2O_3$ | Alfa Aesar | 65.6060 | includes 20 wt % of component |
| $Na_2CO_3$ | Alfa Aesar | 12.6845 | includes 20 wt % of component |
| $TiO_3$ | Fluka | 37.4891 | |
| $K_2CO_3$ | Alfa Aesar | 2.4324 | |

Crystal growth was conducted as described for Example 1. The furnace schedule was as follows: 13.5 hour Tamp from room temperature to 1350° C., hold for 5 hours, cool slowly at a rate of 5° C./min to 800° C., then furnace-cool to room temperature.

Figure 17:
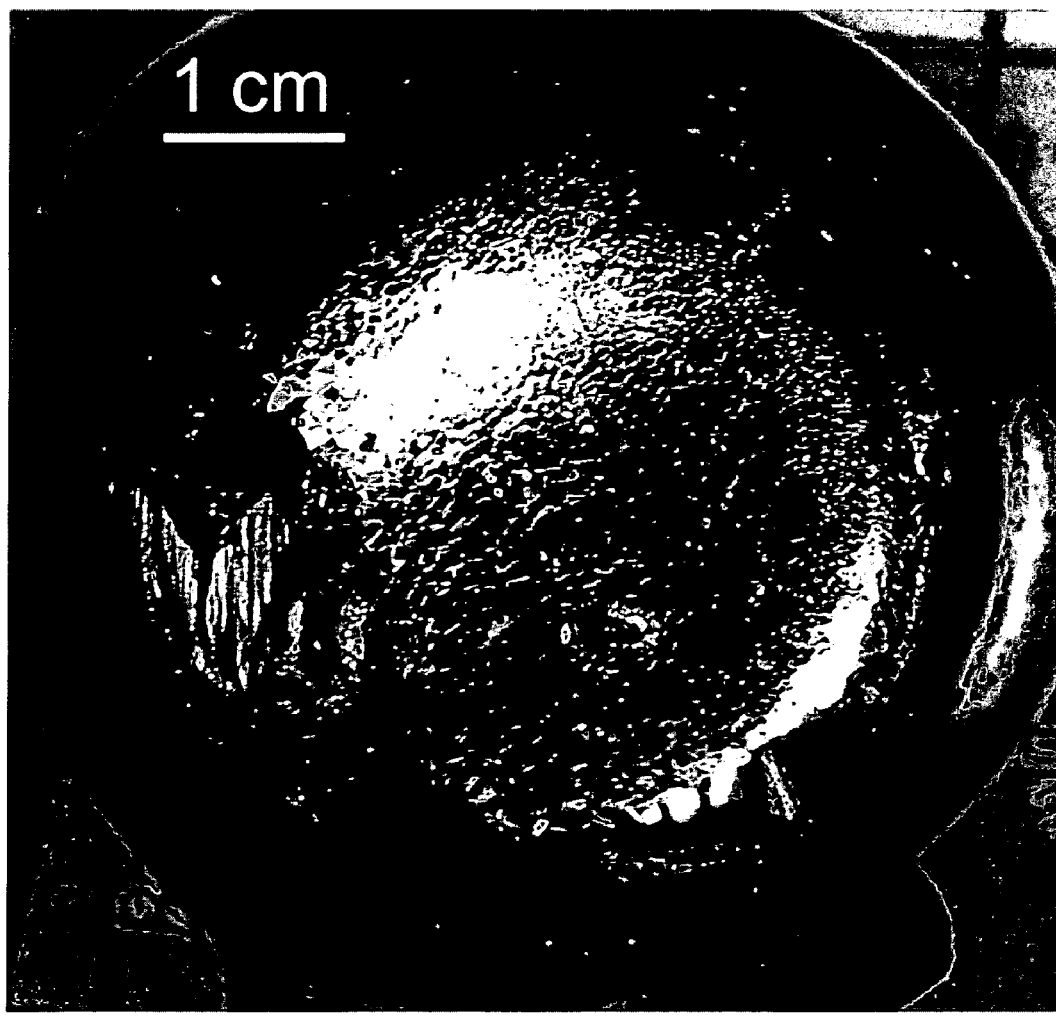
FIG. 17 is a photograph of a crystal mass grown from Example 5.
Figure 18:
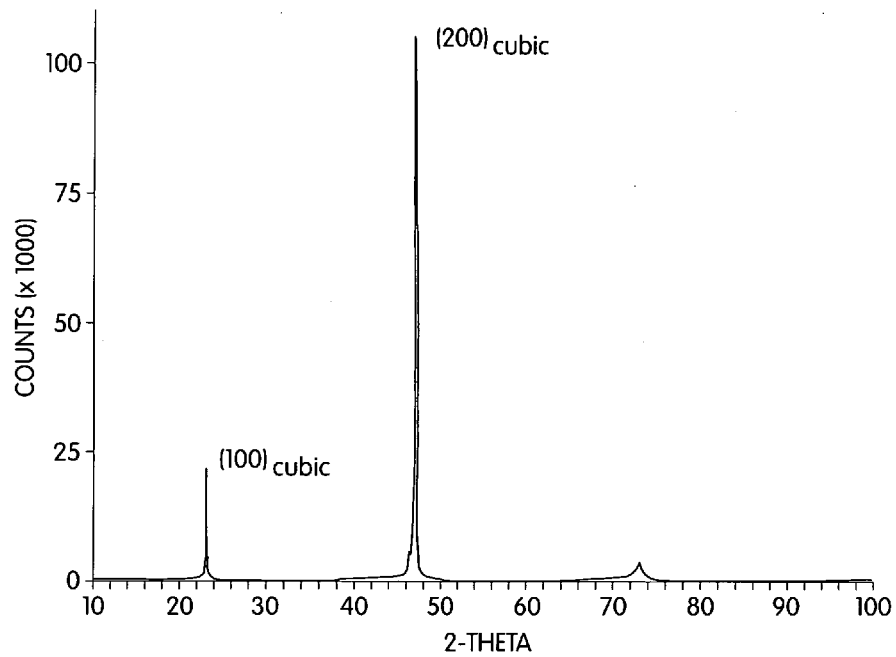
FIG. 18 is an XRD pattern of the crystal mass of FIG. 17, demonstrating crystallographic texturing of the polycrystals.

The nominal composition is in the rhombohedral phase field of the NBT-KBT system. After growth, a large flat area (about 6 square centimeters) of densely packed smaller crystals of uniform size (1–2 mm diameter) were observed at the surface of the original melt, as shown in FIG. 17. Underneath the layer of crystals were numerous larger crystals of cubic growth habit. The surface layer of crystals was removed and examined by X-ray diffraction. The resulting diffraction pattern is shown in FIG. 18. The strongest reflections observed are those for the (100) and (200) reflections of the corresponding cubic phase. There is a striking absence of almost all other reflections. This shows that the layer of small crystallites is highly textured, with the {100} planes of the cubic crystals all oriented parallel to the surface of the melt. A large area (~1 inch diameter) of the layer of aligned crystals was removed intact and infiltrated with epoxy to fabricate a composite actuator.

The smaller crystals nucleated spontaneously and floated to the top of the melt, and that the liquid surface served as the alignment surface. The result shows that, firstly, single crystals of cubic morphology can be grown in the $(0.85)Na_{(1/2)}Bi_{(1/2)}TiO_3$-$(0.15)K_{(1/2)}Bi_{(1/2)}TiO_3$ system. Secondly, it is shown that alignment against a surface during the growth of faceted crystals can be used to achieve a crystallographically textured array of multiple crystals. Thirdly, such a textured array can be fabricated into a piezoelectric actuator composite, for instance by infiltration with a polymer.

EXAMPLE 6

Single Crystal Growth in $Na_{(1/2)}Bi_{(1/2)}TiO_3$—$BaTiO_3$

A powder mixture of the target composition $(0.92)Na_{(1/2)}Bi_{(1/2)}TiO_3$-$(0.08)BaTiO_3$ was prepared, with 20 wt % each of $Na_2CO_3$ and $Bi_2O_3$ being added in excess in order to form a liquid flux. The powder mixture was prepared from the following starting materials in the following amounts:

| Compound | Manufacturer | Amount (g) | Total, including flux addition |
|---|---|---|---|
| $Bi_2O_3$ | Morton Thiokol | 50.1804 | 60.2165 |
| $Na_2CO_3$ | MCB Reagents | 11.4144 | 13.6973 |
| $TiO_2$ | NanoTek | 37.4014 | |
| $BaTiO_3$ | Morton Thiokol | 7.3925 | |

The powders were ball-milled in a 500 mL polypropylene bottle containing 50% by volume of zirconia milling media and ~80 mL ethanol for ~17 hours at a rolling speed of 120 rpm. The mixed powder was dried with a heating lamp, then ground in a mortar and pestle, then placed in an alumina crucible (100 mL) with a cover and calcined in air according to the following heating schedule: ramp rate of 100° C./hr from room temperature to 800° C., hold for 2 hours, ramp down to 20° C. at 100° C./hr. The powder was removed from the crucible and ground in a mortar and pestle, then placed in a 100 mL platinum crucible, covered with a platinum lid and then placed within a 250 mL alumina crucible and covered with an alumina lid. The sample was placed in a Thermolyne 47900 furnace and fired according to the following crystal growth schedule: ramp rate of 100° C./hr from room temperature to 1350° C., hold for 5 hours, ramp rate of 5° C./hr to 800° C., ramp rate of 50° C./hr to 25° C.

This growth process resulted in a textured raft of small (~1 mm) crystals on the surface of the growth material, further demonstrating the method of Example 5. Beneath the textured polycrystals were many larger single crystals. The crystals were mechanically removed from the crucible and the residual solidified flux was dissolved by immersing in hydrochloric acid for 2 days, after which the crystals were removed and washed with water.

Numerous crystals were tested. The crystals were oriented and polished with diamond abrasive paper of successively finer grit size (30, 6 and 0.5 μm) using a South Bay Technology tripod polisher. Gold was sputtered on both faces of the polished crystal plates as electrodes. Silver paint was applied over the gold layer. The capacitance of each crystal was measured using an HP 4194-A impedance analyzer, and the dielectric constant was determined from the capacitance and crystal dimensions. Where desired, the crystals were poled by immersing in an insulating oil bath at 100° C. and poled at twice the coercive field for 10 minutes.

A laser-interferometric strain measurement apparatus was used to measure the piezoelectric strain at room temperature as a function of electric field, at an ac frequency of 1 Hz.

Table 1 lists the compositions as determined by electron microprobe microanalysis, and phases of some of the samples as determined by XRD. The samples having designations with the prefix BNT_08 are from the growth run described in this Example. Those samples having designations with the prefix BNT10 were grown in a similar manner except that the nominal Ba concentration was increased to 10 mole % (i.e., the target composition is $0.90Na_{(1/2)}Bi_{(1/2)}TiO_3\text{-}0.10BaTiO_3$). Those having designations with prefixes XT are from Example 1. In Example 1, sample 1 corresponds to sample XTI and sample 2 corresponds to XT22 of Table 1. NBT is from a similar growth but without BaTiO3 doping. NKB is from Example 2. The composition of each crystal is also given in Table 1, as determined by electron microprobe microanalysis using rutile $TiO_2$, albite $NaAlSi_3O_8$, bismuth germanate $Bi_4Ge_3O_{12}$, $BaSO_4$, and $KAlSi_3O_8$ standards. The relative accuracy of the compositions given is better than 5% of the stated values.

FIG. 21 illustrates the strain vs. electric field behavior at room temperature for several rhombohedral phase crystals, showing the low hysteresis and high strain that is attainable in solid solutions of the present inventions. The crystal NBT2 which is an undoped NBT is seen in FIG. 21 to be hysteretic and to have modest strain, reaching 0.1% at about 60 kV/cm. The crystal XT21 contains 3.21 molar % $BaTiO_3$ and shows low hysteresis actuation above a coercive field of about 16 kV/cm. The crystal BNT.08 10 contains 5.55 molar % $BaTiO_3$ and is near the MPB. It is actuated with an AC field about a DC bias field of 30 kV/cm. It shows low hysteresis actuation reaching a high strain of about 0.24% at 60 kV/cm, and exhibits a $d_{33}$ of about 400 pC/N.

Figure 19:
FIG. 19 is a photomicrograph of a high strain single crystal of the invention.
Figure 20:
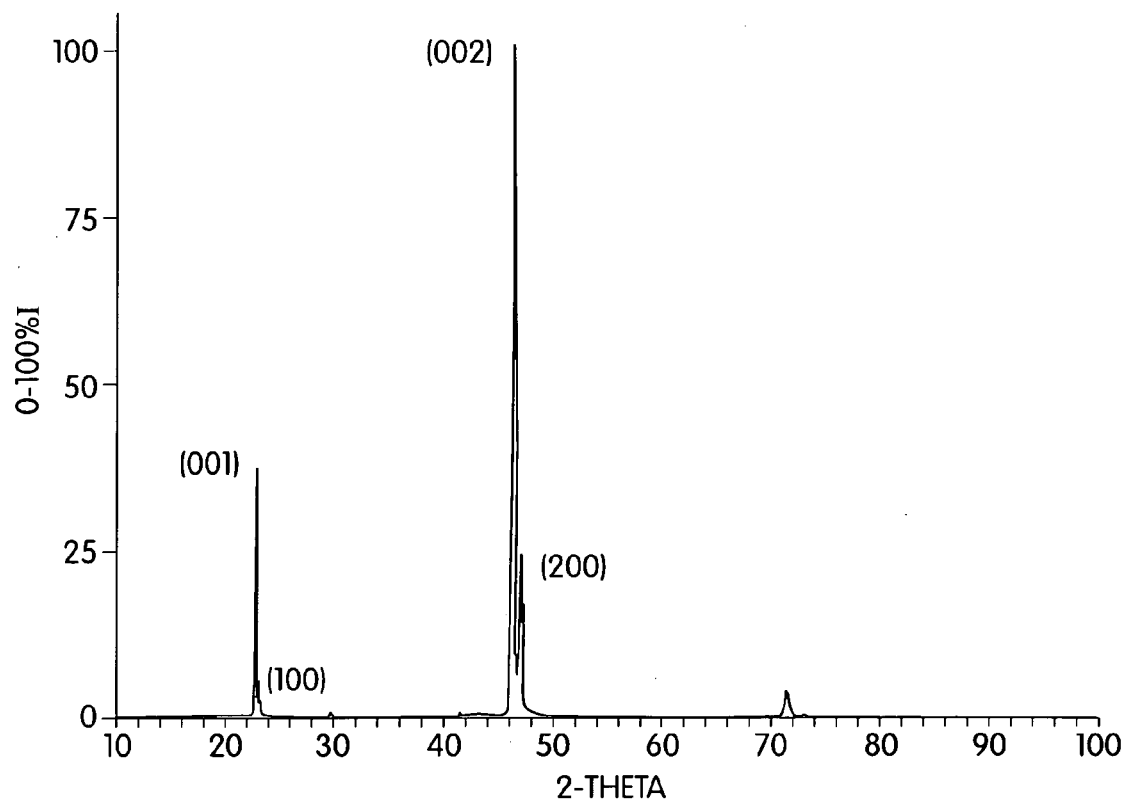
FIG. 20 is an XRD pattern of the single crystal of FIG. 19.

Of all the tested crystals, that crystal designated as BNT.08 7 was found to exhibit the highest piezoelectric strain. This crystal is shown in FIG. 19. An X-ray diffractogram taken from the oriented crystal face is shown in FIG. 20. Only (001)/(100) and (002)/(200) reflections are seen, showing that the crystal is oriented with its faces normal to the {001} directions of the corresponding cubic phase. The splitting of the peaks clearly shows that it is of the tetragonal phase. Although FIG. 20 indicates this crystal as being a perovskite structure in the view taken from the oriented crystal face, the composition of the crystal, given in Table 1, indicates that it is not a simple perovskite, but instead is an Na-deficient, non-stoichiometric solid solution.

The BNT.08 7 crystal was poled with a dc field of 3.1 kV/mm for 10 minutes at 100° C. FIG. 4 shows the strain vs. electric field behavior of this crystal to the highest field which was applied in testing. A strain of 0.85% at 3.8 kV/mm was obtained. The hysteresis observed is typical of a domain-switching ferroelectric. The hysteresis curve indicates that the strain had not yet saturated, and that even

TABLE 1

Crystal Compositions and Phases

| Crystal | mole % Na | mole % Bi | mole % Ti | mole % O | mole % Ba | Na/Bi | Na + Bi + Ba | (Na + Ba + Bi)/Ti | XRD |
|---|---|---|---|---|---|---|---|---|---|
| XTI | 45.9 | 48.6 | 104.2 | 298.1 | 3.2 | 0.9444 | 0.977 | 0.9376 | — |
| XT9 | 50 | 47.6 | 106.1 | 293.5 | 2.7 | 1.0504 | 1.003 | 0.9453 | R |
| XT16 | 49.1 | 46.8 | 105.2 | 295.8 | 3.1 | 1.0491 | 0.99 | 0.9411 | — |
| XT20 | 48.93 | 39.86 | 102.25 | 298.86 | 10.11 | 1.2275 | 0.989 | 0.9672 | — |
| XT21 | 53.09 | 45.06 | 100.42 | 298.51 | 3.21 | 1.1782 | 1.0136 | 1.0094 | R |
| XT22 | 45.9 | 45.1 | 107.9 | 291.5 | 9.6 | 1.0177 | 1.006 | 0.9323 | T |
| XT32 | 52.58 | 44.99 | 101.1 | 298.62 | 2.71 | 1.1687 | 1.0028 | 0.9919 | R |
| XT37 | 51.6 | 44.26 | 102.05 | 299.19 | 2.89 | 1.1658 | 0.9875 | 0.9677 | — |
| XT40 | 53.52 | 42.74 | 102.04 | 298.32 | 3.38 | 1.2522 | 0.9964 | 0.9765 | R |
| XT44 | 50.24 | 45.3 | 101.3 | 299.39 | 3.78 | 1.1090 | 0.9932 | 0.9805 | — |
| NBT2 | 54.57 | 45.09 | 101.75 | 298.49 | 0 | 1.2105 | 0.9966 | 0.9795 | R |
| NKB1 | 36.5 | 34.95 | 96.815 | 305 | 26.2 | 1.0443 | 0.-9825 | 1.0148 | T |
| NKB7 | 37.1 | 34.9 | 94.15 | 309.4 | 23.95 | 1.0630 | 0.965 | 1.0250 | T |
| BNT_08 2 | 46.98 | 44.75 | 101.53 | 301.29 | 6.55 | 1.0498 | 0.9828 | 0.9680 | — |
| BNT_08 3 | 46.71 | 45.47 | 101.12 | 300.22 | 6.47 | 1.0273 | 0.9865 | 0.9756 | — |
| BNT_08 6 | 50.19 | 45.67 | 100.57 | 299.16 | 4.41 | 1.0990 | 1.0027 | 0.9970 | — |
| BNT_08 7 | 29.94 | 45.79 | 109.66 | 308.78 | 5.82 | 0.6539 | 0.8155 | 0.7437 | T |
| BNT_08 9 | 48.85 | 44.62 | 101.86 | 299.83 | 4.83 | 1.0948 | 0.98 | 0.9621 | R |
| BNT_08 10 | 46.48 | 44.36 | 102.35 | 300 | 5.52 | 1.0478 | 0.9636 | 0.9415 | R |
| BNT_08 1 | 48.75 | 46.29 | 101.3 | 300.02 | 3.65 | 1.0531 | 0.9869 | 0.9742 | — |
| BNT_08 21 | 47.49 | 43.06 | 101.23 | 300 | 9.18 | 1.1031 | 0.9973 | 0.9852 | T |
| BNT 10 2 | 46.96 | 43.65 | 102.2 | 300.26 | 6.92 | 1.0758 | 0.9753 | 0.9543 | T |
| BNT 10 3 | 46.3 | 44.75 | 102.3 | 300.74 | 5.91 | 1.0346 | 0.9696 | 0.9478 | — |
| BNT 10 5 | 47.13 | 45.32 | 101.62 | 300.34 | 5.59 | 1.399 | 0.9804 | 0.9648 | — |
| BNT 10 6 | 47.16 | 44.44 | 101.6 | 300.13 | 6.66 | 1.0612 | 0.9826 | 0.9671 | T |
| BNT 10 7 | 48.29 | 44.73 | 101.83 | 300 | 5.15 | 1.0796 | 0.9817 | 0.9641 | — |
| BNT 10 A | 44.79 | 44.85 | 103.04 | 301.56 | 5.76 | 0.9987 | 0.954 | 0.9259 | — |
| BNT 10 C | 48.97 | 45 | 101.03 | 299.52 | 5.47 | 1.0882 | 0.9944 | 0.9843 | — |
| BNT 10 E | 50.47 | 45.03 | 100.18 | 298.73 | 5.59 | 1.1208 | 1.010 | 1.0091 | — |

R = Rhombohedral; T = Tetragonal higher strains could have resulted had a higher field strength been applied. When the crystal was tested at low field strengths, the slope of the strain vs. field curves showed a $d_{33}$ value of 360 pC/N. This experimentally indicates that the majority of the actuation strain achieved was due to domain re-orientation within the tetragonal phase.

This result is a significant advance over the actuation levels that are typically attainable in commercial PZT solid solutions such as 5H, 5A, 4S, and 8M, which generally reach at most about 0.45% strain at a field of about 3.8 kV/mm. This result further confirms the superiority of the family of compositions described herein and indicates that within the family of compositions, the subclass of compositions as defined above can be expected to produce particularly superior characteristics.

In comparison, in Example 1 a tetragonal single crystal in the $Na_{1/2}Bi_{1/2}TiO_3$—$K_{1/2}Bi_{1/2}TiO_3$ subclass of the compositional family was experimentally found to reach a strain of about 0.2% at 7.73 kV/mm, and in Example 2, a tetragonal single crystal in the $Na_{1/2}Bi_{1/2}TiO_3$—$K_{1/2}Bi_{1/2}TiO_3$—$BaTiO_3$ subclass of the compositional family was experimentally found to reach a strain of about 0.4% at 4.8 kV/mm. In FIG. 4, the crystal containing 9.2 molar % $BaTiO_3$ is crystal BNT_08 21 having a composition $Na_{0.475}Bi_{0.43}Ba_{0.092}Ti_{1.012}O_3$. The crystal reaches a strain of about 0.4% at 30 kV/cm when actuated with an AC field about a DC bias of 15 kV/cm. The thickness-mode coupling coefficient of this crystal was measured using the resonance-antiresonance method and was determined to be $k_t$=57%, which is superior to that of polycrystalline NBT-based materials and approaches that of the best single crystals in the PZN-PT and PMN-PT family. This further demonstrates the utility of the present invention.

Considering the composition of the crystal designated as BNT_08 7, as given in Table 1, it is seen that it includes 5.82 mole % Ba, which is near the morphotropic phase boundary composition in stoichiometric crystals. However, this crystal is clearly Na deficient with respect to the stoichiometric composition of $Na_{1/2}Bi_{1/2}TiO_3$—$BaTiO_3$, having an Na/Bi ratio that is 0.654 rather than the ideal stoichiometric value of 1.0, a total Na+Bi+Ba molar concentration of 0.8155 per formula unit rather than 1.0, and a (Na+Ba+Bi)/Ti ratio of 0.744 rather than 1.0. While some of the other crystal compositions given in Table 1 also vary away from the ideal cation stoichiometry of the composition $Na_{1/2}Bi_{1/2}TiO_3$, it is clear that the crystal designated BNT_08 7 is exceptional in its deviation from stoichiometry, and that this deviation from stoichiometry can be directly correlated to the exceptional piezoelectric properties exhibited by the crystal.

Figure 22:
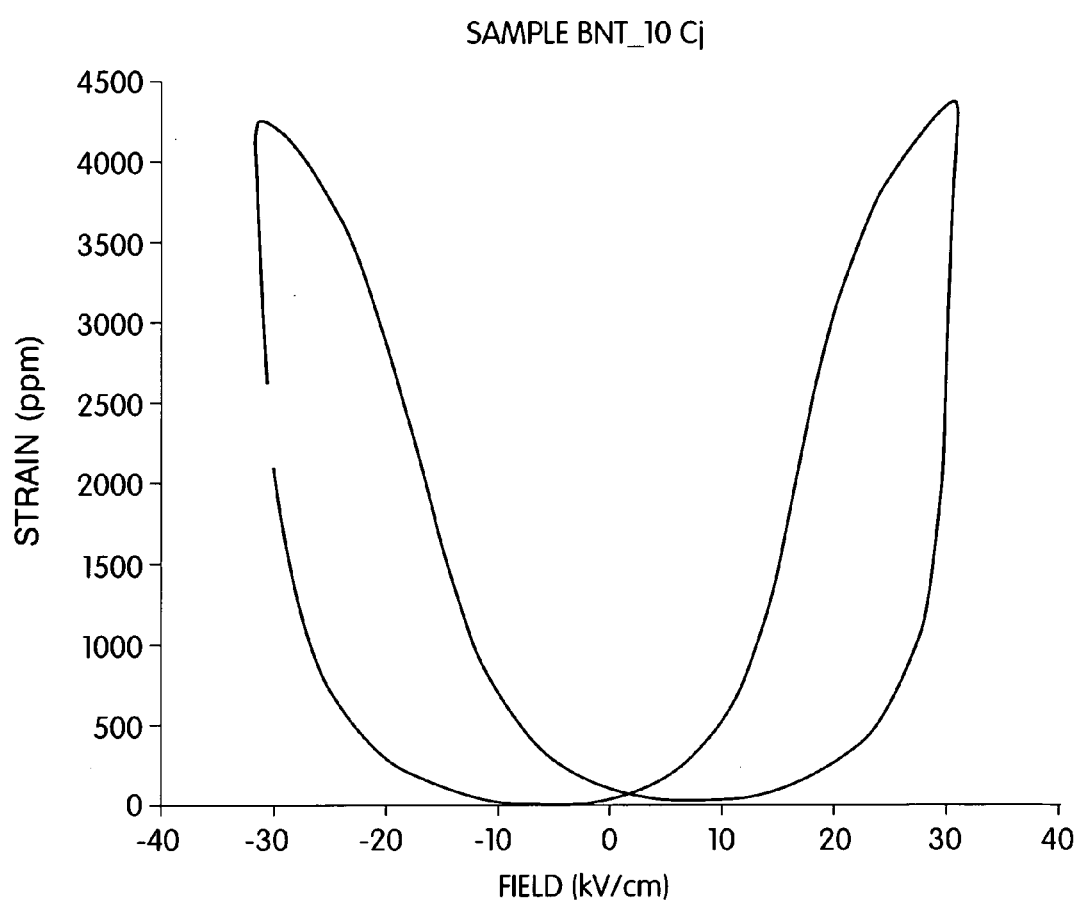
FIG. 22 is a plot of microstrain vs. applied field for the crystal designated as BNT1OC in Table 1 and having a Ba concentration of 5.47%.
Figure 23:
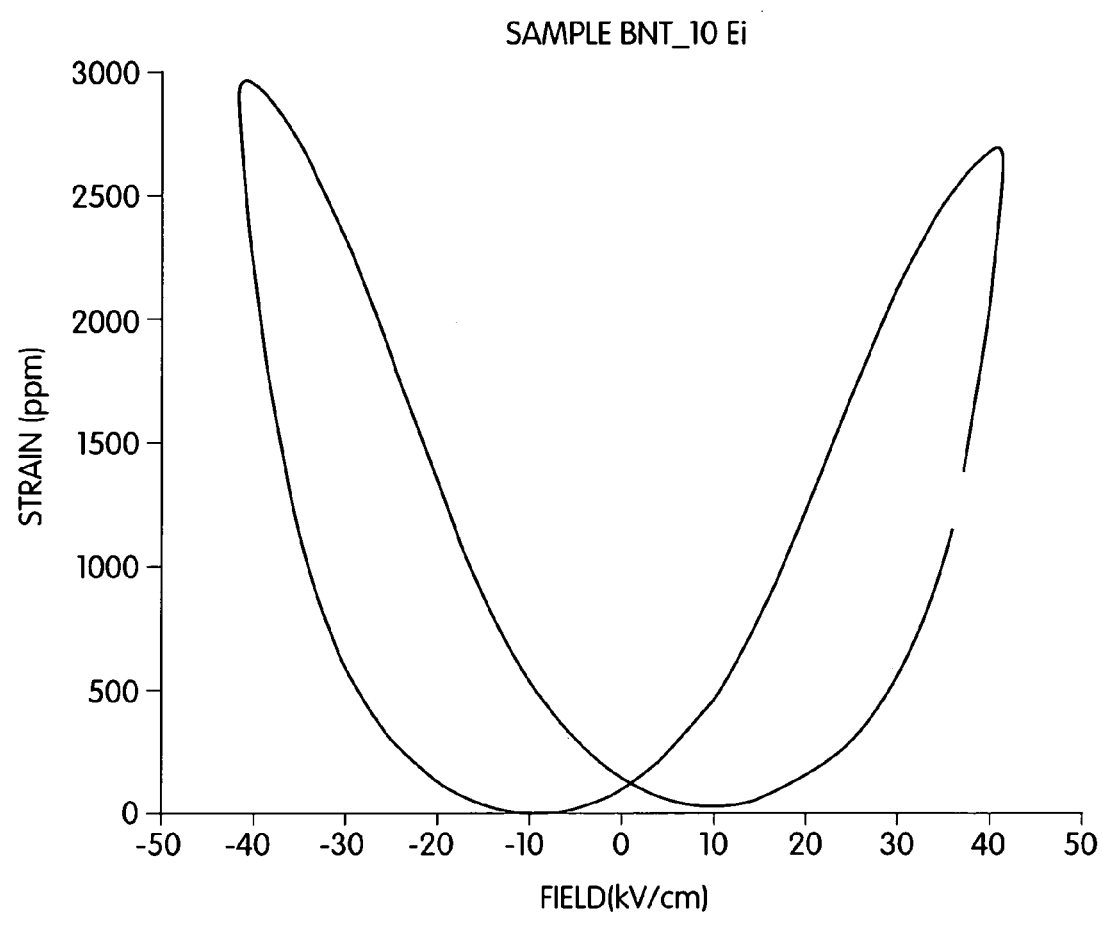
FIG. 23 is a plot of microstrain vs. applied field for the crystal designated as BNT1OE in Table 1 and having a Ba concentration of 5.59%.
Figure 24:
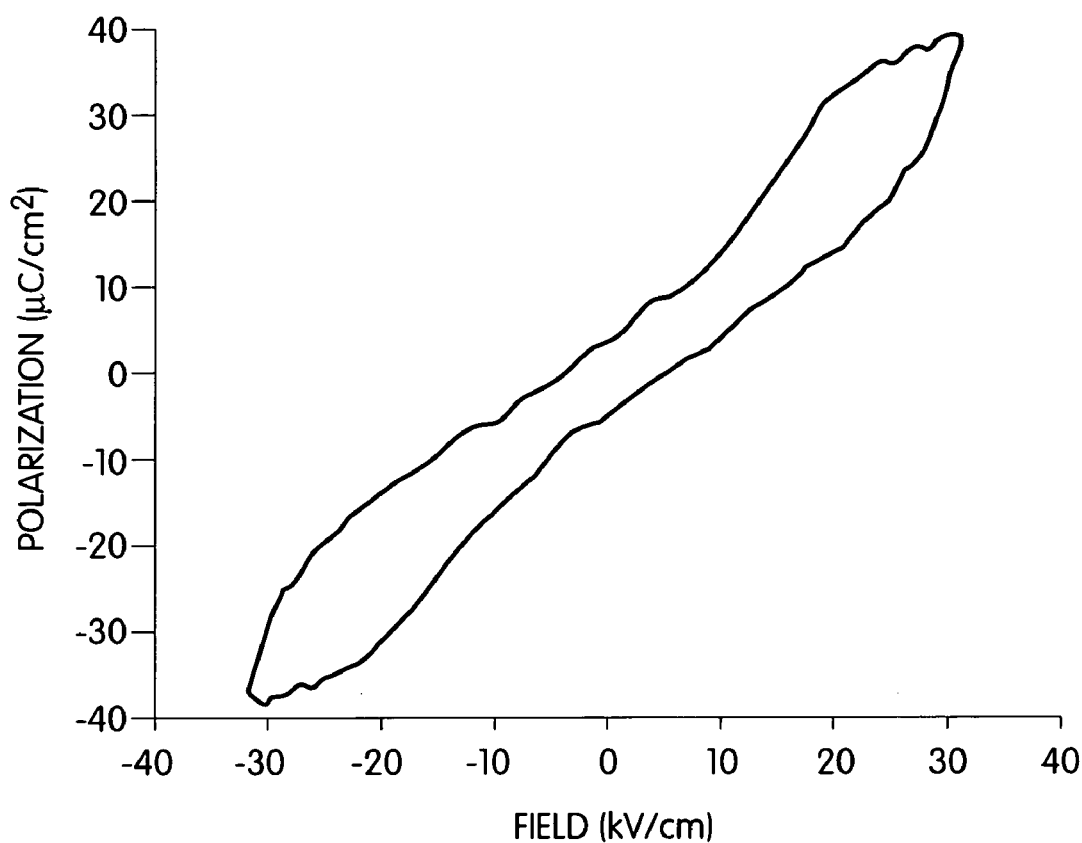
FIG. 24 is a plot of polarization vs. electric field loop for the single crystal of FIG. 22.

The crystals designated as BNT10C and BNT10E in Table 1 are two slices cut from the same large crystal. The Ba concentrations are 5.47% and 5.59%, respectively, both of these being close to the morphotropic phase boundary composition. The actuation strain vs. applied field for these two crystals are shown in FIGS. 22 and 23 respectively. These two crystals at room temperature exhibit a sharp onset of actuation strain, at a field of approximately 3 kV/mm and 4 kV/mm respectively, reaching a maximum strain of 0.44% and 0.3% respectively. This behavior is characteristic of a field-forced antiferroelectric to ferroelectric phase transition, and has previously been seen in Pb—La—Sn—Zr—Ti—O perovskites. The invention provides the discovery of such behavior in a lead-free single crystal perovskite, and in the NBT-BT system at room temperature. The polarization vs. electric field loop corresponding to FIG. 22, shown in FIG. 24, has a shape characteristic of a field-forced AFE-FE phase transition. The actuation strains achieved are approximately, equal to those of conventional ferroelectric PZT's, and exceed those in Pb—La—Sn—Zr—Ti—O polycrystals exhibiting AFE/FE phase change behavior. The Example thus provides a recognition and an experimental demonstration that single crystals in the $Na_{1/2}Bi_{1/2}TiO_3$—$BaTiO_3$ system posses AFE/FE-like actuation behavior with high actuation strain. The Example correspondingly provides the discovery of a room temperature antiferroelectric phase in the $Na_{1/2}Bi_{1/2}TiO_3$—$BaTiO_3$ system with useful actuation properties.

EXAMPLE 7

Zr-doped $Na_{1/2}Bi_{1/2}TiO_3$ Single Crystals

Crystal growth was conducted as described in Example 1, but including 5% substitution of Zr for Ti in the target composition. This was accomplished by adjusting the overall compositions so as to reduce the Ti concentration to 95% of the value for $Na_{1/2}Bi_{1/2}TiO_3$ and adding $ZrO_2$ in a quantity yielding 5% Zr by mole. The crystal growth was successful, and yielded many crystals ranging in size from 1 mm to 10 mm. One crystal from this growth was analyzed and found to contain 5.5% Zr, e.g., $Na_{0.5}Ti_{0.945}Bi_{0.5}Zr_{0.055}O_3$. This experiment indicates in accordance with the invention that single crystals can be grown with partial substitution of Zr for Ti in the parent compounds of the family of compositions provided by the invention.

This aspect of the invention is significant in that single crystals of Zr-containing perovskites are known in the art to be extremely difficult to grow. For example, PZT single crystals are not widely available. The results show that Ti-substitution at the B-site of the alkaline bismuth titanate perovskites is possible, as prescribed by the invention, thereby allowing for a broad range of additional composition families.

EXAMPLE 8

Cs-Doped $Na_{1/2}Bi_{1/2}TiO_3$ Single Crystals

To experimentally confirm that substitution onto the A-site (occupied by Na and Bi) of $Na_{1/2}Bi_{1/2}TiO_3$ single crystals is possible, crystal growth was conducted as described in Example 1, but with 5% substitution of Cs for Na in the target composition. The crystal growth was successful, and yielded many crystals ranging in size from a few mm to greater than 10 mm in a single growth run. This experimentally confirms the discovery provided by the invention of a process for growth of single crystals with partial substitution of heavier alkali metals such as Rb and Cs for Na in the parent $Na_{1/2}Bi_{1/2}TiO_3$ or $K_{1/2}Bi_{1/2}TiO_3$. The invention thereby also provides alkaline bismuth titanate solid solutions with Rb or Cs substituted for Na or K, the single crystal form of such compounds, and growth methods as described herein. It also comprises other A-site substitutions as described above.

EXAMPLE 9

Growth of a Textured Polycrystalline Piezoelectric in the PZN-PT System

The invention here further provides a method for achievement of the growth of textured polycrystals in other perovskite systems such as the PZN-PT material system. This experimentally provides further evidence that the method of growth provided by the invention can be broadly applied to may crystal systems. A target crystal composition of $0.80Pb(Zn_{1/3}Nb_{2/3})O_3$-$0.20PbTiO_3$ was formulated using the following starting materials: lead (II) oxide, zinc oxide, titantium (IV) oxide, niobium (V) oxide ($Nb_2O_5$), to which were added the following as a flu-forming agent: lead (I,II) oxide, $Pb_3O_4$.

The molar ratio of the target crystal composition and the flux was 35:65, and the batch size consisted of 450 g of starting powder. The raw powders were mixed for 12 hours in a V-blender. The mixed powders were fired at 900° C. in a 100 mL platinum crucible, then placed in a 200 mL alumina crucible and sealed with an alumina lid, using OmegaBond™ "400" high temperature air-set cement. The batch was then heated to 150° C., held there for 2 hours, then cooled at a rate of 2° C./h to 900° C., whereupon it was cooled to room temperature at a rate of 50° C./h.

Figure 25:
FIG. 25 is a photomicrograph of numerous textured PZN-PT crystals grown according to the method of the invention.

The crystal growth process resulted in formation of numerous PZN-PT crystals of several mm to 1 cm diameter. At the top of the growth mass, an assemblage of textured crystallites was observed. These are shown in FIG. 25. This result provides additional experimental confirmation of the process provided by the invention of growing a textured polycrystal by nucleating smaller faceted crystals and allowing them to align against a surface. It further experimentally confinns that a range of textured polycrystal material systems can be produced by the method provided by the invention, and indeed, this growth technique can be generally applied to a process in which crystals are to be grown from a liquid. This experiment in itself is thus not meant to be limiting but instead to be demonstrative of the techniques contemplated by the invention.

EXAMPLE 10

Diffraction Analysis of High Strain Tetragonal Crystal

Figure 26:
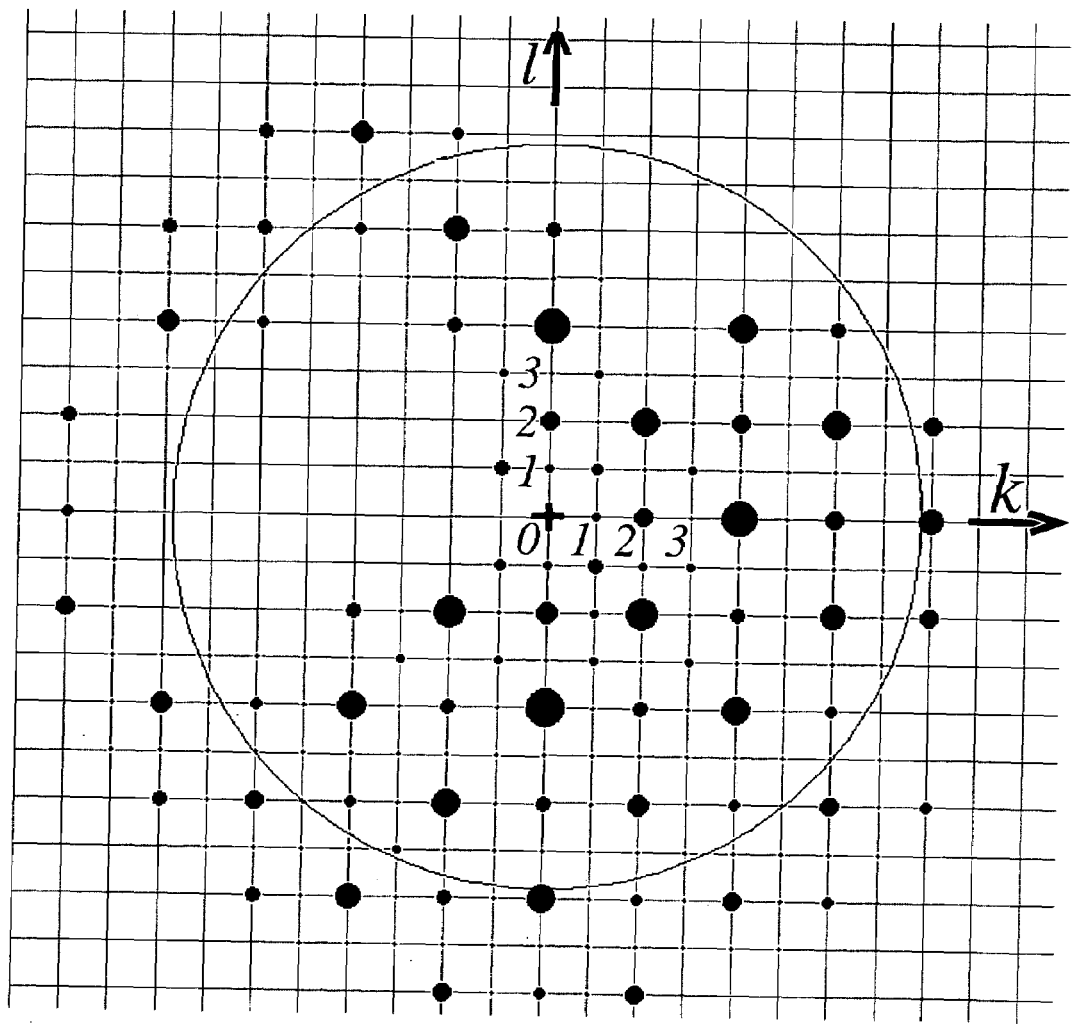
FIG. 26 is a reciprocal lattice net diffraction pattern for crystal designated as NBT_08 3.

Single crystal X-ray diffraction experiments were conducted using Mo-radiation on Siemens SMART CCD Single Crystal Diffractometer (Bruker AXS Inc., Madison, Wis.) and the diffraction data were analyzed using Siemens SMART software package. An irregular shaped 0.2 mm in size piece of NBT_08 3 crystal was analyzed. As a result, the lattice symmetry and parameters were determined, and the intensity-weighted reciprocal lattice net was built. Due to a presence of multiple ferroelectric domains the sample was analyzed as having triclinic symmetry with a slight distortion from a cubic symmetry: cell edges 7.813, 7.818 and 7.808 A and cell angles 89.98°, 89.99° and 90.00°. The cell size is doubled compared to a simple perovskite structure having the cell size of ~4 A. This doubling of the unit cell is caused by a long range ordering or octahedral tilt and is manifested by the superlattice reflections present on the intensity-weighed reciprocal lattice net. FIG. 26 presents a O-layer of the reciprocal lattice net. The superlattice reflections are those situated on the odd index grid-lines. The reciprocal lattice pattern indicates that the supercell is primitive: no systematic absences are observed. The crystal NBT_08 7 showed qualitatively identical results with a lower peak to background ratio in the diffraction pattern.

Figure 27:
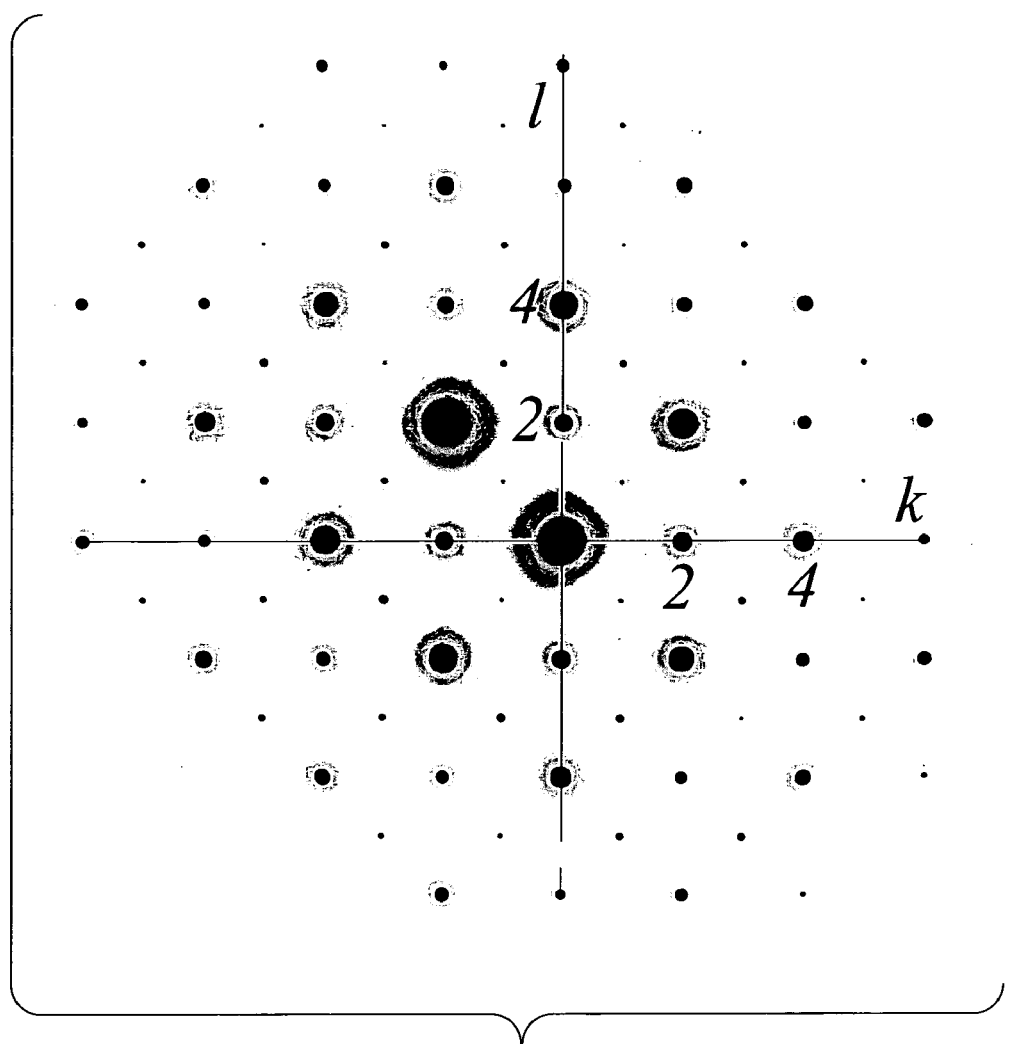
FIG. 27 is a electron diffraction pattern for crystal with double cell indexing designated as NBT_08 25.

Electron diffraction experiments were conducted using transmission electron microscope JEOL 2000 FX (JEOL USA Inc., Peabody, Mass.) with 200 kV accelerating voltage. A slice of a crystal NBT_08 25 of composition $Na_{0.501}Bi_{0.444}Ba_{0.078}TiO_3$ was analyzed. Size of the diffraction-producing region was about 1 μm. FIG. 27 represents the electron diffraction pattern of the sample with double cell indexing. Again, the pattern has superlattice reflections {110}. However, {100} reflections are not observed. Both diffraction experiments show that sodium bismuth titanate doped with barium titanate possesses a superstructure caused. The corresponding supercell has dimensions two times that of the single perovskite cell. The systematic presence of {110} reflections in both diffraction experiments excludes the face-centered, NaCl-type supercell that is the only super-structure previously known in NBT. Thus a supercell with twice the lattice parameter of the single perovskite cell is a unique characteristic of the materials exemplified by this invention. The difference in the results of single crystal diffraction and electron diffraction is due to the difference in composition of the two analyzed samples.

EXAMPLE 11

Growth of Single Crystal Fibers by the EFG Method

Figure 28:
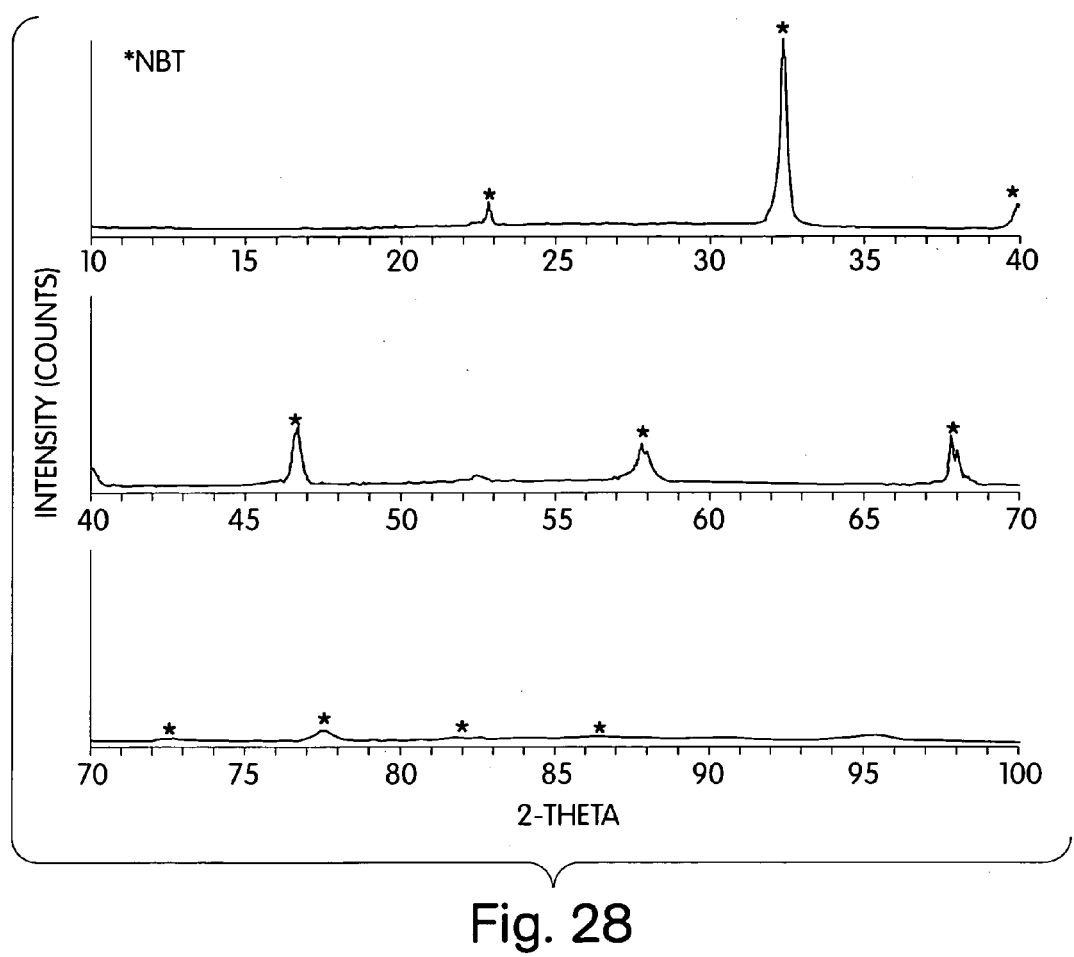
FIG. 28 is an XRD pattern for the congruently melting crystal of Example 11.

Single crystals from previous growth runs in the NBT-BT system containing molar % and 10 molar % $BaTiO_3$ and being nearly stoichiometric in cation composition, were tested for congruency of melting. The crystals were sealed in platinum foil containers and melted at 1260° C., then rapidly cooled and examined by X-ray diffraction at 1°/min scan rate. FIG. 28 shows the X-ray diffractogram from the sample containing 5.5 molar % $BaTiO_3$. No diffraction peaks other than those for the perovskite phase are observed, showing that the composition melts congruently. Similar results were observed in the case of the 10% $BaTiO_3$ sample. Thus it is shown that NBT-BT compositions with between 5.5 and 10 molar % $BaTiO_3$ melt congruently. This in turn shows that direct growth of single crystals and fibers from the melt of these doped compositions is in principle possible.

Edge-defined, film-fed growth (EFG) experiments were conducted using a BCG 365 Crystal grower (T.E. Brown (Barrington) & Co., Cambridge, England) equipped with a B-100 RF generator (Lindberg, Chicago, Ill.). A porous ceramic heat insulation was used to reduce heat loss and temperature gradients.

3 g of crystals from the BNT_08 batch were put into a platinum crucible and melted. The cooled melt was covered with a platinum boat-shaped die having 0.3 mm, diameter hole. The assembly was heated to ~1330° C. and kept at this temperature. After melting, a 0.3 mm diameter platinum wire was lowered to touch the melt and form a liquid neck with the melt through the hole in the die. When the neck was formed, the wire was pulled up at the rate of 18 mm/hr. Due to the gradient of temperature from the melt to the wire, the crystallization occurred at the melt—wire boundary. The resultant crystal had a cylindrical shape and was ~0.3 mm in diameter and ~4 mm long. Microscopic study of this rod proved it to be polycrystalline.

Figure 29:
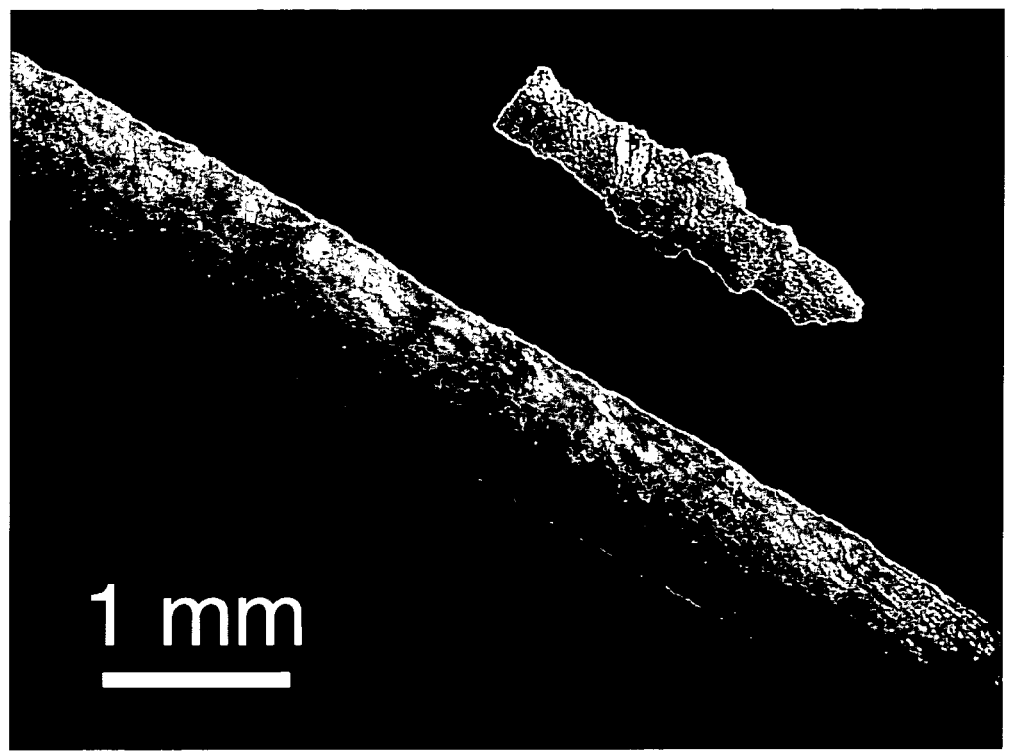
FIG. 29 is photomicrograph of the single crystal fiber of Example 11.

Another EFG experiment was carried out using a platinum die having 0.5 diameter 5 hole and a single crystal from the BNT_08 batch attached to a platinum wire as a seed. The pulling rate was 25 mm/hr. All other conditions were the same as in the previous experiment. The resultant crystal had a cylindrical shape and was 0.8–0.9 mm in diameter and ~60 mm long. Microscopic study of this filament proved it to be a single crystal. The crystals grown in the described two EFG experiments are shown on FIG. 29. Optical microscopy of the polished cross-section of the larger crystal showed ferroelectric domain patterns. Thus it is shown that the NBT-BT compositions described herein, being congruently melting compounds, can be grown as single crystal fibers. Additional experiments using a $SrTiO_3$ single crystal seed oriented with the [001] direction along the growth direction to nucleate the single crystal fiber showed that the aforedescribed congruently melting NBT-BT compositions could be grown as crystallographically oriented single crystal fibers. Additional growth experiments on $(Na_{1/2}Bi_{1/2})_{1-x}Ba_x$ $(Ti_{1-x}Zr_y)O_3$ compositions in which x is between 0.01 and 0.2 and y is between 0.01 and 0.1 showed that crystallographically oriented single crystal fibers of both rhombohedral and tetragonal perovskite phases in this composition could be grown using the EFG technique and $SrTiO_3$ single crystal seeds with the [001] or [111] axis oriented along the axis of the fiber.

EXAMPLE 12

Figure 30A:
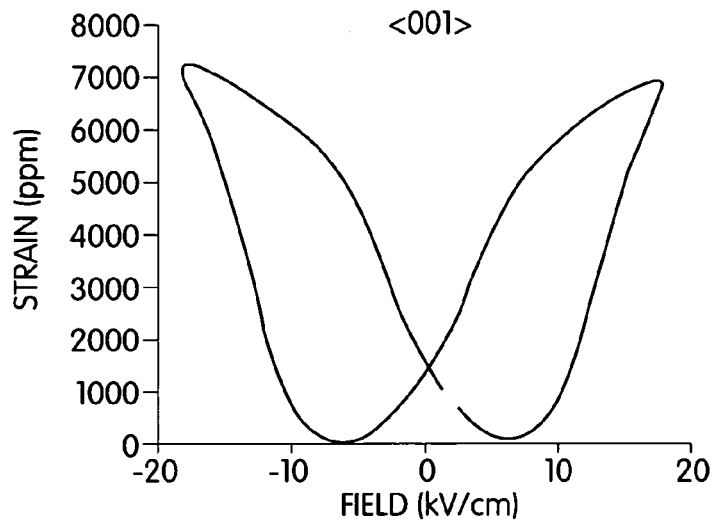
FIG. 30 is a series of plots of electric field-induced strain vs. electric field for (a) ⟨001⟩, (b) ⟨011⟩, (c) ⟨011⟩) oriented PZN-PT single crystal planes.
Figure 30B:
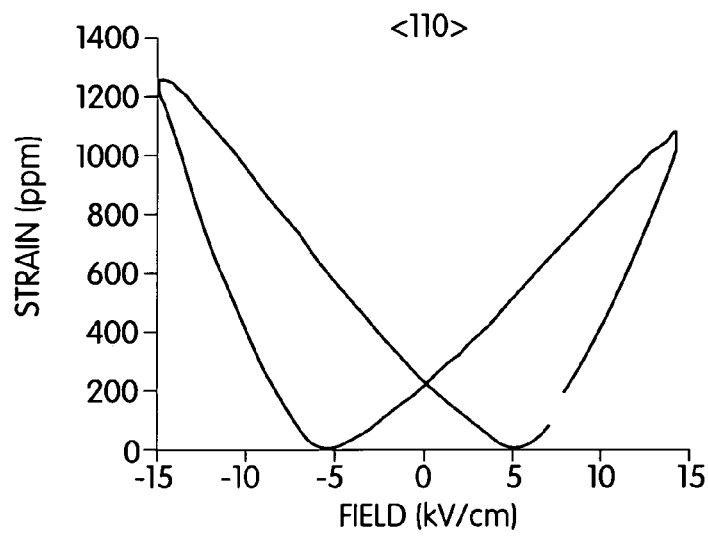
Figure 30C:
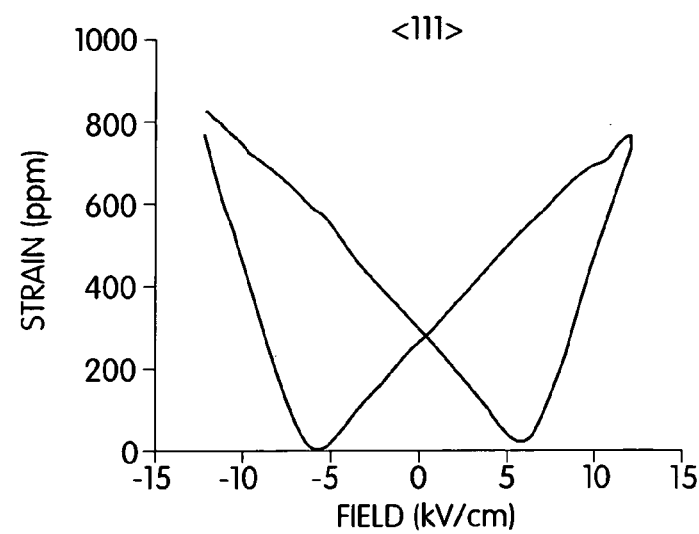

Orientation Dependence of Piezoelectric Actuation in Tetragonal Phase Perovskite A PZN-PT sinale crystal of composition $0.89PbZn_{1/3}Nb_{2/3}O_3$-$0.11PbTiO_3$ was grown according to the method of Example 9. X-ray diffraction showed that the crystal was of tetragonal symmetry. The crystal was oriented and cut into three plates, each 0.8 mm thick and 4–5 mm in the other two dimensions. The normals of the faces of the plates were oriented in the ⟨001⟩, ⟨011⟩ and ⟨111⟩ directions of the corresponding cubic phase, respectively. The plates were electroded on both sides by sputtering about 1 micrometer thick layers of gold. FIG. 30 shows the strain vs. electric field behavior of the three plates. It is clearly seen that the ⟨001⟩ oriented plate has the greatest hysteresis, similar to that seen in FIG. 4. However, the (011) and ⟨0.111⟩, oriented plates have significantly reduced hysteresis. The decreasing hysteresis is understood to result from a decrease in the maximum possible fraction of ferroelectric domains having their polarization vector at 90° to the direction of the applied field (coincident to the plate normal). Thus, it is shown that actuation of a tetragonal phase perovskite piezoelectric out of the direction of spontaneous polarization results in lower hysteresis actuation. It is expected that poling of the (011) and (111) oriented plates would result in further reduction of the hysteresis.

EXAMPLE 13

Figure 33A:
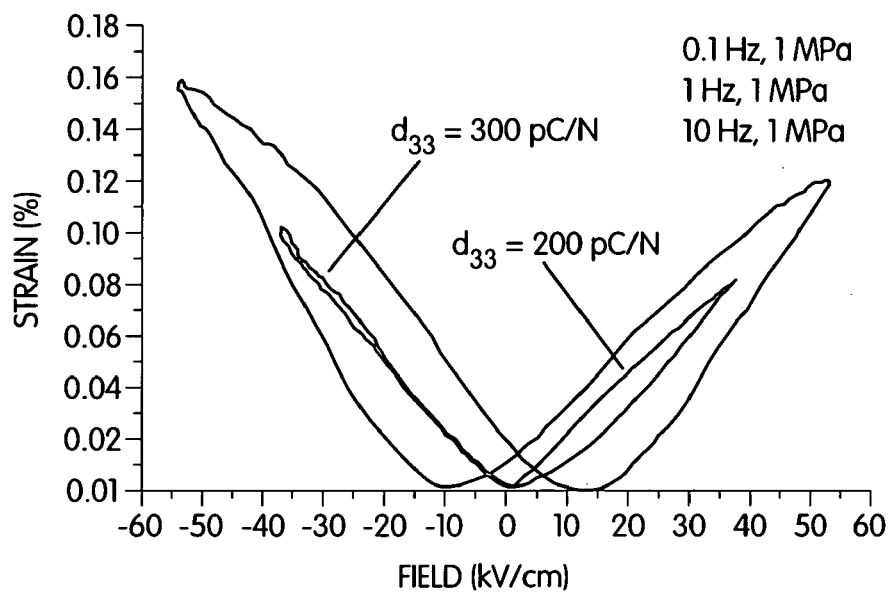
FIG. 33 illustrates the relaxor properties of a polycrystalline (Ba+Zr) co-doped NBT material of the invention in which (A) is a plot of % strain vs. applied field strength, (B) is a plot of polarization with field strength, and (C) is a plot of dielectric $\in_r$ as a function of temperature.
Figure 33C:
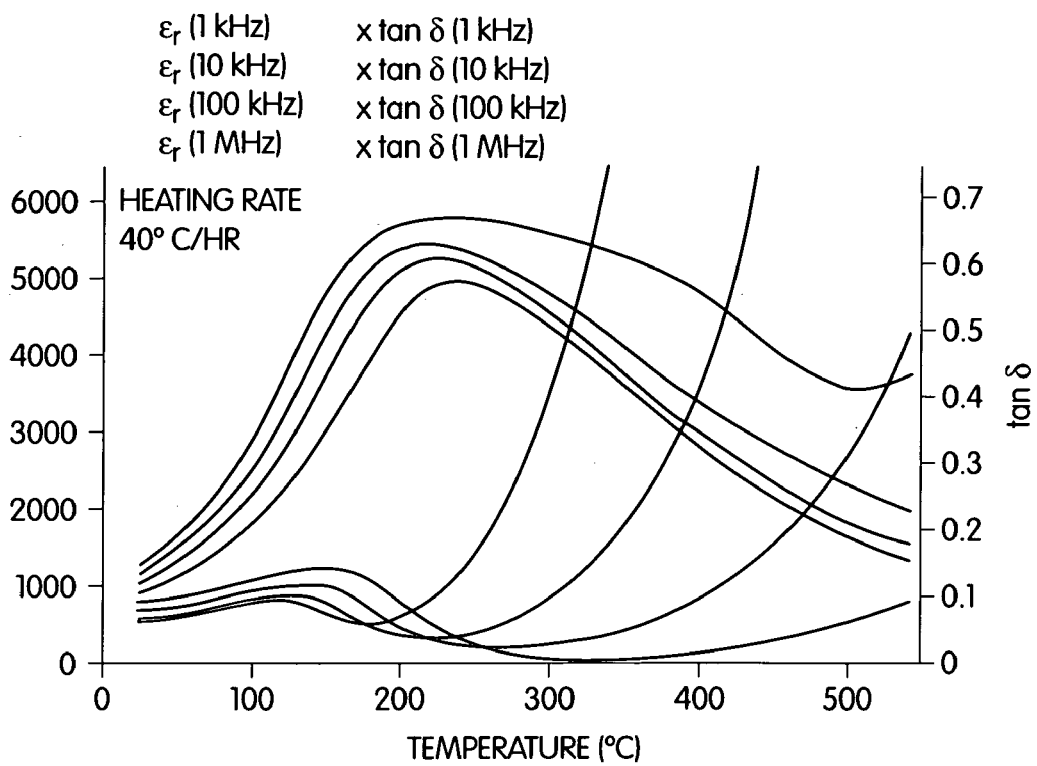
Figure 33B:
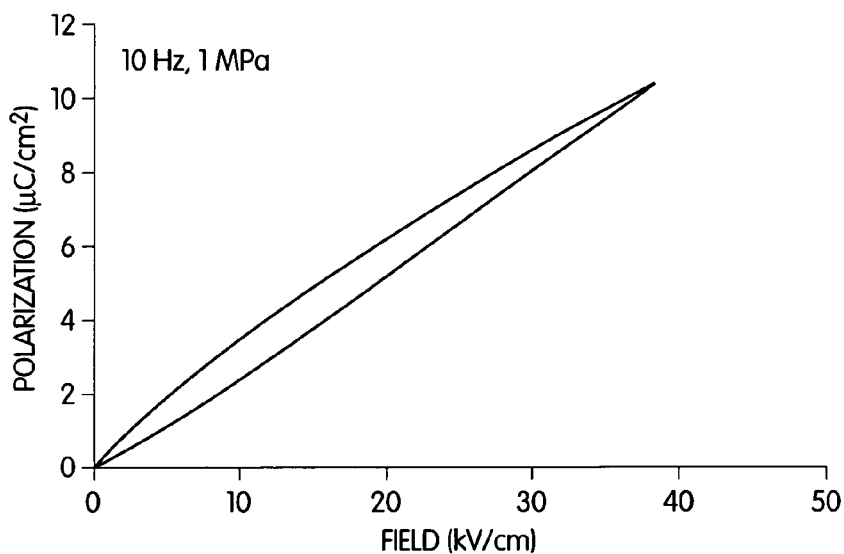
Figure 34A:
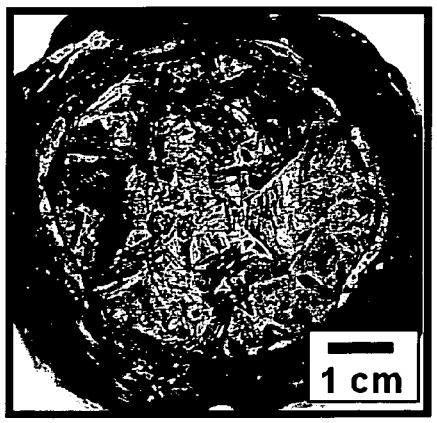
FIG. 34 is a series photomicrographs illustrating the growth and optical analysis of (Ba+Zr) co-doped NBT single crystals.
Figure 34B:
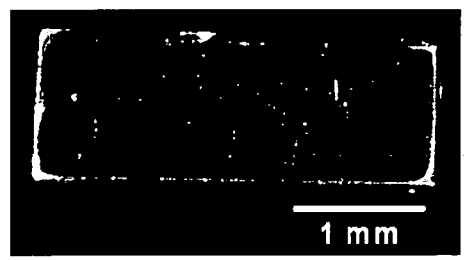
Figure 34C:
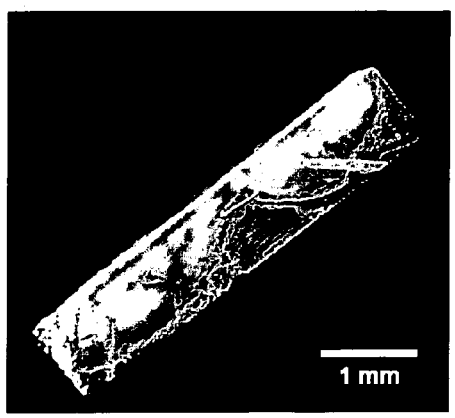
Figure 34D:
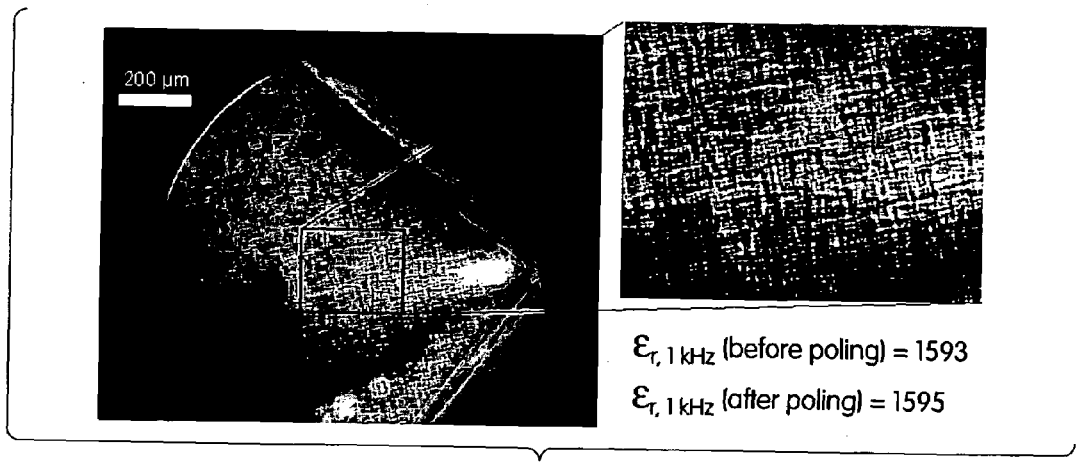

This example demonstrates the effect on electromechanical properties for solid solutions $Na_{(1/2-x/2)}Bi_{(1/2-x/2)}Ba_{(x)}Ti_{(1-y)}Zr_{(y)}O_3$ in which x and y have been systematically varied A polycrystalline sintered sample identified as z3b12_pellet_3-1 contains 3 mole % Zr on the B-site and 12 mole % Ba on the A-site. This sample was shown to be a relaxor through various measurements which are illustrated in FIGS. 33A–C. It did not pole, as determined by the minimal change in dielectric constant before and after poling, and can be concluded to not retain field-oriented ferroelectric domains, if present. See, FIG. 33B. X-ray diffraction showed that it was of tetragonal perovskite phase. Dielectric measurements as a function of temperature and frequency showed strong frequency dispersion below 200 C, characteristic of a relaxor dielectric. See, FIG. 33C. The dielectric loss factor, tan ( ), showed a maximum in the region of highest frequency dispersion of the dielectric constant, 125–175 C, which is also characteristic of a relaxor. Measurements of electric field induced strain (FIG. 33A) showed that this polycrystal reaches 0.16% strain at ~55 kV/cm, which is a higher strain than commercial PMN relaxors can reach at room temperature. At higher frequencies and fields the strain has a "butterfly" loop shape and the polarization loops show some indication of saturation, indicating some contribution of domain-switching ferroelectricity.

A series of tetragonal phase Ba+Zr co-doped single crystals were grown using the flux method as previously described, and cut and oriented along the cubic {100} faces (FIGS. 34A–D). Electron microprobe microanalysis showed that the following crystal had the doping levels: z3b8_1a 12 mole % Ba, 4 mole % Zr.

Figure 35:
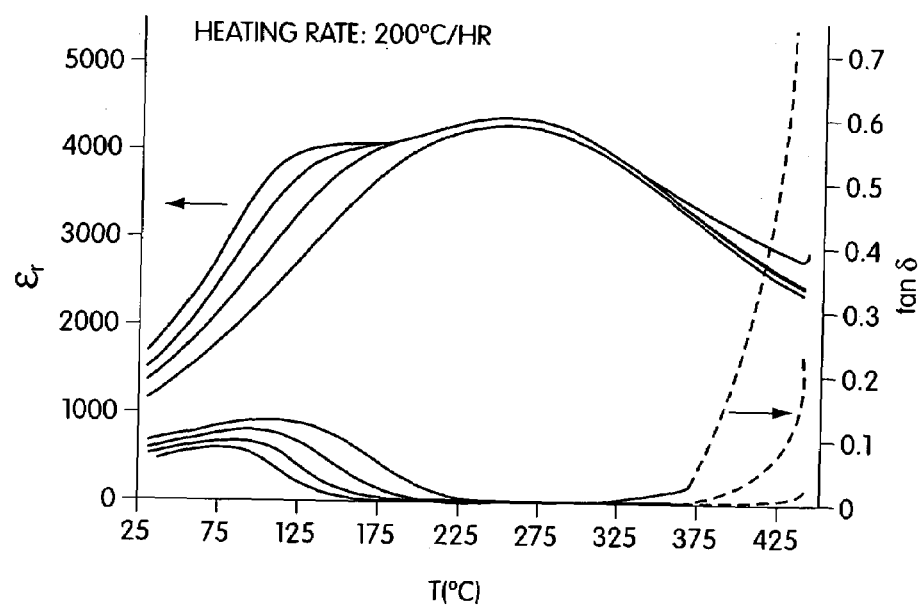
FIG. 35 is a plot of polarization with field strength, and s a plot of dielectric $\in_r$ as a function of temperature for (Ba+Zr) co-doped NBT single crystals.
Figure 36A:
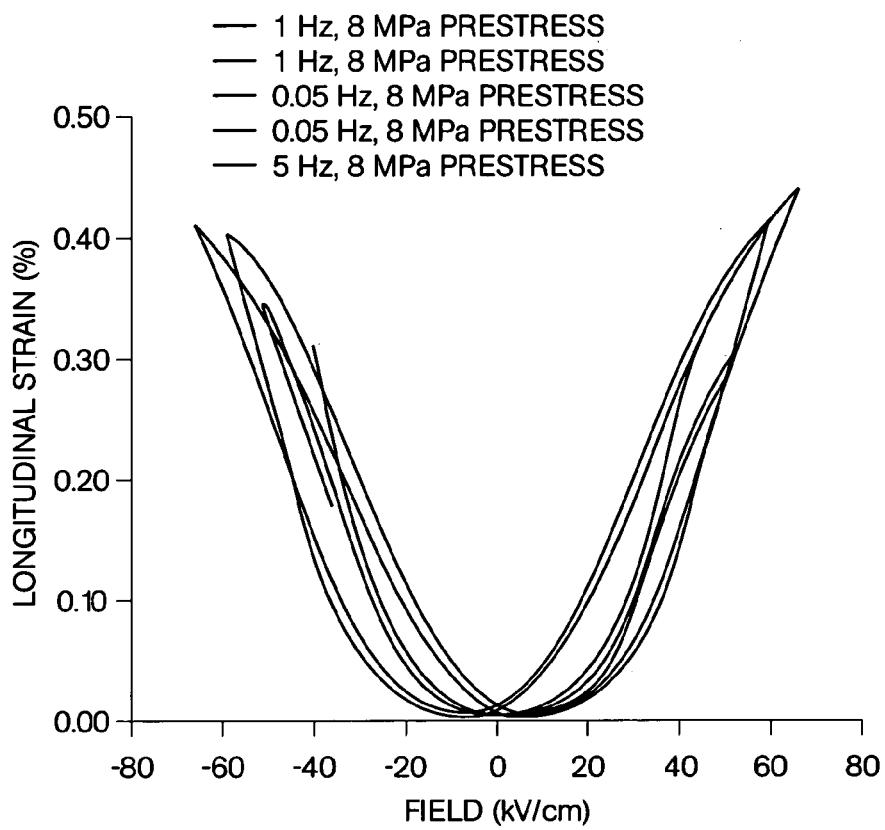
FIG. 36 is (A) a plot of % strain, and (B) a plot of the piezoelectric constant $d_{33}$ vs. field strength for (Ba+Zr) co-doped NBT single crystals.
Figure 36B:
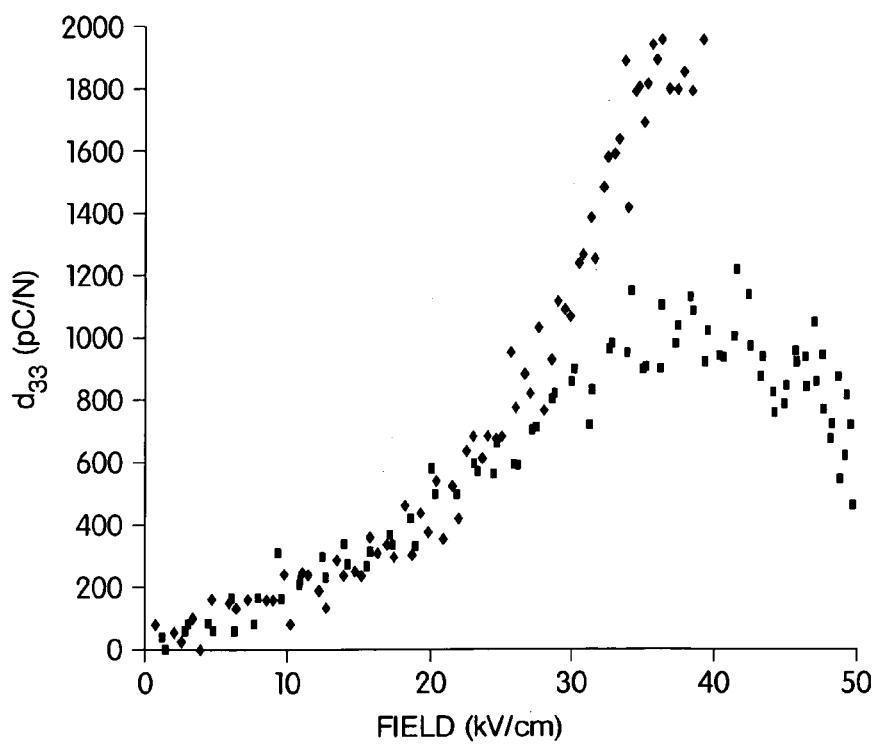
Figure 37:
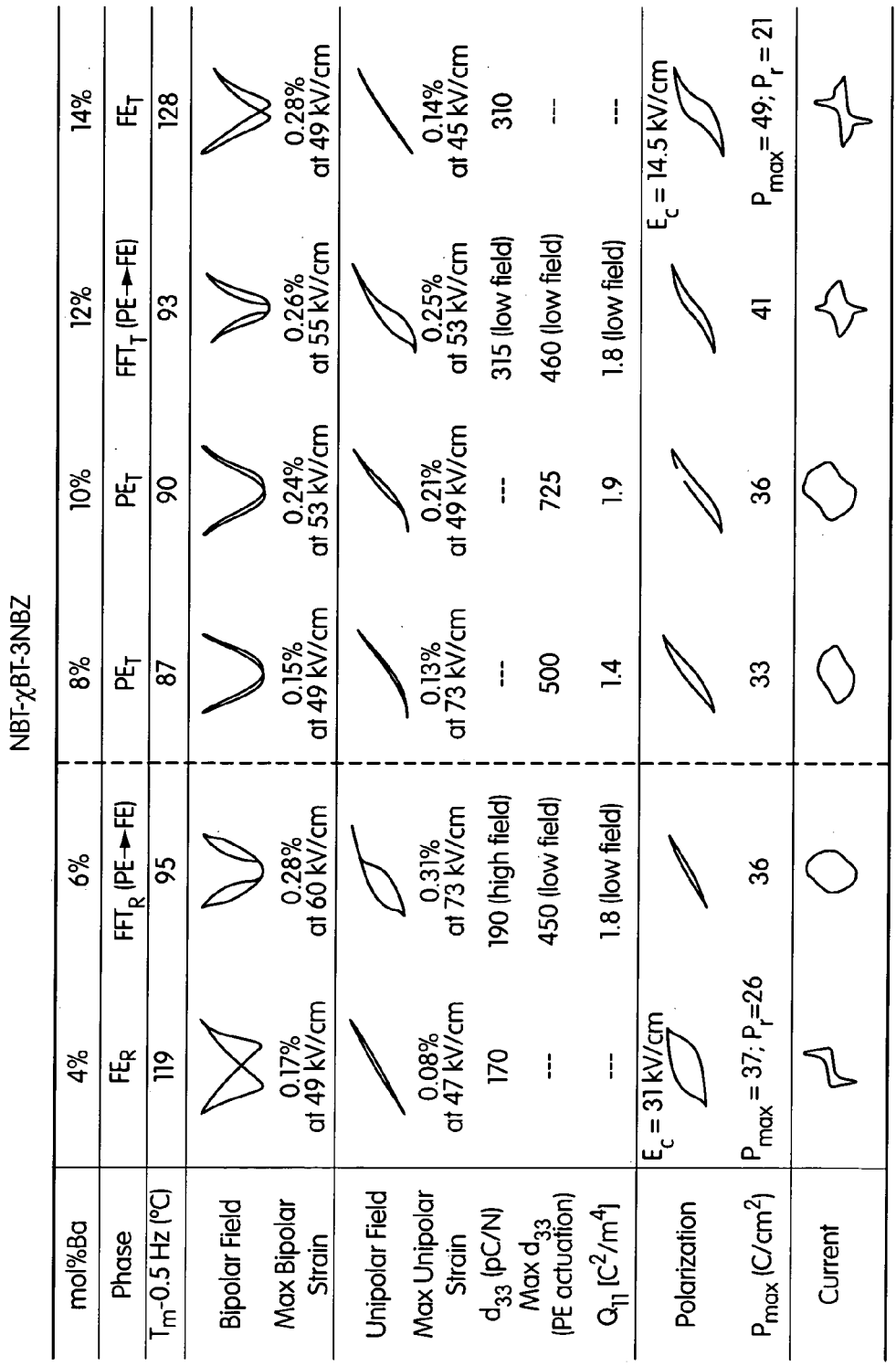
FIG. 37 is a table summarizing the trend in actuation and polarization character for 3 mol % $Zr^{4+}$ composition with increasing $Ba^{2+}$ concentration in the NBT-xBT-3NBZ system.

Dielectric constant vs temperature measurements of z3b8_1a showed strong frequency dispersion below 200 C, and a peak in the dielectric loss in the same temperature range, characteristic of a relaxor (FIG. 35). Strain field measurements reached 0.45% strain at ~65 kV/cm, with indication of some saturation (FIGS. 36A–B). At lower fields, the strain was nearly parabolic with polarization, as expected for an electrostrictive material.

A rhombohedral crystal z3b6_5b showed qualitatively similar behavior but the frequency dispersion of dielectric constant was less strong and the dielectric constant at room temperature was lower, ~1000, vs. ~1500 for z3b8_1a. The field induced strain was also approximately parabolic and reached ~0.043% at ~50 kV/cm.

This demonstrates that both rhombohedral and tetragonal phase crystals are relaxors in this system, and in the above compositions neither poles in a manner characteristic of a conventional ferroelectric. However, the tetragonal crystal which contains more Ba has higher dielectric constant at low temperature, and also greater field induced strain. Thus it is shown that by doping with Zr on the B-site, a higher concentration of Ba can be introduced on the A-site without resulting in a ferroelectric phase at room temperature as in the case of $NBT$-$BaTiO_3$ solid solutions with $BaTiO_3$ concentrations above the MPB composition (~6% $BaTiO_3$). It is therefore seen that the Curie temperature is lowered by appropriate Ba+Zr codoping, revealing the relaxor behavior.

In the (Ba+Zr)codoped NBT system, both the calculations of tolerance factor and the experiments show that the MPB moves rapidly to higher Ba concentrations upon adding Zr. This allows higher Ba doping on the A-site while remaining near the MPB in composition. In the (Ba+Hf) codoped NBT system, similar behavior is expected since the MPB between $BaTiO_3$ and the cubic perovskite $BaZrO_3$ lies at ~20% BZ, and that between $BaTiO_3$ and cubic $BaHfO_3$ is not very different, being at ~23% BH. $Hf^{4+}$ also has a similar ion size to $Zr^{4+}$ but a higher ion polarizability. (Ba+Hf) codoped NBT is also expected to provide excellent electromechanical properties, as shown in Example 16.

EXAMPLE 14

The preparation and testing of polycrystalline materials having a range of barium and zirconium dopant levels are described. Details of sample preparation and measurement is found in the Master's Theses of Sossity Sheets, *Dielectric and Electrolmechanical Properties of Barium and Zirconium Co-Doped Sodium Bismuth Titanate*, Massachustts's Institute of Technolgy, Department of Materials Science and Engineering, Cambridge, Mass. (2000), which is hereby incorporated in its entirety by reference.

High purity (>99% purity), ultra-fine grain size (≦1 μm) starting powders of $Na_2CO_3$, $Bi_2O_3$, $BaCO_3$, $TiO_2$, and $ZrO_2$ were mixed in 15, 20, or 25 g sized batches according to the intended nominal stoichiometric composition (Table 2). Powder batches were designated "p#," where each number represents a separate powder batch.

TABLE 2

Nominal Batch Compositions for (Ba + Zr) Co-Doped Polycrystals
$(Na_{1/2}Bi_{1/2})_{1-x}Ba_x(Ti_{1-y}Zr_y)O_3$

| Batch ID | mole fraction $Ba^{2+}$ (x) | mole fraction $Zr^{4+}$ (y) |
| --- | --- | --- |
| p1 | 0.04 | 0.03 |
| p2 | 0.06 | 0.03 |
| p3 | 0.08 | 0.03 |
| p4 | 0.10 | 0.03 |
| p5 | 0.12 | 0.03 |
| p6 | 0.12 | 0.03 |
| p7 | 0.14 | 0.03 |
| p8 | 0.07 | 0.04 |
| p9 | 0.09 | 0.04 |
| p10 | 0.12 | 0.04 |
| p11 | 0.14 | 0.04 |
| p12 | 0.09 | 0.09 |
| p13 | 0.11 | 0.05 |
| p14 | 0.09 | 0.07 |
| p15 | 0.13 | 0.11 |
| p16 | 0.12 | 0.08 |
| p17 | 0.10 | 0.06 |
| p18 | 0.12 | 0.07 |
| p19 | 0.11 | 0.07 |
| p20 | 0.10 | 0.10 |
| p21 | 0.15 | 0.14 |
| p22 | 0.20 | 0.22 |
| p23 | 0.25 | 0.30 |

The mixed powders were formed into uniform slurries by the addition of ethanol (15–20 ml for 20 g batch, ~45 ml for 100 g crystal growth batch). Slurries were ball-milled with cylindrical (¼"-radius ended) zirconia media on a roller mill for 15~20 hours. Once dried, the soft, yellowish precursor powders were ground with a zirconia mortar and pestle, transferred to a covered alumina crucible and calcined in air at 800° C. for 3 hours. After the first calcination, the now ivory-colored powders were highly agglomerated, but easily crumbled. After grinding vigorously with a zirconia mortar and pestle, the powders were calcined a second time in air at 1000° C. for 20 hours, heating to 1000° C. and cooling to 800° C. at 100° C./hr. Cooling below 800° C. proceeded at an unpowered rate to room temperature. After the second calcination, powders were white and highly agglomerated, but soft. X-ray powder diffraction confirmed single-phase perovskite with minor second phase (<1 vol %).

Only one powder batch was not calcined at 1000° C. Batch p6 was calined twice: in air at 800° C. for 3 hours and in air at 950° C. for 6 hours with the same heating and cooling rates described above. X-ray powder diffraction confirmed that pressed samples became single phase with minor second phase (~5 vol %) during the sintering process.

Dense polycrystalline samples were prepared for dielectric and electromechanical characterization from each of the powder batches listed in Table 2.1. Between 0.8 and 1 g of powder was weighed out and ground in a zirconia mortar.

To promote easier handling, the powder was mixed with a polymer binder, polyvinyl alcohol, before pressing. The powder and binder mixture was then pressed through a 500 μm mesh nylon screen. This produced evenly sized granules that flowed smoothly and packed densely. The coated granules were poured into a ½" die that had been lubricated with a thin layer of oleic acid. Samples were pressed by slowly increasing pressure, holding 1 minute every 30 MPa until a maximum of ~100 MPa was reached. The maximum pressure was held for 5 minutes before releasing. Pressing resulted in a highly consolidated green body with disc geometry. Discs were sintered in air at 1200° C. for 4 hours with a heating rate of 100°/hr to maximum temperature and a controlled cooling rate of 100°/hr to 800° C. The sintered discs were approximately 10 mm in diameter with thickness between 1–2 mm and were near-full density (>95% of the crystal density).

EPMA composition analyses of polycrystalline samples are reported in Table 3. The rhombohedral (R)/tetragonal (T) morphotropic phase boundary (MPB) was located to within 2 mol % Ba at a constant Zr level up to ~10 mol % Zr, and showed excellent agreement with the structure predictions using the relative tolerance factor method.

TABLE 3

Composition (EPMA) and Phase (XRD) for Co-Doped Polycrystals compositions given in mole fraction (normalized to unity on B-site except where indicated by *)

| Sample ID | Nominal (Ba/Zr) | Na | Bi | Ba | Ti | Zr | O | (Na + Bi + Ba)/ (Ti + Zr) | Symmetry |
| --- | --- | --- | --- | --- | --- | --- | --- | --- | --- |
| p1a | 4/3 | 0.52 | 0.44 | 0.04 | 0.93 | 0.03 | 2.88 | 1.04 | R |
| p2a | 6/3 | 0.50 | 0.44 | 0.06 | 0.92 | 0.03 | 2.86 | 1.05 | R |
| p3a | 8/3 | 0.48 | 0.44 | 0.08 | 0.97 | 0.03 | 2.97 | 0.99* | T |
| p4a | 10/3 | 0.47 | 0.43 | 0.10 | 0.95 | 0.03 | 2.94 | 1.02 | T |
| p5a | 12/3 | 0.47 | 0.42 | 0.11 | 0.91 | 0.03 | 2.86 | 1.06 | T |
| p6a | 12/3 | 0.47 | 0.42 | 0.12 | 0.94 | 0.03 | 2.91 | 1.03 | T |
| p6b | 12/3 | 0.48 | 0.41 | 0.12 | 0.97 | 0.03 | 2.97 | 1.00 | T |
| p7a | 14/3 | 0.45 | 0.41 | 0.14 | 0.97 | 0.03 | 2.97 | 0.99* | T |
| p8a | 7/4 | 0.47 | 0.45 | 0.07 | 0.96 | 0.04 | 2.97 | 0.98* | R |
| p9a | 9/4 | 0.48 | 0.43 | 0.09 | 0.92 | 0.04 | 2.88 | 1.04 | T |
| p10a | 12/4 | 0.45 | 0.43 | 0.12 | 0.94 | 0.04 | 2.94 | 1.02 | T |
| p11a | 14/4 | 0.46 | 0.41 | 0.14 | 0.93 | 0.04 | 2.91 | 1.03 | T |
| p12a | 9/9 | 0.49 | 0.43 | 0.09 | 0.88 | 0.08 | 2.86 | 1.05 | R |
| p13a | 11/5 | 0.48 | 0.41 | 0.11 | 0.91 | 0.05 | 2.88 | 1.04 | T |
| p14a | 9/7 | 0.48 | 0.44 | 0.09 | 0.90 | 0.07 | 2.91 | 1.03 | R |
| p15a | 13/11 | 0.44 | 0.43 | 0.12 | 0.84 | 0.10 | 2.83 | 1.06 | T |
| p16a | 12/8 | 0.46 | 0.42 | 0.12 | 0.88 | 0.08 | 2.88 | 1.04 | T |

TABLE 3-continued

Composition (EPMA) and Phase (XRD) for Co-Doped Polycrystals
compositions given in mole fraction
(normalized to unity on B-site except where indicated by *)

| Sample ID | Nominal (Ba/Zr) | Na | Bi | Ba | Ti | Zr | O | (Na + Bi + Ba)/ (Ti + Zr) | Symmetry |
|---|---|---|---|---|---|---|---|---|---|
| p17a | 6/10 | 0.48 | 0.42 | 0.10 | 0.92 | 0.06 | 2.94 | 1.02 | T |
| p18a | 12/7 | 0.47 | 0.42 | 0.11 | 0.89 | 0.07 | 2.86 | 1.05 | T |
| p19a | 11/7 | 0.48 | 0.42 | 0.10 | 0.85 | 0.06 | 2.75 | 1.09 | T |
| p20a | 10/10 | 0.47 | 0.43 | 0.10 | 0.86 | 0.09 | 2.86 | 1.06 | R |
| p21a | 15/14 | 0.45 | 0.41 | 0.14 | 0.80 | 0.13 | 2.86 | 1.07 | T |
| p22a | 20/22 | 0.42 | 0.38 | 0.20 | 0.76 | 0.22 | 2.94 | 1.02 | T |
| p23a | 25/30 | 0.39 | 0.36 | 0.26 | 0.70 | 0.29 | 2.97 | 1.02 | T |

*indicates composition was normalized to unity on the A-site
R = rhombohedral, T = tetragonal Room temperature dielectric constant in the NBT-BT-NBZ system is similar to that found in NBT-BT with $\epsilon_r$ ranging from 1200–1600 for less than 15% $Zr^{4+}$ and decreasing to ~750 for the highly-doped NBT-26BT-29NBZ sample. The maximum room temperature dielectric constant of $1.56 \times 10^3$ at 10 kHz was measured for NBT-10BT-3NBZ, which lies slightly to the tetragonal side of the MPB. Room temperature dielectric loss in the co-doped systems is lowest for NBT-4BT-3NBZ, tan $\delta$=0.0453 at 10 kHz. Magnitude of loss increases generally for increasing doping on both A- and B-sites, reaching a maximum of tan $\delta$=0.1301 at 10 kHz for NBT-26BT-29NBZ.

Doping with $BaTiO_3$ has been shown to shift the temperature of the FE→AFE transition downward to ~150° C. in polycrystals and closer to ~100° C. in single crystals. Doping simultaneously on the A- and B-sites in shows that the temperature of the dielectric maximum, $T_m$, can be shifted as low as ~60° C. in the highly doped sample p23a. The data demonstrated that controlled doping in NBT-BT-NBZ polycrystalline compositions shifts $T_m$ downward, such that at room temperature these compositions illustrate relaxor behavior.

Figure 38:
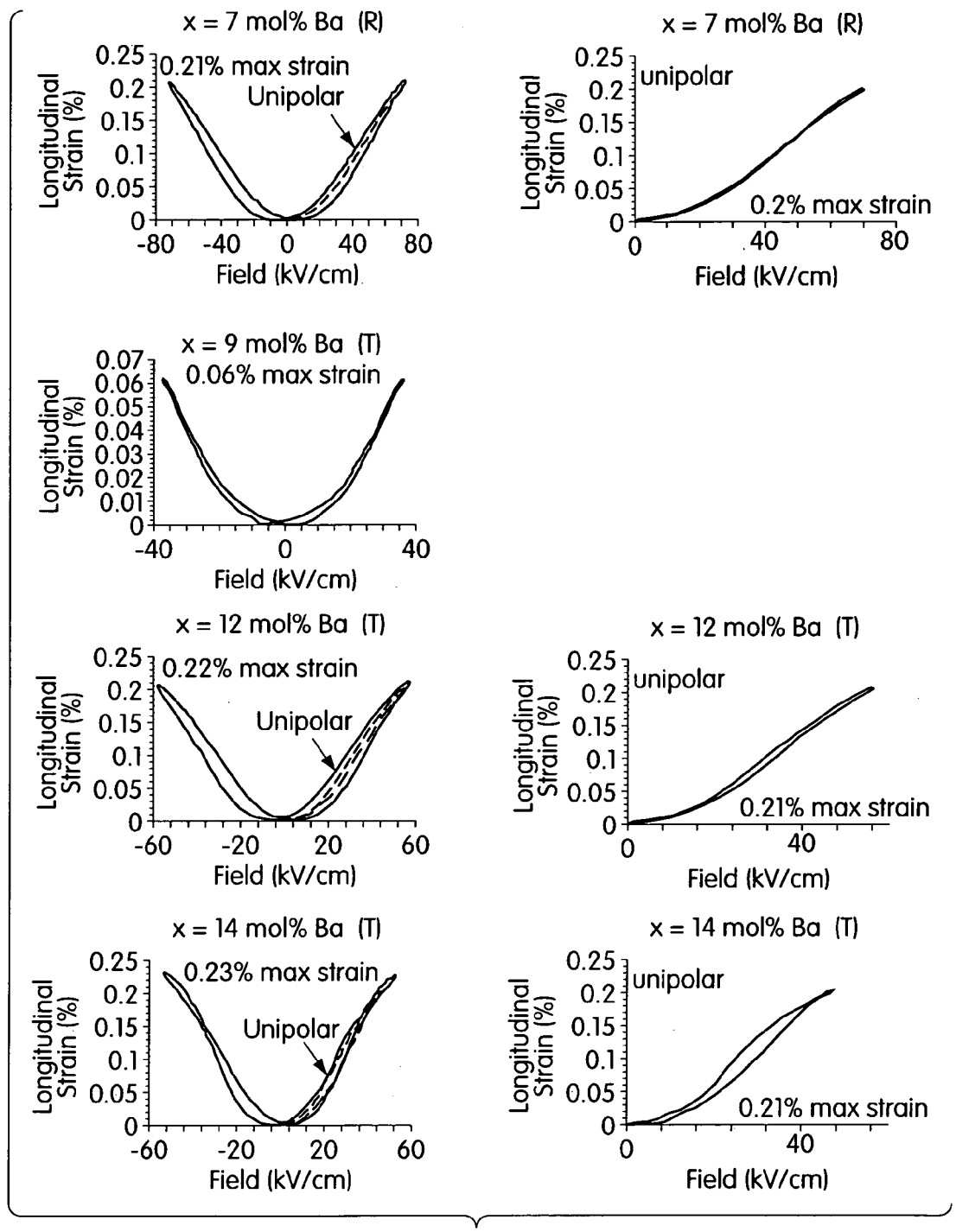
FIG. 38 is a plot of electrostrictive strain (bipolar and unipolar vs. field for PE phase NBT-xBT-4NBZ polycrystals.
Figure 39:
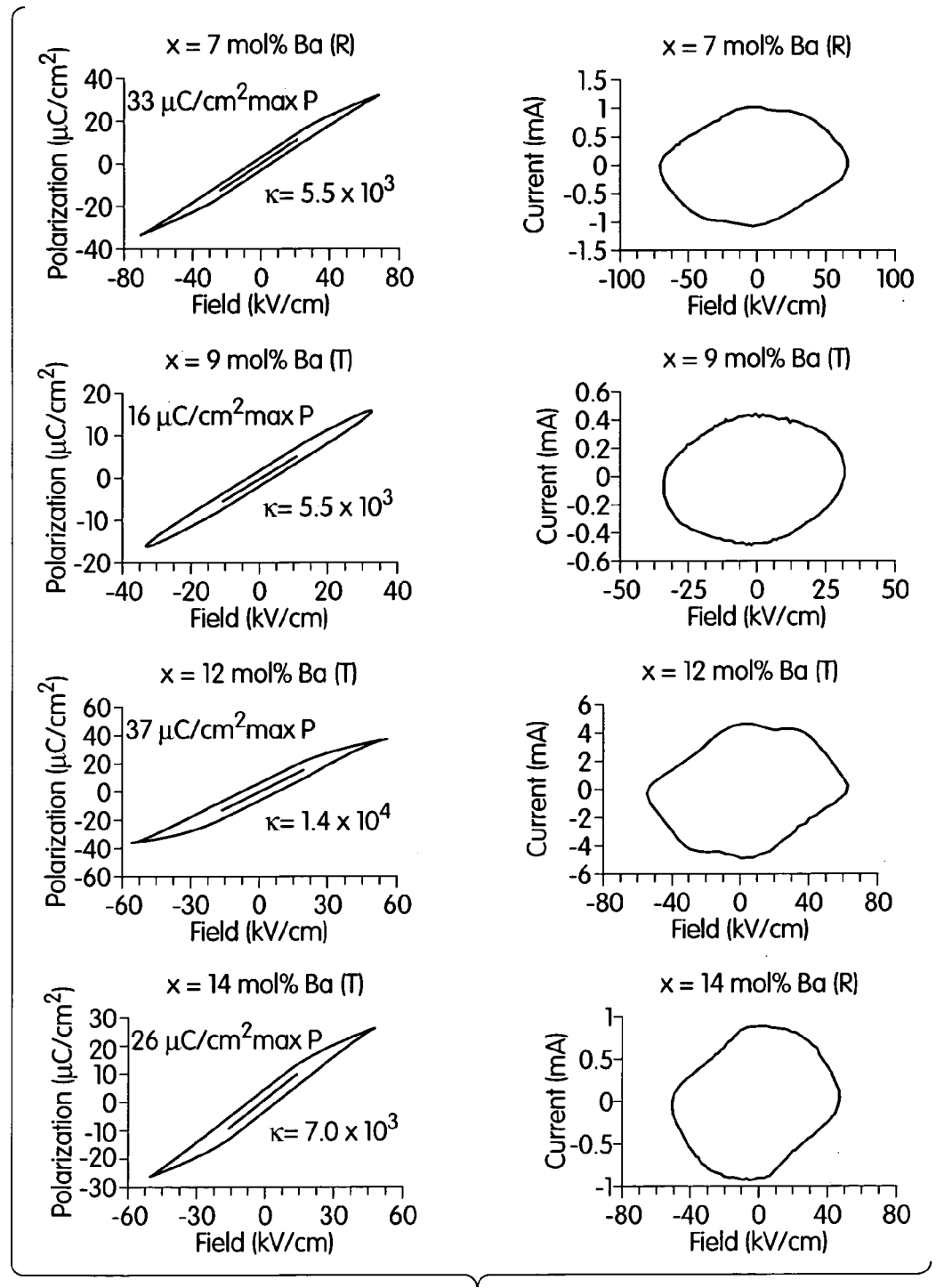
FIG. 39 is a plot of polarization and current vs. field for PE phase NBT-XBT-4NBZ polycrystals.
Figure 40A:
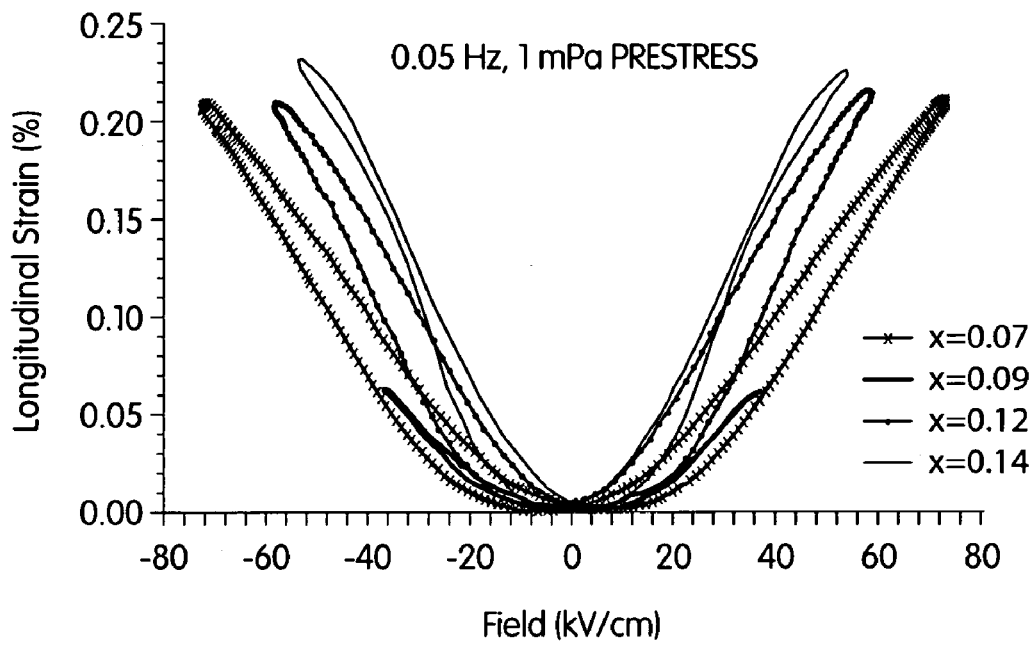
FIG. 40 is (A) a plot of electrostrictive bipolar strain and (B) electrostrictive polarization vs. field for PE phase NBT-xBT-4NBZ polycrystals.
Figure 40B:
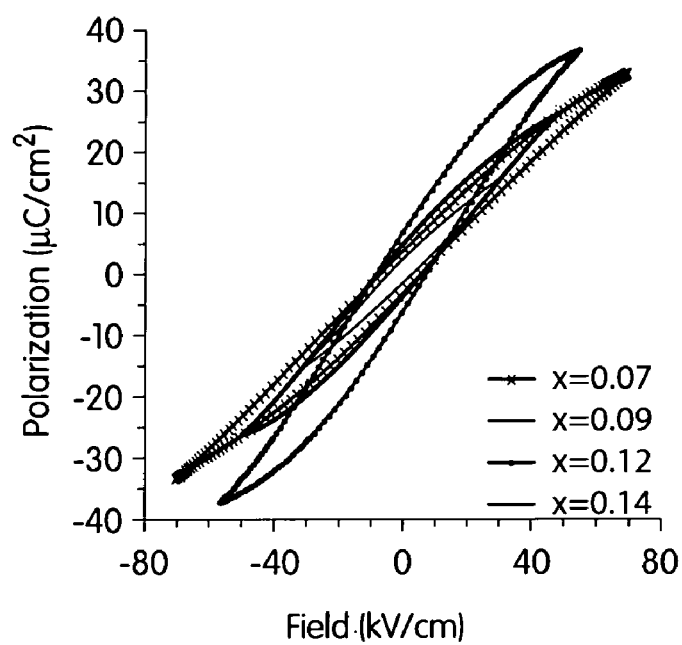
Figure 41:
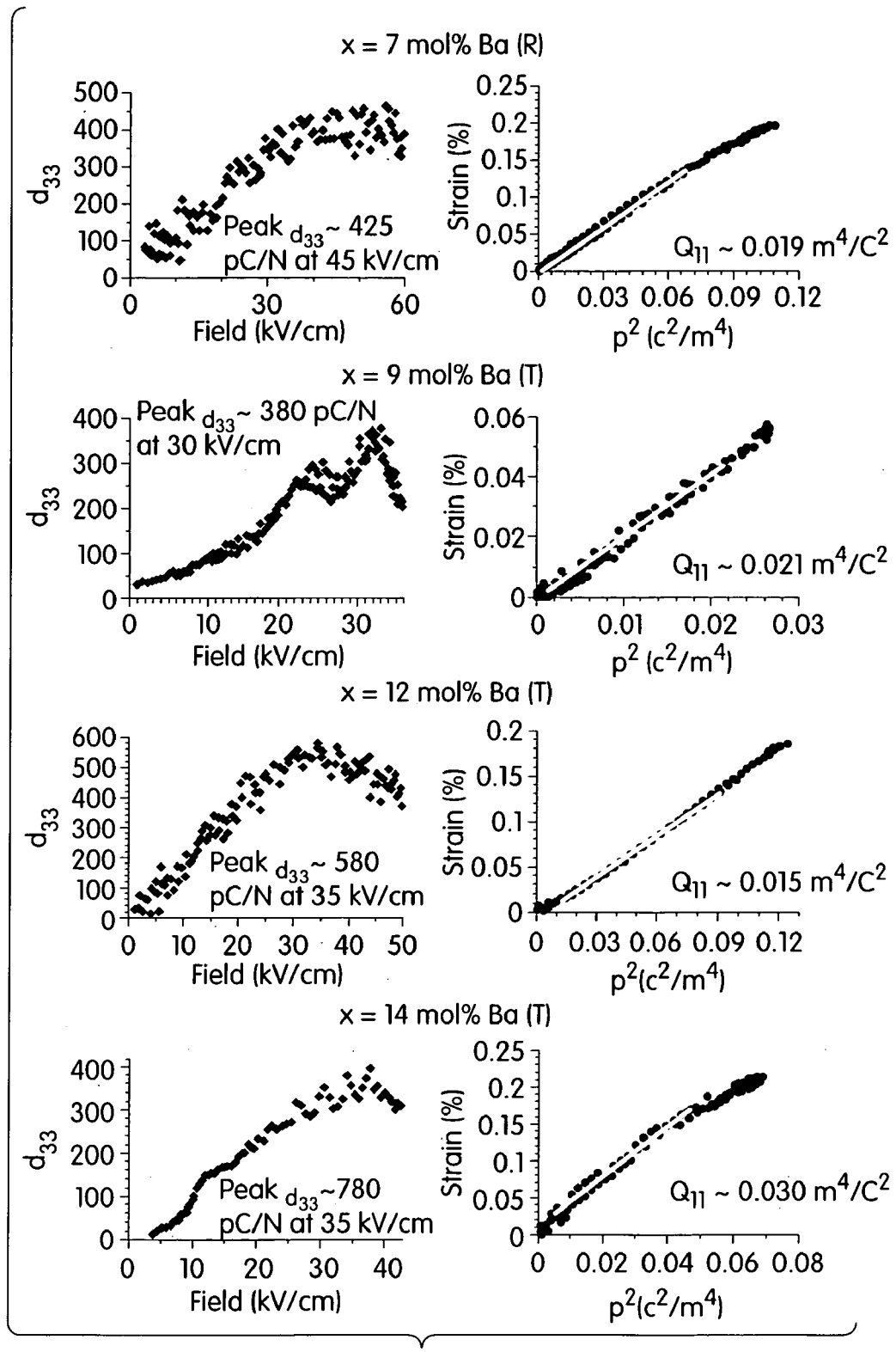
FIG. 41 is a plot of electrostrictive properties $d_{33}$ and $Q_{11}$ of PE phase NBT-xBT-4NBZ polycrystals.

FIG. 38 provides an summary to the trends in actuation and polarization observed in the system $(Na_{1/2}Bi_{1/2})_{1-x}Ba_x(Ti_{0.97}Zr_{0.03})$. Initially poled rhombohedral p1b (4 mol % Ba) actuated under ac field shows initial signs of depoling around ~26 kV/cm. A maximum bipolar field induced strain of 0.17% at 49 kV/cm and 0.05 Hz was achieved in sample p1a. The unipolar strain is highly linear with low hysteresis at 0.05 Hz. Calculated from the slope of the unipolar strain driven to a maximum strain of 0.08% at 47 kV/cm, $d_{33}$=170 pC/N. Thus, the $d_{33}$ of the rhombohedral ferroelectric NBT-4BT-3NBZ exceeds the highest values previously reported for polycrystalline NBT-BT, for which $d_{33}$=125 pC/N. The maximum saturated polarization at ac fields of 47 kV/cm reaches 37 µC/cm² with a coercive field $E_c$~31 kV/cm and remnant polarization $P_r$~261 µC/cm². P is slightly higher than the observed $P_r$~20 µC/cm² in NBT-BT.

Initially poled tetragonal sample p7b (14 mol % Ba) actuated under ac field showed qualitatively similar characteristics to those seen for sample p1b (4 mol % Ba), however, initial signs of depoling occurred at a much lower field of ~10–13 kV/cm. It also achieved a greater maximum bipolar and unipolar strain of 0.28% and 0.14% (0.05 Hz), respectively for the same fields. The unipolar strain is highly linear with negligible hysteresis at 0.05 Hz, and $d_{33}$~310 pC/N. Thus, the tetragonal ferroelectric NBT-14BT-3NBZ shows properties at low frequency that match the highest values reported for polycrystalline PZT-8 with $d_{33}$~300 pC/N. The maximum saturated polarization at ac fields of 37 kV/cm reaches 49 µC/cm² with a low coercive field of $E_c$~14.5 kV/cm and remnant polarization of $P_r$~21 µC/cm².

As the MPB is approached from the both the ferroelectric rhombohedral ($F_R$) and the ferroelectric tetragonal ($F_T$) phase fields, a phase transition to predominantly electrostrictive actuation (PE) occurs. Samples that lie very close to the PE→FE boundary undergo a field-forced transition (FFT) from PE response at low fields to FE at high fields. This behavior has been observed in rhombohedral NBT-6BT-3NBZ ($FFT_R$) and tetragonal NBT-12BT-3NBZ ($FFT_T$).

NBT doped with 6 mol % Ba and 3 mol % Zr lies near the MPB in the rhombohedral phase field. As the MPB is approached from far in the rhombohedral phase field, $T_m$ drops from >119° C. for ferroelectric NBT-4BT-3NBZ to ~95° C. in NBT-6BT-3NBZ at 0.05 Hz. Low-field actuation is predominantly electrostrictive with negligible hysteresis at 0.05 Hz. Sample p2b reaches a maximum of 0.13% electrostrictive strain at 46 kV/cm before the field forced transition is initiated. The polarization is linear and slightly hysteretic with a maximum of 28 µC/cm² at 46 kV/cm, where it begins to show signs of saturation. The current loop is a slightly distorted circle, with peaks at zero field showing only slight separation. The field induced maximum $d_{33}$ is ~450 pC/N at 32 kV/cm and the electrostrictive coefficient $Q_{11}$ is ~$1.8 \times 10^{-2}$ m⁴/C².

At fields higher than 46 kV/cm in sample p2b, a field-forced phase transition occurs with increased hysteresis due to initiation of domain wall motion (ferroelectric and/or ferroelastic) and nearly infinite slope in strain/field at 50 kV/cm. Maximum bipolar strain reaches 0.28% at 60 kV/cm and unipolar strain reaches 0.31% at 73 kV/cm, however each shows significant hysteresis.

Approaching the MPB from the $F_T$ field, samples doped with 12 mol % Ba, 3 mol % Zr lie very near the PE/FE boundary and also undergo an field-forced phase transition. Maximum electrostrictive strain is 0.09% at 29 kV/cm before the field-forced transition is initiated around 30–35 kV/cm. Even at low field, where the response is predominantly electrostrictive, the polarization loop has a higher remnant polarization (~7 vs. 3 µC/cm²) than NBT-6BT-3NBZ and the saturation peaks in current display greater separation, indicating a significant FE component. The field induced maximum $d_{33}$ is ~460 pC/N at 32 kV/cm and the electrostrictive coefficient $Q_{11}$ is ~$1.8 \times 10^{-2}$ C²/m⁴. A similar evolution from PE actuation with no hysteresis to a highly hysteretic strain loop which eventually clamps down to a linear piezoelectric response is seen for the $FFT_T$ phase. The high-field polarization ($P_{max}$~41 µC/cm² at 55 kV/cm) for NBT-12BT-3NBZ also does not show a pinched AFE loop, but shows a mix of electrostrictive and ferroelectric responses. The high-field current clearly shows the mix of responses. Electrostrictive peaks are aligned near zero field, and the FE contribution, off-center, is less resolved but is easily observed.

As the MPB is approached from NBT-12BT-3NBZ, a gradual decrease in the degree of FE character, as well as a decrease in $T_{m(0.05\ Hz)}$, is observed. Sample NBT-8BT-3NBZ ($T_{m(0.05\ Hz)}$~87° C.), of near-MPB composition, shows the purest electrostrictive response for the 3 mol % Zr set of compositions. NBT-10BT-3NBZ is predominantly electrostrictive, but shows a slightly higher degree of ferroelectric contribution as it lies close to the PE→FE boundary. These compositions reflect the shifting downward of the electrostrictive phase field to near-room temperature at the MPB.

NBT-10BT-3NBZ reaches a maximum of 0.24% bipolar strain at 53 kV/cm and 0.21% unipolar strain at 53 kV/cm. The unipolar strain curve is parabolic (as opposed to the linear piezoelectric response), showing the same response as the bipolar loop. The polarization is linear and slightly hysteretic with a maximum of 36 µC/cm² at 49 kV/cm where it begins to show signs of saturation. The current loop shows predominantly electrostrictive peaks centered at zero field with some distortion from unresolved ferroelectric contribution. The field induced maximum $d_{33}$ is ~725 pC/N at 32 kV/cm and the electrostrictive coefficient $Q_{11}$ is ~$1.9 \times 10^{-2}$ m⁴/C².

NBT-8BT-3NBZ reaches a maximum of 0.15% bipolar strain at 49 kV/cm and 0.13% unipolar strain at 44 kV/cm. The unipolar strain curve is parabolic, reaching a maximum strain of 0.13% at 44 kV/cm. The polarization is linear and slightly hysteretic with a maximum of 33 µC/cm² at 49 kV/cm where it begins to show signs of saturation. The current loop shows predominately electrostrictive peaks centered at zero field. A small FE component can still be observed. The field induced maximum $d_{33}$ is ~500 pC/N at 32 kV/cm and the electrostrictive coefficient $Q_{11}$ is ~$1.4 \times 10^{-2}$ m⁴/C².

Increasing the doping level of $Zr^4$ from 3 to 4 mol % lowers $T_m$ at 0.05 Hz nearly 10° C. near the MPB. A systematic compositional study of constant 4 mol % Zr shows that for increasing 7–14 mol % $Ba^{2+}$, actuation was primarily electrostrictive with a small FE component. Actuation behavior is most purely electrostrictive for NBT-7BT-4NBZ ($T_{m(0.05\ Hz)}$~80° C.) and NBT-9BT-4NBZ ($T_{m(0.05\ Hz)}$~79° C.), which lie near MPB. Compared to NBT-8BT-3NBZ ($T_{m(0.05\ Hz)}$~87° C.), electrostriction is also more apparent in these two compositions, for they display less hysteresis in strain and polarization loops at 0.05 Hz. However, a small FE component is still present and can be detected as a distortion in the predominantly electrostrictive response of the current loop. As $Ba^{2+}$ concentration increases farther into the tetragonal phase field, compositions NBT-12BT-4NBZ and NBT-14BT-4NBZ show an increasing FE component in polanzation and actuation. The actuation character of NBT-14BT-4NBZ is similar to that of NBT-10BT-3NBZ, suggesting that it lies very close to the PE→FE boundary. Thus, it is clear that increasing $Ba^{2+}$>14 mol % in this system will result in FE actuation. FIGS. 37–41 summarize longitudinal strain, polarization, and electrostrictive properties for this set of compositions. As is expected, the contribution of the FE component increases the dielectric susceptibility κ (proportional to slope of P vs. E curve) increases, suggesting that predominantly electrostrictive materials with high polarizations may be engineered through controlled doping of compositions that lie close to the PE-FE phase boundary.

High level $Ba^{2+}$ and $Zr^{4+}$ doping pushes compositions farther into the paraelectric phase field at room temperature. $T_m$ extrapolated to 0.05 Hz for NBT-26BT-29NBZ lies around 37° C. ($T_{m(0.05\ Hz)}$~37° C.), suggesting that room temperature actuation occurs within ~10° C. of the permittivity maximum. Correspondingly, sample p23a shows predominantly electrostrictive actuation behavior. No hysteresis is seen at 1 Hz (rather than 0.05 Hz), similar to the behavior observed for the electrostrictor PMN at room temperature. The achievable strain (0.01%) is lower than that observed in PMN and the previously discussed co-doped NBT compositions. The polarization loop is highly linear with negligible hysteresis and the current loop is a nearly undistorted circle, consistent with a linear dielectric.

EXAMPLE 15

The preparation and testing of single crystal materials having a range of barium and zirconium dopant levels are described. Details of sample preparation and measurement is found in the Master's Theses of Sossity Sheets, *Dielectric and Electrolmechanical Properties of Barium and Zirconium Co-Doped Sodium Bismuth Titanate*, Massachustts's Institute of Technolgy, Department of Materials Science and Engineering, Cambridge, Mass. (2000), which is hereby incorporated in its entirety by reference.

Single crystals of co-doped (Ba+Zr) NBT were grown by the self-flux method. High purity (>99% purity) starting powders of $Na_2CO_3$, $Bi_2O_3$, $BaCO_3$, $TiO_2$, and $ZrO_2$ were mixed in 100 g sized batches according to the intended nominal stoichiometric composition (Table 4) with the addition of a self-flux composed of 20 wt % excess each of $Na_2CO_3$ and $Bi_2O_3$. Table 4 lists the nominal compositions and conditions for flux growth batches that produced viable crystals for testing.

Powder preparation followed the same procedure through the first calcination at 800° C. as described in Example 13 for polycrystalline samples. After the first calcination, powders were ground in a zirconia mortar and transferred to a 100 ml-capacity, covered, platinum crucible. The platinum crucible was fitted inside a larger, covered alumina crucible. The powders were held for 5 hours at 1350° C., and cooled according to various schedules (Table 4) that typically yielded intergrown crystals set within solidified flux. Weight loss was less than 1% for all crystal growths, indicating that bismuth loss due to volatilization was not significant.

TABLE 4

Nominal Batch Compositions for (Ba + Zr) Co-Doped Single Crystals with Growth Schedule
$(Na_{1/2}Bi_{1/2})_{1-x}Ba_x(Ti_{1-y}Zr_y)O_3$

| Batch ID | mole fraction $Ba^{2+}$ (x) | mole fraction $Zr^{4+}$ (y) | Self-Flux Growth Schedule |
|---|---|---|---|
| s1 | 0.08 | 0.03 | R.T. –> 1350° C. @ 100°/hr hold 5 hours 1350° C. –> 800° C. @ 5°/hr 800° C. –> R.T. @ 50°/hr |
| s2 | 0.08 | 0.03 | R.T. –> 1350° C. @ 100°/hr hold 5 hours 1350° C. –> 1260° C. @ 100°/hr hold 1 hour 1260° C. –> 1000° C. @ 1.5°/hr |

TABLE 4-continued

Nominal Batch Compositions for (Ba + Zr) Co-Doped Single Crystals with Growth Schedule
$(Na_{1/2}Bi_{1/2})_{1-x}Ba_x(Ti_{1-y}Zr_y)O_3$

| Batch ID | mole fraction $Ba^{2+}$ (x) | mole fraction $Zr^{4+}$ (y) | Self-Flux Growth Schedule |
|---|---|---|---|
| s3 | 0.06 | 0.03 | 1000° C. -> R.T. @ 50°/hr |
| s4 | 0.10 | 0.03 | |
| s5 | 0.10 | 0.03 | |

The greatest success in achieving crystals viable for characterization occurred for nominal doping of 3 mol % Zr with 6, 8, and 10 mol % $Ba^{2+}$. Flux grown co-doped crystals tend to grow with pseudo-cubic habit. The pseudo-cubic {001} orientation of these crystals was confirmed by with diffraction experiments using a Rigaku 18 kW rotating anode x-ray generator (copper anode), normally used for powder x-ray diffraction. EPMA compositional analysis of individual crystals is reported in Table 5. The symmetry of the perovskite phase was determined by powder x-ray diffraction and is also listed in Table 5.

TABLE 5

Composition (EPMA) and Phase (XRD) for Co-Doped Single Crystals compositions given in mole fraction (normalized to unity on B-site except where indicated by *)

| Sample ID | Nominal (Ba/Zr) | Na | Bi | Ba | Ti | Zr | O | (Na + Bi + Ba)/ (Ti + Zr) | Symmetry |
|---|---|---|---|---|---|---|---|---|---|
| s1a | 8/3 | 0.45 | 0.43 | 0.12 | 0.91 | 0.04 | 2.88 | 1.05 | T |
| s1b | 8/3 | 0.47 | 0.43 | 0.10 | 0.90 | 0.04 | 2.86 | 1.06 | T |
| s2a | 8/3 | 0.50 | 0.45 | 0.05 | 0.94 | 0.04 | 2.94 | 1.02 | R |
| s2b | 8/3 | 0.49 | 0.46 | 0.05 | 0.96 | 0.04 | 2.97 | 0.99* | R |
| s2c | 8/3 | 0.49 | 0.45 | 0.06 | 0.95 | 0.04 | 2.94 | 1.01 | R |
| s4b | 10/3 | 0.49 | 0.43 | 0.09 | 0.96 | 0.04 | 2.97 | 1.00 | T |
| s4c | 10/3 | 0.50 | 0.45 | 0.06 | 0.96 | 0.04 | 2.97 | 1.00 | R |
| s4d | 10/3 | 0.49 | 0.44 | 0.07 | 0.94 | 0.04 | 2.94 | 1.02 | R |

Room temperature dielectric constants $\epsilon_r$ for single crystals in the NBT-BT-NBZ composition system are on the order of $10^3$ and loss tangents range from 0.04 to ~0.08 for the 100–1000 kHz measurement range. The overall shape of the dielectric constant and loss against temperature curve for single crystals correspond well with that of polycrystals of nearly the sample composition (same doping level of $Ba^{2+}$ and $Zr^{4+}$), again, showing that the crystals also possess relaxor behavior.

All crystal compositions studied here, with 4 mol % Zr, show predominantly electrostrictive actuation and polarization behavior at room temperature, similar to the behavior seen in the 4 mol % Zr polycrystalline series. However, the single crystals achieve much higher actuation strain and field-induced $d_{33}$ than their polycrystalline counterparts. Strain hysteresis loops for tetragonal phase perovskites are predominately electrostrictive in character but show hysteresis at 1 Hz. Hysteresis becomes negligible at 0.05 Hz, as observed in the polycrystalline samples. Unipolar actuation is also parabolic against field (as opposed to the linear piezoelectric response), further supporting their electrostrictive classification. Crystal s1a exhibited the maximum electrostrictive strain observed in this system of 0.45%, which is approximately twice the strain achieved (0.21%) in its polycrystalline compositional counterpart. Crystal s4b showed more than quadruple the actuation strain achieved in the polycrystal of similar composition with a maximum longitudinal strain of 0.26% versus 0.06% at the same field.

Field induced $d_{33}$ in NBT-BT-NBZ single crystals also far surpasses the polycrystalline compositions, reaching 2000 pC/N. The electrostrictive coefficient $Q_{11}$ lies in the same range as the polycrystals with Values around $2\times10^{-2}$ $m^4/C^2$.

Strain hysteresis loops for rhombohedral single crystals are predominantly electrostrictive in character and also show negligible hysteresis at 0.05 Hz and parabolic unipolar actuation. Actuation strains range from ~0.2% to ~0.3% in these crystals.

Crystal s4d (NBT-7BT-4NBZ) does not show significantly greater ultimately achievable strain compared to its polycrystalline compositional counterpart (0.23% versus 0.21%), however, the single crystal shows about twice the strain at 50 kV/cm as the polycrystal. Additionally, the single crystal shows no signs of saturation around 50 kV/cm, while the polycrystalline counterpart has already begun to saturate at similar fields. Thus, the field induced $d_{33}$ for the single crystal is much higher at ~930 pC/N versus ~425 pC/N. The maximum field-induced $d_{33}$ for rhombohedral crystals is 1180 pC/N at 40 kV/cm, still nearly double that of the polycrystalline counterparts.

Table 6 lists the properties of co-doped (Ba+Zr) NBT polycrystals and single crystals compared to the conventional lead-based electrostrictive materials. The material data show that this new NBT-BT-NBZ family of relaxor electrostrictors are more than competitive in peak strain and $d_{33}$ with the commercial lead relaxors PMNs, PMNTs and PLZTs.

TABLE 6

Comparison of Polycrystalline and Single Crystal Electrostriction

| Material | Peak Longitudinal Strain, % | Peak $d_{33}$, pC/N |
|---|---|---|
| Single crystal [100] (tetragonal) NBT-12BT-4NBZ | 0.45 | 2000 |
| Single crystal [100] (rhombohedral) NBT-6BT-4NBZ | 0.30 | 1180 |
| Polycrystal (tetragonal) NBT-14BT-4NBZ | 0.24 | 780 |
| Single crystal PMN [111][1] | 0.11 (R.T.) | 213 |

TABLE 6-continued

Comparison of Polycrystalline and Single Crystal Electrostriction

| Material | Peak Longitudinal Strain, % | Peak $d_{33}$, pC/N |
|---|---|---|
| Polycrystal PMNT[2] | 0.16 (R.T.) | 1100 |
|  | 0.12 (R.T.) | 700 |
| Polycrystal PLZT[3] |  | 1030 |

[1]S. B. Lee et al., Appl. Phys. Lett., 74[7] 1030 (1999)
[2]www.TRSCeramics.com
[3]Z. Y. Meng et al., J. Am. Ceram. Soc., 68[8] 459 (1985)

EXAMPLE 16

This example describes the preparation and analysis of a Ba+Hf co-doped material. Polycrystalline sintered samples of composition $(Na_{1/2}Bi_{1/2})_{1-x}Ba_x(T_{1-y}Hf_y)O_3$ were prepared using the method of Example 14. Single crystals were grown by the flux method of Example 15. These compositions are also referred to as NBT-xBT-yNBH, where NBH represents the composition $Na_{1/2}Bi_{1/2}HfO_3$. In these compositions, x ranged from 0.02 to 0.25 and y from 0.01 to 0.25. As-fired powders and as-grown single crystals were examined by x-ray diffraction. Within the composition range of x and y given above, a rhombohedral phase perovskite was identified for low Ba/high Hf compositions, and a tetragonal phase perovskite for high Ba/low Hf compositions. However, in contrast to the Ba+Zr co-doped materials, a cubic or pseudocubic phase, exhibiting indistinguishable splitting of the [hkl] x-ray diffraction peaks that would ordinarily distinguish a rhombohedral phase or tetragonal phase perovskite from a cubic perovskite, were found for a field of compositions with intermediate Ba and Hf concentrations. For example, the following compositions exhibited rhombohedral phase: x=0.02, y=0.02; x=0.05, y=0.05; x=0.065, y=0.05; x=0.1, y=0.1; and x=0.13; y=0.13. The following compositions were observed to be tetragonal perovskite: x=0.1, y=0.01; and x=0.02, y=0.12. The following compositions were observed to have cubic or pseudocubic phase: x=0.065, y=0.02; x=0.08, y=0.02; x=0.1, y=0.02; x=0.076, y=0.05; x=0.1, y=0.05; x=0.12, y=0.055; x=0.12, y=0.04; x=0.13, y=0.11; x=0.15, y=0.11; x=0.15, y=0.15; x=0.12, y=0.2; x=0.25; y=0.25. Dielectric constant vs. temperature measurements showed relaxor behavior in these materials.

Figure 42:
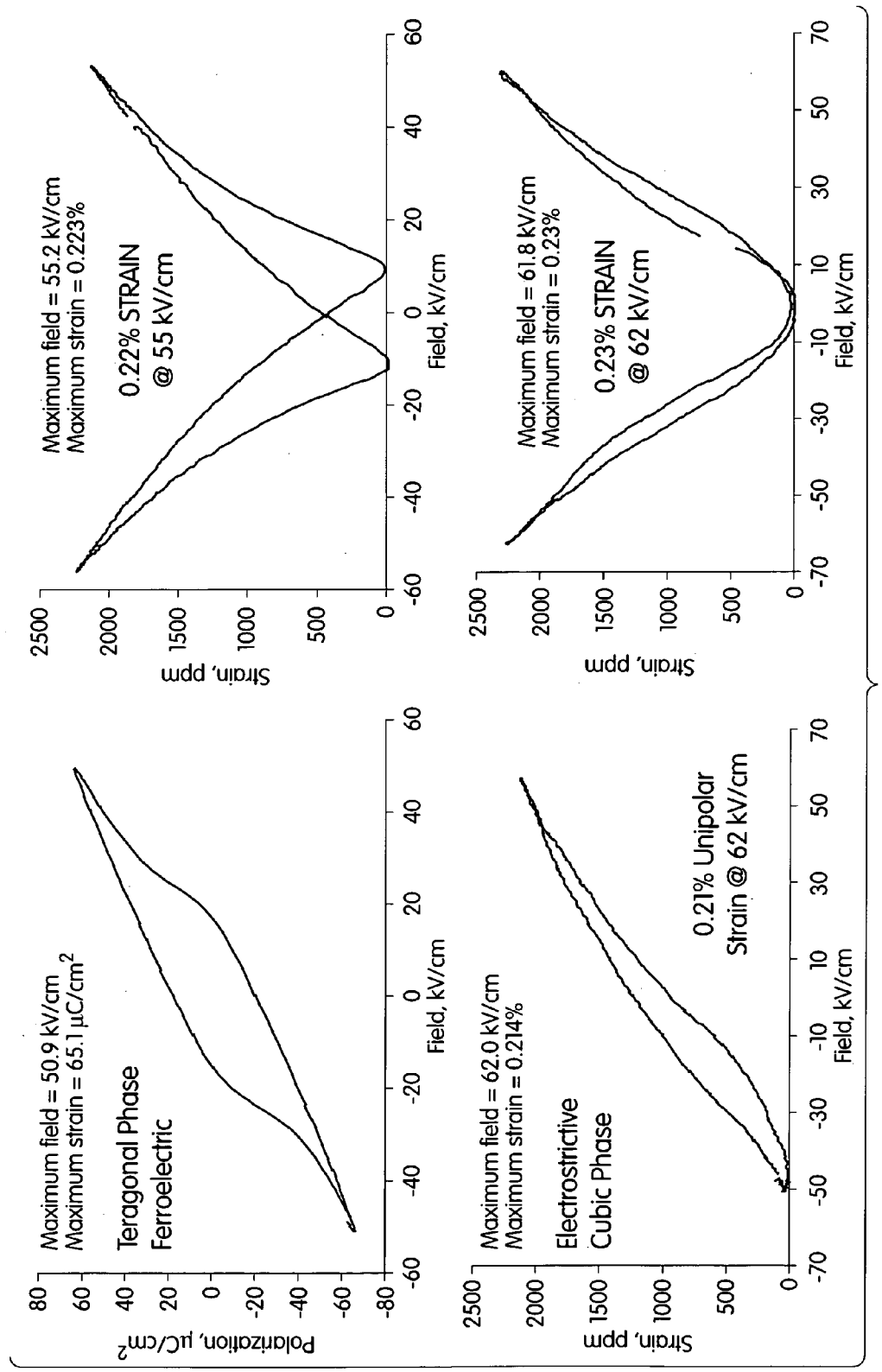
FIG. 42 is a plot of polarization vs. field, and electromechanical strain vs. field, for NBT-xBT-yNBH polycrystals.

Electromechanical measurements showed predominantly piezoelectric, predominantly electrostrictive, and mixed actuation depending on composition. FIG. 42 shows results corresponding to two polycrystalline samples. The top-left figure shows the polarization vs. electric field loop for a tetragonal phase sample of composition x=0.01, y=0.09, in which the characteristics of ferroelectric domain-switching are seen. The top-right figure shows the electromechanical strain exhibited by this sample under bipolar field. It is seen that this material exhibits a coercive field of about 10 kV/cm, reaches a strain of 022% at 55 kV/cm, at which point it has not yet saturated, and from the slope of the strain vs. field relation at the higher fields, exhibits a $d_{33}$ of about 400 pC/N. Thus, as in the case of the Ba+Zr co-doped materials, this Ba+Hf composition is found to have actuation properties comparable to hard PZTs such as PZT-8.

In the lower-left of FIG. 42, the electromechanical strain under unipolar drive is shown for a polycrystalline composition x=0.08, y=0.02. The bipolar strain is shown in the lower-right of FIG. 42. This sample was cubic or pseudocubic according to x-ray diffraction. It exhibits predominantly electrostrictive strain, reaching >0.2% strain at fields <60 kV/cm, at which point saturation of strain is not yet evident. This electromechanical strain exceeds that of well-known polycrystalline lead-relaxor electrostrictive materials such as PMN, PMNT, and PLZT.

These results show that the $(Na_{1/2}Bi_{1/2})_{1-x}Ba_x(Ti_{1-y}Hf_y)O_3$ family of compositions exhibits useful electromechanical properties of electrostrictive, piezoelectric, or mixed nature. From examples 14, 15, and 16, it is clear that compositions that are doped with Ba on the A-site and both Zr and Hf on the B-site, as well as other compositions given herein, are also useful electromechanically active materials.

What is claimed is:

1. An electromechanically active material comprising: a perovskite compound of the formula, $(Na_{1/2}Bi_{1/2})_{1-x}M_x(Ti_{1-y}M'_y)O_{3\pm z}$, where M is one or more of Ca, Sr, Ba, Pb, Y, Pr, Nd, Sm, Eu, Gd, Tb, Dy, Ho, Er, Tm, Yb and Lu; and M' is one or more of Zr, Hf, Sn, Ge, Mg, Zn, Al, Sc, Ga, Nb, Mo, Sb, Ta, W, Cr, Mn, Fe, Co and Ni, and 0.01<x<0.3, and 0.01<y<0.3, and z<0.1.

2. An electromechanically active material comprising: a perovskite compound of the formula, $(Na_{1/2}Bi_{1/2})_{1-x}M_x(Ti_{1-y}M'_y)O_{3\pm z}$, where M is one or more of Ca, Sr, Ba, and Pb; and M' is one or more of Zr, Hf, and Sn, and 0.01<x<0.3, and 0.01<y<0.2, and z<0.1.

3. An electromechanically active material comprising: a perovskite compound of the formula, $(Na_{1/2}Bi_{1/2})_{1-x}Ba_x(Ti_{1-y}M'_y)O_{3\pm z}$, where M' is one or more of Zr and Hf, and 0.01<x<0.2, 0.01<y<0.1, and z<0.1.

4. An electromechanically active material comprising: a perovskite compound of the formula, $(Na_{1/2}Bi_{1/2})_{1-x}M_x(Ti_{1-y}M'_y)O_{3\pm z}$, where M is one or more of Ca, Sr, Ba, Pb, Y, La, Pr, Nd, Sm, Eu, Gd, Tb, Dy, Ho, Er, Tm, Yb and Lu; and M' is one or more of Zr, Hf, Sn, Ge, Mg, Zn, Al, Sc, Ga, Nb, Mo, Sb, Ta, W, Cr, Mn, Co and Ni, and 0.01<x<0.3, and 0.01<y<0.3, and z<0.1.

5. The material of claim 1, 2 3, or 4, wherein the material is selected from the group consisting of single crystals, textured polycrystalline materials, and polycrystalline materials.

6. The material of claim 5 wherein the material is in the form of a rod, fiber, ribbon, or sheet.

7. The material of claim 5, wherein the material is a polycrystalline material.

8. The material of claim 1, 2, 3, or 4, wherein the material is a piezoelectric material.

9. The material of claim 1, 2, 3, or 4, wherein the material is an electrostrictive material with an electric field-induced strain greater than about 0.1% at a field less than 60 kV/cm.

10. The material of claim 1, 2, 3, or 4, wherein the material is an electrostrictive material with an electric field-induced strain greater than about 0.2% at a field less than 60 kV/cm.

11. The material of claim 1, 2, 3, or 4, wherein the material is an electrostrictive material with an electric field-induced strain up to about 0.45% at a field less than 60 KV/cm.

12. The material of claim 1, 2, 3, or 4, wherein the material exhibits a field-forced phase transition.

13. The material of claim 1, 2, 3, or 4, wherein the material exhibits both piezoelectric properties and field-forced phase transition.

14. An electromechanically active material comprising:
a perovskite material having tetragonal crystal symmetry of the formula, $M_\alpha Bi_\beta M'_\gamma M''_\delta O_{3\pm z}$,
where M is one or more of Na, K, Rb and Cs, wherein M comprises at least Na; M' is one or more of Ca, Sr, Ba, Pb, Y, La, Pr, Nd, Sm, Eu, Gd, Tb, Dy, Ho, Er, Tm, Yb and Lu; M" is one or more of Ti, Zr, Hf, Sn, Ge, Mg, Zn, Al, Sc, Ga, Nb, Mo, Sb, Ta, W, Cr, Mn, Fe, Co and Ni;
where $z \leq 0.1$;
$\alpha + \beta + \gamma + \delta < 2.0$;
$\alpha < \beta$; and
$\beta < 0.05$.

15. The material of claim 14, wherein the parameters $\alpha$, $\beta$ and $\gamma$ are selected such that the perovskite phase has a rhombohedral crystal symmetry.

16. The material of claim 14, wherein parameters $\alpha$, $\beta$ and $\gamma$ are selected such that the perovskite phase has a tetragonal crystal symmetry.

17. The material of claim 14, wherein $(\alpha+\beta+\gamma)$ is the range of about 0.75 to 0.95.

18. The material of claim 14 where $0.32 < \beta < 0.5$.

19. The material of claim 14, wherein $\alpha$, $\beta$ and $\gamma$ are selected such that the perovskite material is antiferroelectric prior to the application of an electric field, and such that under an applied electric field, the perovskite material transforms to a ferroelectric phase, said transformation being accompanied by a strain of at least 0.1%.

20. The material of claim 19, wherein M=Na, M'=Ba, M"=Ti, and said transformation from antiferroelectric to ferroelectric phase is attained at a temperature of less than about 100° C.

21. An electromechanically active material comprising:
a single crystal perovskite material of the formula $M_\alpha Bi_\beta M'_\gamma M''_\delta O_{3\pm z}$, where M is one or more of Na, K, Rb and Cs; M' is one or more of Ca, Sr, Ba, Pb, Y, La, Pr, Nd, Sm, Eu, Gd, Tb, Dy, Ho, Er, Tm, Yb and Lu; and M" is one or more of Ti, Zr, Hf, Sn, Ge, Mg, Zn, Al, Sc, Ga, Nb, Mo, Sb, Ta, W, Cr, Mn, Fe, Co and Ni;
where $z \leq 0.1$; $0.9 \leq \delta \leq 1.1$; $\alpha$, $\beta$ and $\gamma$ are greater than zero; and $(\alpha+\beta+\gamma)$ is in the range of about 0.75 to 1.1.

22. An electromechanically active material comprising:
a perovskite material of the formula, $Na_\omega M_\alpha Bi_\beta M'_\gamma M''_\delta O_{3\pm z}$,
where M is one or more of K, Rb and Cs; M' is one or more of Ca, Sr, Ba, Pb, Y, La, Pr, Nd, Sm, Eu, Gd, Tb, Dy, Ho, Er, Tm, Yb and Lu; M" is one or more of Ti, Zr, Hf, Sn, Ge, Mg, Zn, Al, Sc, Ga, Nb, Mo, Sb, Ta, W, Cr, Mn, Fe, Co and Ni;
where $z \leq 0.1$; $0.9 \leq \delta \leq 1.1$; $\alpha$, $\beta$, $\gamma$ and $\omega$ are greater than zero; and $(\alpha+\beta+\gamma+\omega)$ is in the range of about 0.75 to 1.1.

23. The material of claim 22, wherein the material is selected from the group consisting of single crystalline materials, textured crystalline materials, and polycrystalline materials.

24. The material of claim 21 or 22, wherein the material is in the form of a rod, fiber, ribbon, or sheet.

25. The material of claim 21 or 22, wherein perovskite material has a $d_{33}$ value of greater than 200 pC/N.

26. The material of claim 21 or 22, wherein the material exhibits a strain of greater than 0.15%.

27. The material of claim 21 or 22, wherein the material exhibits a low hysteresis of actuation.

28. The material of claim 22, wherein M comprises K.

29. The material of claim 21 or 22, wherein the material is a single crystallite and the crystallite is a faceted crystal having a selected crystalline plane exposed.

30. The piezoelectric material of claim 29, wherein the exposed plane is the {100} plane of the corresponding cubic phase.

31. The piezoelectric material of claim 21 or 22, wherein the parameters $\alpha$, $\beta$ and $\gamma$ are selected such that the perovskite phase has a rhombohedral crystal symmetry.

32. The piezoelectric material of claim 21 or 22, wherein parameters $\alpha$, $\beta$ and $\gamma$ are selected such that the perovskite phase has a tetragonal crystal symmetry.

33. The piezoelectric material of claim 31, wherein parameters $\alpha$, $\beta$ and $\gamma$ are selected such that the piezoelectric material lies near a morphotropic phase boundary or point.

34. The piezoelectric material of claim 32, wherein parameters $\alpha$, $\beta$ and $\gamma$ are selected such that the piezoelectric material lies near a morphotropic phase boundary or point.

* * * * *

UNITED STATES PATENT AND TRADEMARK OFFICE
CERTIFICATE OF CORRECTION

PATENT NO. : 7,090,785 B2  Page 1 of 1
APPLICATION NO. : 10/635240
DATED : August 15, 2006
INVENTOR(S) : Yet-Ming Chiang et al.

It is certified that error appears in the above-identified patent and that said Letters Patent is hereby corrected as shown below:

In the Specification:

At column 1, line 25, "Grant Number N00014097-1-0989 awarded by the Office of" should be -- Grant Number N00014-97-1-0989 awarded by the Office of --.

Signed and Sealed this
Tenth Day of May, 2011

David J. Kappos
*Director of the United States Patent and Trademark Office*